United States Patent
Takahama et al.

(10) Patent No.: US 9,305,492 B2
(45) Date of Patent: Apr. 5, 2016

(54) DISPLAY DEVICE AND METHOD FOR DRIVING THE SAME

(71) Applicant: Sharp Kabushiki Kaisha, Osaka (JP)

(72) Inventors: Kengo Takahama, Osaka (JP); Yoshimitsu Yamauchi, Osaka (JP); Noboru Noguchi, Osaka (JP); Noritaka Kishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/418,911

(22) PCT Filed: Jul. 26, 2013

(86) PCT No.: PCT/JP2013/070280
§ 371 (c)(1),
(2) Date: Jan. 30, 2015

(87) PCT Pub. No.: WO2014/021201
PCT Pub. Date: Feb. 6, 2014

(65) Prior Publication Data
US 2015/0213757 A1    Jul. 30, 2015

(30) Foreign Application Priority Data

Aug. 2, 2012   (JP) ................. 2012-172073

(51) Int. Cl.
*G09G 3/30* (2006.01)
*G09G 3/32* (2006.01)
*H01L 27/32* (2006.01)

(52) U.S. Cl.
CPC ............ *G09G 3/3233* (2013.01); *G09G 3/3266* (2013.01); *G09G 3/3291* (2013.01);
(Continued)

(58) Field of Classification Search
CPC . G09G 3/32; G09G 3/3266; G09G 2320/043; G09G 3/3291; G09G 2300/0842; G09G 2300/0861; G09G 2320/0233; G09G 2320/029; G09G 2320/0295; G09G 3/3233; G09G 2300/0852; G09G 2310/027; G09G 2310/0286
USPC ................. 345/76–83, 87–93, 204–215, 691
See application file for complete search history.

(56) References Cited

U.S. PATENT DOCUMENTS 7,414,599 B2 * 8/2008 Chung et al. .................... 345/76
7,619,597 B2   11/2009 Nathan et al.
(Continued)

FOREIGN PATENT DOCUMENTS

| JP | 2004-038210 A | 2/2004 |
| JP | 2005-031630 A | 2/2005 |

(Continued)

OTHER PUBLICATIONS

Yeon Gan Mo et al., "Amorphous Oxide TFT Backplane for Large Size Amoled TVs" Symposium Digest for 2010 Society for Information Display Symposium, pp. 1037-1040, 2010.
(Continued)

*Primary Examiner* — Vijay Shankar
(74) *Attorney, Agent, or Firm* — Morrison & Foerster LLP

(57) ABSTRACT

An organic EL display device includes a controller, a data driver, and a DRAM which provides a gain correction memory and a threshold voltage correction memory. The data driver sends, to the controller, first and second measurement data Im corresponding to the first and second measuring data voltages Vm, respectively. The controller compares ideal characteristic data IO(P) with the first and second measurement data Im, and updates threshold voltage correction data Vt and gain correction data B2R based on the comparison results. The controller corrects video data Vm based on the threshold voltage correction data Vt and the gain correction data B2R. Thereby, both threshold voltage compensation and gain compensation of a drive transistor are performed with respect to each pixel circuit, while display is performed.

19 Claims, 51 Drawing Sheets

(52) U.S. Cl.
CPC .......... *G09G2300/0842* (2013.01); *G09G 2300/0852* (2013.01); *G09G 2300/0861* (2013.01); *G09G 2310/027* (2013.01); *G09G 2310/0286* (2013.01); *G09G 2310/0291* (2013.01); *G09G 2310/0294* (2013.01); *G09G 2320/029* (2013.01); *G09G 2320/0233* (2013.01); *G09G 2320/0295* (2013.01); *G09G 2320/043* (2013.01); *H01L 27/3276* (2013.01)

(56) References Cited

U.S. PATENT DOCUMENTS

| | | | |
|---|---|---|---|
| 7,768,485 B2 * | 8/2010 | Uchino et al. | 345/76 |
| 7,924,249 B2 | 4/2011 | Nathan et al. | |
| 7,982,695 B2 * | 7/2011 | Mizukoshi et al. | 345/76 |
| 8,259,098 B2 * | 9/2012 | Seto | 345/212 |
| 8,305,303 B2 * | 11/2012 | Nam | 345/76 |
| 8,462,086 B2 * | 6/2013 | Takasugi et al. | 345/78 |
| 9,047,815 B2 * | 6/2015 | Kimura | 345/77 |
| 2002/0180721 A1 | 12/2002 | Kimura et al. | |
| 2005/0017934 A1 | 1/2005 | Chung et al. | |
| 2006/0038767 A1 | 2/2006 | Nakamura et al. | |
| 2007/0210996 A1 | 9/2007 | Mizukoshi et al. | |
| 2007/0268210 A1 | 11/2007 | Uchino et al. | |
| 2009/0213046 A1 | 8/2009 | Nam | |
| 2009/0256854 A1 | 10/2009 | Mizukoshi et al. | |
| 2010/0220117 A1 | 9/2010 | Kimura | |
| 2011/0285691 A1 | 11/2011 | Takasugi et al. | |

FOREIGN PATENT DOCUMENTS

| | | |
|---|---|---|
| JP | 2005-284172 A | 10/2005 |
| JP | 2006-058638 A | 3/2006 |
| JP | 2007-310311 A | 11/2007 |
| JP | 2009-026586 A | 2/2009 |
| JP | 2009-042486 A | 2/2009 |
| JP | 2009-199057 A | 9/2009 |
| JP | 2009-258302 A | 11/2009 |
| JP | 2010-224532 A | 10/2010 |
| JP | 2011-242767 A | 12/2011 |

OTHER PUBLICATIONS

International Search Report received for PCT Patent Application No. PCT/JP2013/070280 mailed on Sep. 3, 2013, 4 pages.

* cited by examiner

DISPLAY DEVICE AND METHOD FOR DRIVING THE SAME

CROSS REFERENCE TO RELATED APPLICATIONS

This is a U.S. National Phase patent application of PCT/JP2013/070280, filed Jul. 26, 2013, which claims priority to Japanese Patent Application No. 2012-172073, filed Aug. 2, 2012, each of which is hereby incorporated by reference in the present disclosure in its entirety.

TECHNICAL FIELD

The present invention relates to a display device, and more specifically relates to a display device provided with a pixel circuit including an electro-optic element such as an organic EL (Electro Luminescence) element, and a method for driving the same.

BACKGROUND ART

As a display element provided in a display device, there have hitherto been an electro-optic element whose luminance is controlled by an applied voltage, and an electro-optic element whose luminance is controlled by a flowing current. Examples of the electro-optic element whose luminance is controlled by an applied voltage include a liquid crystal display element. Meanwhile, examples of the electro-optic element whose luminance is controlled by a flowing current include an organic EL element. The organic EL display device using the organic EL element as a self-emitting element can be reduced in thickness and power consumption and increased in luminance as compared to the liquid crystal display device which generally requires a backlight, a color filter and the like, and is thus under active development in recent years.

There are two kinds of drive systems for the organic EL display device, which are a passive matrix system (also called simple matrix system) and an active matrix system. An organic EL display device that employs the passive matrix system (hereinafter referred to as "passive matrix-type organic EL display device") has a simple structure, but is difficult to increase in size and resolution. In contrast, an organic EL display device that employs the active matrix system (hereinafter referred to as "active matrix-type organic EL display device") can easily achieve a large size and high resolution as compared to the passive matrix-type organic EL display device.

In the active matrix-type organic EL display device, there is used a drive transistor which controls a drive current to be supplied to the organic EL element in accordance with a voltage applied between a gate and a source. As the drive transistor, a thin-film transistor (which may be hereinafter abbreviated as "TFT") is typically used. Examples of the thin-film transistor include an amorphous silicon TFT, an LTPS (Low Temperature Poly Silicon)-TFT, and an oxide TFT (TFT whose channel layer is formed of an oxide semiconductor). Further, examples of the oxide TFT include an IGZO-TFT whose channel layer is formed of InGaZnOx (hereinafter referred to as "IGZO") as an oxide semiconductor mainly composed of indium (In), gallium (Ga), zinc (Zn) and oxygen (O). When the thin-film transistor is used as the drive transistor, there occur a variety of variations such as variations in threshold voltage, mobility, channel width, channel length, and thickness of a gate insulating film (gate insulating film capacitance) among pixel circuits. Since the characteristics of the drive transistor vary among pixel circuits, the drive currents vary. This results in deterioration in display quality. It is to be noted that variations in mobility, gate width, gate length and thickness of a gate insulating film may be hereinafter referred to collectively as a "variation in gain".

There has hitherto been known an organic EL display device which performs a variety of compensation by use of a transistor and/or a capacitance or the like in the pixel circuit. Patent Document 1 discloses an organic EL display device, where a transistor for detecting a fluctuation of a threshold voltage of a drive transistor is provided in a pixel circuit, thereby compensating a variation in threshold voltage. Further, Patent Document 2 discloses an organic EL display device which compensates variations in both threshold voltage and mobility by use of a power supply line in which a low potential and a high potential are switched at predetermined timing and a parasitic capacitance formed at each end of an organic EL element. It is to be noted that in the present specification, compensation of the variation in threshold voltage and compensation of the variation in mobility (or gain) may be referred to as "threshold voltage compensation" and "mobility (or gain) compensation", respectively. Further, Patent Document 3 discloses an organic EL display device which performs the threshold voltage compensation by use of a parasitic capacitance formed at each end of an organic EL element, and the like. Moreover, Non-Patent Document 1 discloses a pixel circuit, where two capacitance elements connected in series are provided between a gate and a source of a drive transistor, a voltage at one end of one of the capacitance elements is set to a value in accordance with a threshold voltage, and then the one capacitance element is connected between the gate and the source of the drive transistor while the other capacitance element is short-circuited, thereby performing the threshold voltage compensation.

Furthermore, there is known an organic EL display device which performs a variety of compensation by use of a circuit provided outside a pixel circuit (hereinafter simply referred to as "external circuit"). Patent Document 4 discloses an organic EL display device which compares a target current and a measured current, obtained by measuring a drive current made to flow by a drive transistor in an external circuit provided with respect to each column, and performs offset correction for performing the threshold voltage compensation on video data that is to be sent to a data driver in accordance with the comparison result. It should be noted that a configuration related to the external circuit disclosed in Patent Document 4 is also disclosed in Patent Document 5 (however, since a description of a compensation operation by the external circuit is more simplified in Patent Document 5 than in Patent Document 4, a description of Patent Document 5 will be hereinafter omitted). Further, Patent Document 6 discloses an organic EL display device which measures an average drive current of all pixel circuits in an external circuit to update a correcting gain and a correcting offset, and corrects image data by use of these correcting gain and correcting offset. It is thus possible to perform both the threshold voltage compensation and the gain compensation. Moreover, Patent Document 7 discloses an organic EL display device which measures a drive current of each pixel circuit to update a correcting gain and a correcting offset, and corrects image data by use of these correcting gain and correcting offset. It is possible to perform both the threshold voltage compensation and the gain compensation. Furthermore, Patent Document 8 discloses an organic EL display device which acquires a detection voltage Vsen in accordance with a threshold voltage by use of a current source in an external circuit, and controls a drive transistor with a voltage, obtained by adding a data fluctuation amount ΔVdata' in accordance with a movement deviation amount MV corresponding to each pixel circuit to the detection voltage Vsen, thereby performing both the threshold voltage compensation and the mobility compensation. It is to be noted that the movement deviation amount MV corresponding to each pixel circuit is previously prepared in a memory.

PRIOR ART DOCUMENTS

Patent Documents

[Patent Document 1] Japanese Laid-Open Patent Publication No. 2005-31630
[Patent Document 2] Japanese Laid-Open Patent Publication No. 2007-310311
[Patent Document 3] Japanese Laid-Open Patent Publication No. 2011-242767
[Patent Document 4] U.S. Pat. No. 7,619,597
[Patent Document 5] U.S. Pat. No. 7,924,249
[Patent Document 6] Japanese Laid-Open Patent Publication No. 2005-284172
[Patent Document 7] Japanese Laid-Open Patent Publication No. 2009-258302
[Patent Document 8] Japanese Laid-Open Patent Publication No. 2009-199057

Non-Patent Document

[Non-Patent Document 1] Yeon Gon Mo et al., "Amorphous Oxide TFT Backplane for Large Size AMOLED TVs", Symposium Digest for 2010 Society for Information Display Symposium, pp. 1037-1040, 2010

SUMMARY OF THE INVENTION

Problems to be Solved by the Invention

Incidentally, in the pixel circuits disclosed in Patent Documents 1 and 3 and Non-Patent Document 1, only the threshold voltage compensation is performed and the gain (mobility) compensation is not performed. For this reason, the variation in characteristics of the drive transistor cannot be sufficiently compensated. FIG. 56 is a diagram showing gate-source voltage/drive current characteristics of a plurality of drive transistors with mutually different characteristics before the threshold voltage compensation in the pixel circuits disclosed in each of Patent Document 3 and Non-Patent Document 1. FIG. 57 is a diagram showing gate-source voltage/drive current characteristics of the plurality of drive transistors with mutually different characteristics after the threshold voltage compensation in the pixel circuits disclosed in each of Patent Document 3 and Non-Patent Document 1. As shown in FIGS. 56 and 57, the variation in characteristics of the drive transistor cannot be sufficiently compensated only by performing the threshold voltage compensation. Further, the pixel circuit disclosed in Patent Document 2 can be applied to a pixel circuit using as the drive transistor a transistor such as an LTPS-TFT which has a negative correlation between the threshold voltage and the mobility, but cannot be applied to a pixel circuit using an amorphous silicon TFT, an IGZO-TFT or the like which does not have such a negative correlation.

Further, in the organic EL display device disclosed in Patent Document 4, only the offset compensation is performed, namely only the threshold voltage compensation is performed, and hence the variation in characteristics of the drive transistor cannot be sufficiently compensated. Moreover, in the organic EL display device disclosed in Patent Document 6, the correcting gain and the correcting offset are updated based on the average drive current of all the pixel circuits, and hence the gain compensation and the threshold voltage compensation with respect to each pixel circuit cannot be sufficiently performed. Furthermore, in the organic EL display device disclosed in Patent Document 7, the drive current is outputted from wiring connected in common to cathode terminals of the organic EL elements of respective pixel circuits, and hence it is necessary to turn off the organic EL elements of all the pixel circuits except for a pixel circuit as a measurement target in order to measure the drive current with respect to each pixel circuit. This makes it difficult to measure the drive current while performing display. That is, it is difficult to perform the compensation while performing display. Further, in the organic EL display device disclosed in Patent Document 8, since it is necessary to previously measure and prepare the movement deviation amount MV corresponding to each pixel circuit, when the mobility of the drive transistor changes with time, the mobility compensation cannot be performed as following the change.

Accordingly, it is an object of the present invention to provide a display device and a method for driving the same, which can perform threshold voltage compensation and gain compensation of a drive transistor with respect to each pixel circuit, while performing display.

Means for Solving the Problems

According to a first aspect of the present invention, there is provided an active matrix-type display device including: a display portion which includes a plurality of data lines, a plurality of scanning lines, and a plurality of pixel circuits arranged corresponding to the plurality of data lines and the plurality of scanning lines; a data drive portion connected to the plurality of data lines; a scanning drive portion connected to the plurality of scanning lines; and a display control portion which controls the scanning drive portion and sends, to the data drive portion, video data that corresponds to either of a plurality of gradations, wherein each pixel circuit includes an electro-optic element controlled by a current, an input transistor which has a control terminal connected to a corresponding scanning line and is in an on-state when the scanning line is selected, a drive capacitance element to which a data voltage based on the video data is given via a corresponding data line and the input transistor, and a drive transistor which controls a drive current to be supplied to the electro-optic element in accordance with a voltage held by the drive capacitance element, the input transistor is, when being in the on-state, capable of outputting to the data line the drive current flowing through the drive transistor, the scanning drive portion alternately repeats a first period for writing the data voltage into the pixel circuit by sequentially selecting the plurality of scanning lines and a second period for outputting, from the pixel circuit to the data line via the input transistor, the drive current flowing through the drive transistor by sequentially selecting a predetermined number of scanning lines out of the plurality of scanning lines, and shifts the predetermined number of scanning lines to be selected in each of the second periods, the data drive portion includes a current measurement portion which measures a drive current in accordance with a data voltage based on video data corresponding to a relatively low first gradation out of the plurality of gradations to acquire first measurement data, and measures a drive current in accordance with a data voltage based on video data corresponding to a relatively high second gradation out of the plurality of gradations to acquire second measurement data, with respect to each of the data lines in the second period, and a data voltage supply portion which supplies the data voltage to the data line in the first period and the second period, and the display control portion corrects the video data based on the first measurement data and the second measurement data acquired by the current measurement portion.

According to a second aspect of the present invention, in the first aspect of the present invention, the display device further includes a storage portion which stores correction data that is used for correcting the video data, wherein the current measurement portion sends the first measurement data and the second measurement data to the display control portion in the second period, the display control portion, in the second period, sends video data corresponding to the respective first gradation and second gradation to the data drive portion and receives the first measurement data and the second measurement data from the current measurement portion, to update the correction data based on results of respective comparisons of ideal characteristic data indicating ideal characteristics of the drive transistor which correspond to the first gradation and the second gradation, with the received first measurement data and second measurement data, and the display control portion, in the first period and the second period, reads the correction data from the storage portion to correct the video data based on the correction data.

According to a third aspect of the present invention, in the second aspect of the present invention, the correction data includes first correction data for threshold voltage compensation of the drive transistor and second correction data for gain compensation of the drive transistor, and the display control portion updates the first correction data based on the comparison result between the first measurement data and the ideal characteristic data, and updates the second correction data based on the comparison result between the second measurement data and the ideal characteristic data.

According to a fourth aspect of the present invention, in the third aspect of the present invention, the display control portion changes respective values of the first correction data and the second correction data only by previously set fixed values when the respective first correction data and second correction data are to be updated.

According to a fifth aspect of the present invention, in the second aspect of the present invention, the display control portion supplies the data drive portion with an input/output control signal, which goes to a first level at the time when the data voltage is to be written into the pixel circuit and which goes to a second level at the time when the drive current is to be outputted to the data line, the data voltage supply portion includes a conversion portion which converts the video data to the data voltage, the data voltage supply portion and the current measurement portion each include in common an operational amplifier having a non-inverting input terminal connected to an output terminal of the conversion portion and an inverting input terminal connected to a corresponding data line, and a control switch which is provided between the inverting input terminal and an output terminal of the operational amplifier, and which is closed at the time of the input/output control signal being on the first level and is opened at the time of the input/output control signal being on the second level, the current measurement portion includes a current/voltage conversion element provided between the inverting input terminal and the output terminal of the operational amplifier in parallel to the control switch, and a measurement data acquirement portion which is connected to the output terminal of the operational amplifier and acquires the first measurement data or the second measurement data from an output of the operational amplifier, and a data voltage, obtained by converting video data that corresponds to the first gradation or the second gradation, is inputted into the non-inverting input terminal of the operational amplifier when the input/output control signal is on the second level.

According to a sixth aspect of the present invention, in the fifth aspect of the present invention, the current/voltage conversion element is a resistance element.

According to a seventh aspect of the present invention, in the fifth aspect of the present invention, the current/voltage conversion element is a capacitance element.

According to an eighth aspect of the present invention, in the fifth aspect of the present invention, the current measurement portion further includes a voltage holding portion which is provided between the operational amplifier and the measurement data acquirement portion to hold an output voltage of the operational amplifier.

According to a ninth aspect of the present invention, in the fifth aspect of the present invention, the measurement data acquirement portion acquires the first measurement data or the second measurement data based on at least an output voltage of the operational amplifier and the video data.

According to a tenth aspect of the present invention, in the ninth aspect of the present invention, the current measurement portion further includes a first selector and a second selector provided in common with respect to a predetermined number, being two or more, of the operational amplifiers, the first selector receives output voltages of the predetermined number of operational amplifiers, and gives any of the received output voltages of the operational amplifiers to the measurement data acquirement portion based on an address signal received from the outside, and the second selector receives video data before conversion of the data voltages that are given to the non-inverting input terminals of the predetermined number of operational amplifiers, and gives any of the received video data to the measurement data acquirement portion based on the address signal.

According to an eleventh aspect of the present invention, in the fifth aspect of the present invention, a level of the input/output control signal changes to the first level, the second level, the first level, the second level and the first level sequentially from a start point of a selection period in which each scanning line is selected in the second period, in three periods in which the input/output control signal is on the first level in each selection period, the display control portion sends, to the data voltage supply portion, video data corresponding to one of the first gradation and the second gradation, video data corresponding to the other one of the first gradation and the second gradation, and video data corresponding to either of the plurality of gradations, respectively, sequentially from the start point of the selection period, and in two periods in which the input/output control signal is on the second level in each selection period, the measurement data acquirement portion acquires the one of the first measurement data and the second measurement data and the other of the first measurement data and the second measurement data, respectively, sequentially from the start point of the selection period.

According to a twelfth aspect of the present invention, in the eleventh aspect of the present invention, the current measurement portion sends, in two periods in which the input/output control signal is on the second level in each selection period, to the display control portion the one of the first measurement data and the second measurement data and the other of the first measurement data and the second measurement data, respectively, sequentially from the start point of the selection period.

According to a thirteenth aspect of the present invention, in the eleventh aspect of the present invention, the current measurement portion sends, in a latter period out of two periods in which the input/output control signal is on the second level in each selection period, to the display control portion the one of the first measurement data and the second measurement data, and sends, in a period immediately after completion of the selection period, to the display control portion the other of the first measurement data and the second measurement data.

According to a fourteenth aspect of the present invention, in the eleventh aspect of the present invention, the current measurement portion sends, in a period immediately after completion of each selection period, to the display control portion the one of the first measurement data and the second measurement data and the other of the first measurement data and the second measurement data.

According to a fifteenth aspect of the present invention, in the eleventh aspect of the present invention, the current measurement portion sends, in a period after completion of all selection periods in the second period, to the display control portion the first measurement data and the second measurement data, acquired in each selection period.

According to a sixteenth aspect of the present invention, in any of the twelfth to fifteenth aspects of the present invention, the display control portion and the data drive portion send and receive the video data, the first measurement data and the second measurement data to and from each other by use of a bidirectional communication bus.

According to a seventeenth aspect of the present invention, in any of the twelfth to fifteenth aspects of the present invention, the data voltage supply portion further includes a data latch portion which outputs the video data received from the display control portion to the conversion portion when the input/output control signal is on the first level, and which outputs, to the conversion portion, video data at the time when the input/output control signal is on the first level immediately before, when the input/output control signal is on the second level.

According to an eighteenth aspect of the present invention, in any of the twelfth to fifteenth aspects of the present invention, the display control portion sends, in two periods in which the input/output control signal is on the second level in each selection period, to the data voltage supply portion, video data corresponding to the one of the first gradation and the second gradation and video data corresponding to the other of the first gradation and the second gradation, respectively, sequentially from the start point of the selection period.

According to a nineteenth aspect of the present invention, in the first aspect of the present invention, a power supply voltage is supplied to a first conduction terminal of the drive transistor, the drive capacitance element is provided between a control terminal and a second conduction terminal of the drive transistor, the input transistor is provided between the second conduction terminal of the drive transistor and the data line, and each pixel circuit further includes a reference voltage supply transistor which has a control terminal connected to the scanning line and is provided between the control terminal of the drive transistor and a reference voltage line for supplying a reference voltage.

According to a twentieth aspect of the present invention, in the first aspect of the present invention, a power supply voltage is supplied to a first conduction terminal of the drive transistor, the drive capacitance element is provided between the first conduction terminal and a control terminal of the drive transistor, the input transistor is provided between the control terminal of the drive transistor and the data line, and each pixel circuit further includes a current path formation transistor which has a control terminal connected to the scanning line and is provided between the control terminal and a second conduction terminal of the drive transistor.

According to a twenty-first aspect of the present invention, in the first aspect of the present invention, each pixel circuit further includes a light emission control transistor which is provided in series with the electro-optic element, and is in an off-state in a predetermined period.

According to a twenty-second aspect of the present invention, in the first aspect of the present invention, each of the drive transistor and the input transistor is a thin-film transistor whose channel layer is formed of an oxide semiconductor.

According to a twenty-third aspect of the present invention, in the twenty-second aspect of the present invention, the oxide semiconductor is mainly composed of indium, gallium, zinc and oxygen.

According to a twenty-fourth aspect of the present invention, in the first aspect of the present invention, the scanning drive portion includes a first shift register for driving the plurality of scanning lines in the first period, a second shift register for driving the plurality of scanning lines in the second period, and a selector group which gives an output of each stage of the first shift register to a corresponding scanning line in the first period, and gives an output of each stage of the second shift register to the corresponding scanning line in the second period.

According to a twenty-fifth aspect of the present invention, there is provided a method for driving an active matrix-type display device including a display portion which includes a plurality of data lines, a plurality of scanning lines, and a plurality of pixel circuits arranged corresponding to the plurality of data lines and the plurality of scanning lines, a data drive portion connected to the plurality of data lines, a scanning drive portion connected to the plurality of scanning lines, and a display control portion which controls the scanning drive portion and sends, to the data drive portion, video data that corresponds to either of a plurality of gradations, the device in which each pixel circuit includes an electro-optic element controlled by a current, an input transistor which has a control terminal connected to a corresponding scanning line and is in an on-state when the scanning line is selected, a drive capacitance element to which a data voltage based on the video data is given via a corresponding data line and the input transistor, and a drive transistor which controls a drive current to be supplied to the electro-optic element in accordance with a voltage held by the drive capacitance element, and the input transistor is, when being in the on-state, capable of outputting to the data line the drive current flowing through the drive transistor, the method including: a scanning drive step of alternately repeating a first period for writing the data voltage into the pixel circuit by sequentially selecting the plurality of scanning lines and a second period for outputting, from the pixel circuit to the data line via the input transistor, the drive current flowing through the drive transistor by sequentially selecting a predetermined number of scanning lines out of the plurality of scanning lines, and shifting the predetermined number of scanning lines to be selected in each of the second periods; a current measurement step of measuring a drive current in accordance with a data voltage based on video data corresponding to a relatively low first gradation out of the plurality of gradations to acquire first measurement data, and measuring a drive current in accordance with a data voltage based on video data corresponding to a relatively high second gradation out of the plurality of gradations to acquire second measurement data, with respect to each of the data lines in the second period; a data voltage supply step of supplying the data voltage to the data line in the first period and the second period; and a correction step of correcting the video data based on the first measurement data and the second measurement data acquired in the current measurement step.

Effects of the Invention

According to the first aspect of the present invention, in the second period, the predetermined number of scanning lines are sequentially selected and the drive current is measured with respect to each data line, thereby to acquire the first measurement data and the second measurement data with respect to each pixel circuit. Then, the video data is corrected based on the acquired first measurement data and second measurement data (hereinafter simply referred to as "measurement data" in the case of not distinguishing these in describing the effects of the invention). When the drive transistor is controlled in accordance with the data voltage based on the video data corresponding to the relatively low first gradation, the control voltage (gate-source voltage) of the drive transistor is relatively small, and hence a discrepancy of the threshold voltage with respect to the control voltage is greatly reflected to the drive current. In contrast, when the drive transistor is controlled in accordance with the data voltage based on the video data corresponding to the relatively high second gradation, the control voltage of the drive transistor is relatively large, and hence a discrepancy of the threshold voltage with respect to the control voltage is hardly reflected to the drive current, while a discrepancy of the gain is relatively greatly reflected to the drive current. For this reason, the first measurement data is data to which the discrepancy of the threshold voltage has been greatly reflected, and the second measurement data is data to which the discrepancy of the gain has been greatly reflected. In such a manner as above, the video data is corrected based on the first measurement data to which the discrepancy of the threshold voltage has been greatly reflected and the second measurement data to which the discrepancy of the gain has been greatly reflected, whereby it is possible to perform the threshold voltage compensation and the gain compensation of the drive transistor with respect to each pixel circuit. Further, since there is no need for stopping light emission of the electro-optic element except in a pixel circuit as a measurement target of the drive current in the second period, it is possible to perform the compensation while performing display. Moreover, since the video data is corrected based on the first measurement data and the second measurement data acquired in the second period, it is possible to perform the compensation following a change in characteristics of the drive transistor with time.

According to the second aspect of the present invention, the storage portion that stores the correction data is provided, and the correction data is updated based on the comparison results between the ideal characteristic data and the measurement data. By performing such an update of the correction data, it is possible to reliably perform the compensation following a change in characteristics of the drive transistor with time. Further, with the storage portion provided outside the data drive portion, it is possible to simplify the configuration of the data drive portion. Moreover, by use of the ideal characteristic data, it is possible to update the correction data by simple processing.

According to the third aspect of the present invention, the first correction data and the second correction data are prepared, and the first measurement data and the second measurement data are compared with the ideal characteristic data to update the first correction data and the second correction data, whereby it is possible to reliably exert an effect similar to that of the second aspect of the present invention.

According to the fourth aspect of the present invention, since the first correction data and the second correction data are updated by fixed amounts, the compensation can be performed as more reliably following a change in characteristics of the drive transistor with time.

According to the fifth aspect of the present invention, the operational amplifier and the control switch common in the data voltage supply portion and the current measurement portion, and the current/voltage conversion element are provided, and the control switch is controlled by the input/output control signal. Therefore, the operational amplifier functions as a buffer amplifier for supplying the data voltage to the data line at low output impedance when the input/output control signal is on the first level, and it functions as a current amplifier for performing a current amplifying (current-voltage converting) operation with the current/voltage conversion element when the input/output control signal is on the second level. When the input/output control signal is on the second level, the data voltage obtained by converting the video data corresponding to the first gradation or the second gradation (hereinafter referred to as "measuring data voltage" in describing the effects of the invention) is inputted into the non-inverting input terminal of the operational amplifier, and hence the output voltage of the operational amplifier has a value obtained by subtracting, from the measuring data voltage, a value based on the drive current and a parameter of the current/voltage conversion element. The measurement data acquirement portion can acquire the measurement data by measuring the drive current in consideration of a known measuring data voltage and the parameter of the current/voltage conversion element, based on the output voltage of the operational amplifier. Thus, the configuration of the data drive portion for the operation of measuring the drive current may be formed only by adding the current/voltage conversion element, the control switch and the measurement data acquirement portion to the conventional data drive portion. This allows the data drive portion to be provided at low cost.

According to the sixth aspect of the present invention, when the input/output control signal is on the second level, the output voltage of the operational amplifier has a value obtained by subtracting, from the measuring data voltage, the product of the drive current and a resistance value of the current/voltage conversion element. Therefore, the measurement data acquirement portion can acquire the measurement data by measuring the drive current in consideration of a known measuring data voltage and the resistance value of current/voltage conversion element, based on the output voltage of the operational amplifier.

According to the seventh aspect of the present invention, when the input/output control signal is on the second level, the output voltage of the operational amplifier has a value obtained by subtracting, from the measuring data voltage, the product of the drive current, time when the measuring data voltage is inputted into the non-inverting input terminal of the operational amplifier, and a reciprocal number of a capacitance value of the current/voltage conversion element. Therefore, the measurement data acquirement portion can acquire the measurement data by measuring the drive current in consideration of a known measuring data voltage and the capacitance value of the current/voltage conversion element, based on the output voltage of the operational amplifier. Further, since the current/voltage conversion element is a capacitance element, a noise that appears in the output of the operational amplifier can be reduced.

According to the eighth aspect of the present invention, it is possible to hold the output voltage of the operational amplifier by the voltage holding portion, and give the output voltage to the measurement data acquirement portion.

According to the ninth aspect of the present invention, the first measurement data or the second measurement data is acquired based on at least the output voltage of the operational amplifier and the video data, whereby it is possible to exert an effect similar to that of the fifth embodiment of the present invention.

According to the tenth aspect of the present invention, since the output voltage of the operational amplifier and the video data to be given to the measurement data acquirement portion are selected by use of the first selector and the second selector, the number of measurement data acquisition portions that are provided with respect to the predetermined number, being two or more, of operational amplifiers may be one. Hence it is possible to reduce the number of measurement data acquirement portions, so as to reduce a circuit scale of the data drive portion.

According to the eleventh aspect of the present invention, when one of the first gradation and the second gradation is the first gradation and the other is the second gradation, in each selection period of the second period, writing of a measuring data voltage corresponding to the first gradation (hereinafter referred to as "first measuring data voltage" in describing the effects of the invention) into the pixel circuit, acquirement of the first measurement data, writing of a measuring data voltage corresponding to the second gradation (hereinafter referred to as "second measuring data voltage" in describing the effects of the invention) into the pixel circuit, acquirement of the second measurement data, and writing of the data voltage converted from the video data corresponding to either of the plurality of gradations into the pixel circuit are sequentially performed. In such a manner, it is possible to acquire both the first measurement data and the second measurement data in each selection period. Further, the data voltage obtained by converting the video data corresponding to either of the plurality of gradations is written into the pixel circuit. Accordingly, at the start of the first period immediately thereafter, it is possible to prevent display with luminance based on the data voltage obtained by converting the video data corresponding to the second gradation with respect to each pixel circuit corresponding to the scanning line selected in the second period. Further, immediately before acquirement of the first measurement data or the second measurement data, the data line is charged with the first measuring data voltage or the second measuring data voltage, respectively. Accordingly, when the first measurement data or the second measurement data are to be acquired, the drive current can be measured at high speed without changing a potential of the data line (without bringing about charge/discharge). It should be noted that this also applies to a case where one of the first gradation and the second gradation is the second gradation and the other is the first gradation.

According to the twelfth aspect of the present invention, when one of the first gradation and the second gradation is the first gradation and the other is the second gradation, in each selection period of the second period, the first measurement data and the second measurement data acquired in the selection period are sequentially sent to the display control portion before the display control portion sends the video data corresponding to either of the plurality of gradations to the data voltage supply portion. Hence it is possible to perform correction, based on the first measurement data and the second measurement data acquired in the selection period, on the video data corresponding to either of the plurality of gradations to be sent by the display control portion in the selection period. It is thus possible to perform compensation of a variation in characteristics of the drive transistor in real time in the second period. It should be noted that this also applies to the case where one of the first gradation and the second gradation is the second gradation and the other is the first gradation.

According to the thirteenth aspect of the present invention, when one of the first gradation and the second gradation is the first gradation and the other is the second gradation, the first measurement data is sent to the display control portion immediately after acquirement of the second measurement data, and the second measurement data is sent to the display control portion immediately after sending the video data corresponding to either of the plurality of gradations to the data voltage supply portion. Hence it is possible to sufficiently ensure preparation time before sending the first measurement data and the second measurement data, so as to reliably send the first measurement data and the second measurement data to the display control portion. It should be noted that this also applies to the case where one of the first gradation and the second gradation is the second gradation and the other is the first gradation.

According to the fourteenth aspect of the present invention, when one of the first gradation and the second gradation is the first gradation and the other is the second gradation, the first measurement data and the second measurement data are sent to the display control portion in a period immediately after completion of each selection period of the second period. Hence it is possible to sufficiently ensure preparation time before sending the first measurement data and the second measurement data, so as to reliably send the first measurement data and the second measurement data to the display control portion. Further, even in a case where the bidirectional communication bus is used between the display control portion and the data drive portion and the video data needs to be sent by the display control portion to the data drive portion in the period when the input/output control signal is on the second level in each selection period, it is possible to send the first measurement data and the second measurement data to the display control portion. It should be noted that this also applies to the case where one of the first gradation and the second gradation is the second gradation and the other is the first gradation.

According to the fifteenth aspect of the present invention, the first measurement data and the second measurement data acquired in each selection period are sent to the display control portion in a period after completion of all the selection periods in the second period. Hence it is possible to sufficiently ensure preparation time before sending the first measurement data and the second measurement data, so as to reliably send the first measurement data and the second measurement data to the display control portion. Further, even in a case where the bidirectional communication bus is used between the display control portion and the data drive portion and the video data needs to be sent by the display control portion to the data drive portion in the period when the input/output control signal is on the second level in each selection period, it is possible to send the first measurement data and the second measurement data to the display control portion. It should be noted that this also applies to the case where one of the first gradation and the second gradation is the second gradation and the other is the first gradation.

According to the sixteenth aspect of the present invention, since the bidirectional communication bus is used, a communication system between the display control portion and the data drive portion can be reduced. Hence it is possible to reduce the cost.

According to the seventeenth aspect of the present invention, when one of the first gradation and the second gradation is the first gradation and the other is the second gradation, by providing the data latch portion, if the video data corresponding to the first gradation and the video data corresponding to the second gradation are previously sent to the data voltage supply portion in the former period and the latter period in which the input/output control signal is on the first level in each selection period of the second period, it is possible to input into the conversion portion the video data corresponding to the first gradation and the video data corresponding to the second gradation in each of the former period and the latter period, respectively, in which the input/output control signal is on the second level. By employing such a configuration, when the first measurement data and the second measurement data are to be acquired, it is possible to exert the foregoing effect of measuring the drive current at high speed without changing the potential of the data line. It should be noted that this also applies to the case where one of the first gradation and the second gradation is the second gradation and the other is the first gradation.

According to the eighteenth aspect of the present invention, when one of the first gradation and the second gradation is the first gradation and the other is the second gradation, the video data corresponding to the first gradation and the video data corresponding to the second gradation are inputted into the digital-analog conversion portion in the former period and the latter period, respectively, in which the input/output control signal is on the second level. By employing such a configuration, when the first measurement data and the second measurement data are to be acquired, it is possible to exert the foregoing effect of measuring the drive current at high speed without changing the potential of the data line. It should be noted that this also applies to the case where one of the first gradation and the second gradation is the second gradation and the other is the first gradation.

According to the nineteenth aspect of the present invention, the voltage for controlling the drive transistor is decided based on the reference voltage and the data voltage. That is, the voltage for controlling the drive transistor does not depend on the power supply voltage. Therefore, the drive current is not fluctuated even when a drop voltage occurs due to a wiring resistance of wiring for supplying the power supply voltage.

According to the twentieth aspect of the present invention, in the pixel circuit in which the input transistor is provided between the control terminal of the drive transistor and the data line, the drive current can be outputted to the data line via the current path formation transistor and the input transistor.

According to the twenty-first aspect of the present invention, light emission/non-emission of the electro-optic element can be controlled by a light emission control transistor.

According to the twenty-second aspect of the present invention, since an oxide TFT with relatively high mobility is used, it is possible to reduce writing time and increase luminance.

According to the twenty-third aspect of the present invention, it is possible to exert an effect similar to that of the twenty-second aspect of the present invention by use of an IGZO-TFT.

According to the twenty-fourth aspect of the present invention, it is possible to exert an effect similar to that of the first aspect of the present invention by selectively using the outputs of the first and second shift registers.

According to the twenty-fifth aspect of the present invention, it is possible to exert an effect similar to that of the first aspect of the present invention in the method for driving the display device.

MODES FOR CARRYING OUT THE INVENTION

Hereinafter, first to eighth embodiments of the present invention will be described referring to the attached drawings. Hereinafter, it is assumed that m and n are integers not smaller than two. It is to be noted that a transistor included in a pixel circuit in each embodiment is a field-effect transistor, and is typically a thin-film transistor. As the transistor included in the pixel circuit, there can be employed an oxide TFT (e.g., IGZO-TFT), an LTPS-TFT or an amorphous silicon TFT. The oxide TFT such as the IGZO-TFT is effective in the case of being employed as an n-channel transistor included in the pixel circuit. However, the present invention does not exclude the use of a p-channel oxide TFT.

1. First Embodiment

1.1 Whole Configuration

Figure 1:
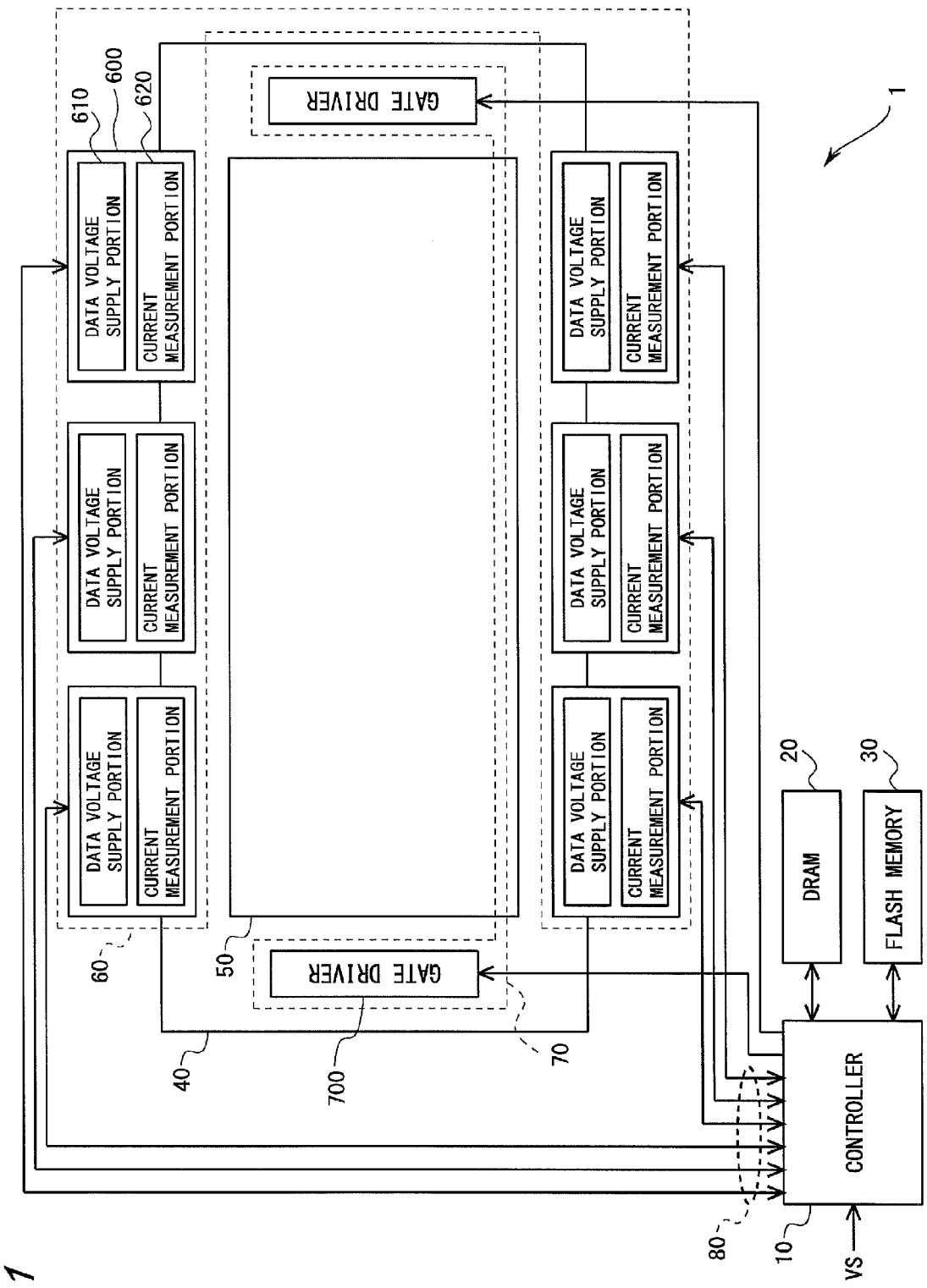
FIG. 1 is a block diagram showing a configuration of an organic EL display device according to a first embodiment of the present invention.

FIG. 1 is a block diagram showing a configuration of an active matrix-type organic EL display device 1 according to a first embodiment of the present invention. The organic EL display device 1 is provided with a controller 10, a DRAM (Dynamic Random Access Memory) 20, a flash memory 30, a display panel 40, a data drive portion 60, and a scanning drive portion 70. In the present embodiment, the controller 10 corresponds to the display control portion, and the DRAM 20 corresponds to the storage portion. A display portion 50 is formed in the display panel 40, and a data drive portion 60 and a scanning drive portion 70 are arranged on the display panel 40. It is to be noted that either the data drive portion 60 or the scanning drive portion 70 or both of them may be formed integrally with the display portion 50. Further, the DRAM and the flash memory 30 may be provided inside the controller 10.

Figure 2:
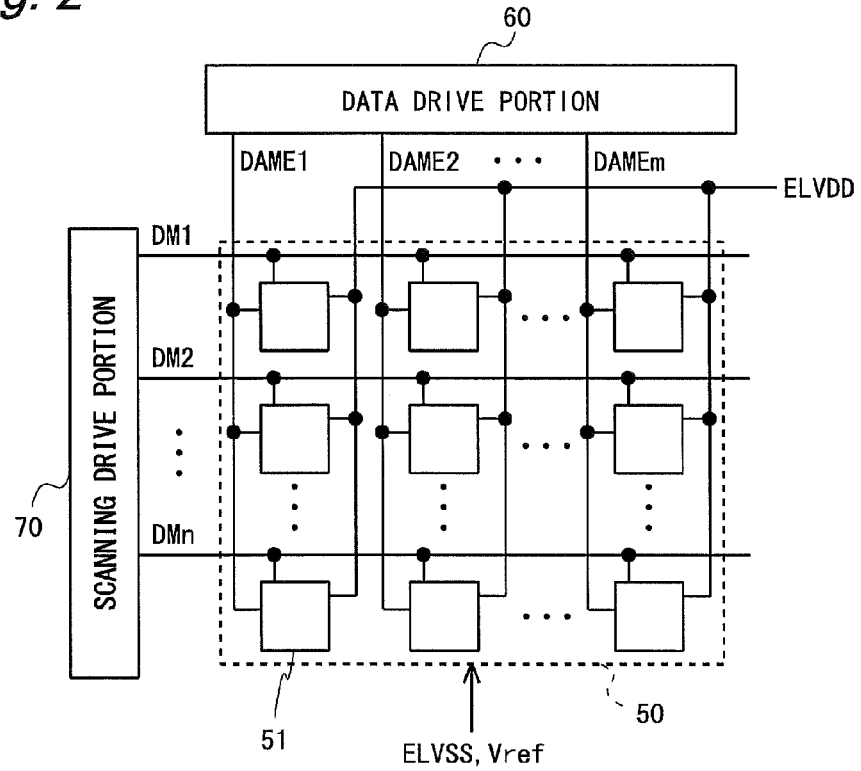
FIG. 2 is a block diagram for explaining a configuration of a display portion shown in FIG. 1.

FIG. 2 is a block diagram for explaining a configuration of the display portion 50 shown in FIG. 1. In the display portion 50, there are disposed m data/measurement lines DAME1 to DAMEm, and n scanning lines DM1 to DMn orthogonal thereto. When it is not necessary to distinguish the m data/measurement lines DAME1 to DAMEm, these are simply denoted by a symbol DAME, and when it is not necessary to distinguish the n scanning lines DM1 to DMn, these are simply denoted by a symbol DM. In the present embodiment, the data/measurement line DAME corresponds to the data line. Hereinafter, an extending direction of the data/measurement line DAME is taken as a column direction, and an extending direction of the scanning line DM is taken as a row direction. The display portion 50 is further provided with (m×n) pixel circuits 51, which correspond to intersections of the m data/measurement lines DAME1 to DAMEm and the n scanning lines DM1 to DMn. Each pixel circuit 51 forms any of a red subpixel (hereinafter referred to as "R subpixel"), a green subpixel (hereinafter referred to as "G subpixel") and a blue subpixel (hereinafter referred to as "B subpixel"), and for example, the pixel circuits 51 arrayed in the row direction form the R subpixel, the G subpixel and the B subpixel sequentially from the leftmost end in FIG. 2. It is to be noted that the kind of subpixel is not restricted to red, green or blue, and it may be cyan, magenta, yellow and the like.

Further, in the display portion 50, there are disposed a power supply line for supplying a high level power supply voltage ELVDD (hereinafter referred to as "high level power supply line" and denoted by a symbol ELVDD as is for a high level power supply voltage), a power supply line, not shown, for supplying a low level power supply voltage ELVSS (hereinafter referred to as "low level power supply line" and denoted by a symbol ELVSS as is for a low level power supply voltage), and a line, not shown, for supplying a reference voltage Vref (hereinafter referred to as "reference voltage line" and denoted by a symbol Vref as is for a reference voltage). Each of the high level power supply voltage ELVDD, the low level power supply voltage ELVSS and the reference voltage Vref is a fixed value, and the low level power supply voltage ELVSS is a ground voltage, for example.

The controller 10 shown in FIG. 1 controls the data drive portion 60 and the scanning drive portion 70 based on a video signal VS received from the outside. More specifically, the controller 10 sends a variety of control signals and video data VD (detailed later) to the data drive portion 60, and sends a variety of control signals to the scanning drive portion 70, thereby to control the data drive portion 60 and the scanning drive portion 70. Further, the controller 10 receives measurement data (detailed later) from the data drive portion 60. Sending/receiving of a variety of data between the controller 10 and the data drive portion 60 is performed via a communication bus 80. Further, the controller 10 controls the DRAM 20 and the flash memory 30.

The DRAM 20 stores correction data used for correcting the video data VD. The controller 10 updates the correction data stored in the DRAM 20 based on the measurement data received from the data drive portion 60. Further, the controller 10 reads the correction data stored in the DRAM 20, and corrects the video data VD. The correction data stored in the DRAM 20 is written into the flash memory 30 based on control by the controller 10 when the power is off. The correction data stored in the flash memory 30 is read to the DRAM 20 based on control by the controller 10 when the power is on. It is to be noted that the mode of writing and reading of the correction data described above is a mere example, and the present invention is not restricted thereto.

The data drive portion 60 is provided with a plurality of data drivers 600. However, the data drive portion 60 may be configured to be provided with one data driver 600. In FIG. 1, it is assumed that six data drivers 600 are provided. Three out of the six data drivers 600 are arranged on the top side of the display panel 40 and the remaining three are arranged on the bottom side of the display panel 40. It is to be noted that such an arrangement of the data drivers 600 is a mere example, and the present invention is not restricted thereto. Each data driver 600 is connected with k (k=m/6 in the example of FIG. 1) data/measurement lines DAME1 to DAMEk.

Each data driver 600 is provided with a data voltage supply portion 610 and a current measurement portion 620. In other words, the data drive portion 60 is provided with a plurality of data voltage supply portions 610 and a plurality of current measurement portions 620. The data voltage supply portion 610 supplies a data voltage based on the video data VD to the data/measurement line DAME. The current measurement portion 620 measures a drive current obtained from the pixel circuit 51 in accordance with a data voltage based on the video data VD corresponding to a predetermined gradation, to acquire measurement data indicating a current value of the drive current. Further, the current measurement portion 620 sends the acquired measurement data to the controller 10. Hereinafter, the whole operation of the data drive portion 60 may be described by using one data driver 600 as a representative for the sake of convenience. It is to be noted that a configuration and an operation of the data driver 600 will be detailed later.

The scanning drive portion 70 is provided with a plurality of gate drivers 700. However, the scanning drive portion 70 may be configured to be provided with one gate driver 700. In FIG. 1, it is assumed that two gate drivers 700 are provided. One of the two gate drivers 700 is arranged on the left side of the display panel 40 and the remaining one is arranged on the right side of the display panel 40. It is to be noted that such an arrangement of the gate drivers 700 is a mere example, and the present invention is not restricted thereto.

In the present embodiment, one frame period is made up of a video signal period and a vertical synchronization period. The video signal period in the present embodiment is also called "scanning period", or the like. The vertical synchronization period in the present embodiment is also called "vertical retrace period" or "vertical blanking period". In the present embodiment, the video signal period corresponds to a first period, and the vertical synchronization period corresponds to a second period. The scanning drive portion 70 (gate driver 700) alternately repeats the video signal period for writing a data voltage into the pixel circuit 51 by sequentially selecting n scanning lines DM, and the vertical synchronization period for outputting a later-mentioned drive current Im from the pixel circuit 51 to the data/measurement line DAME by sequentially selecting a predetermined number (p) of scanning lines DM out of the n scanning lines DM. Here, $1 \leq p < n$ holds, and n is desirably a natural number multiple of p. The organic EL display device 1 according to the present embodiment outputs a drive current to the data/measurement line DAME and acquires the above measurement data in the vertical synchronization period in which only a variety of synchronization operations are typically performed. Further, every vertical synchronization period (i.e., every one frame period), the scanning drive portion 70 shifts p scanning lines DM to be selected. A configuration and an operation of the scanning drive portion 70 will be detailed later.

1.2 Data Driver

Figure 3:
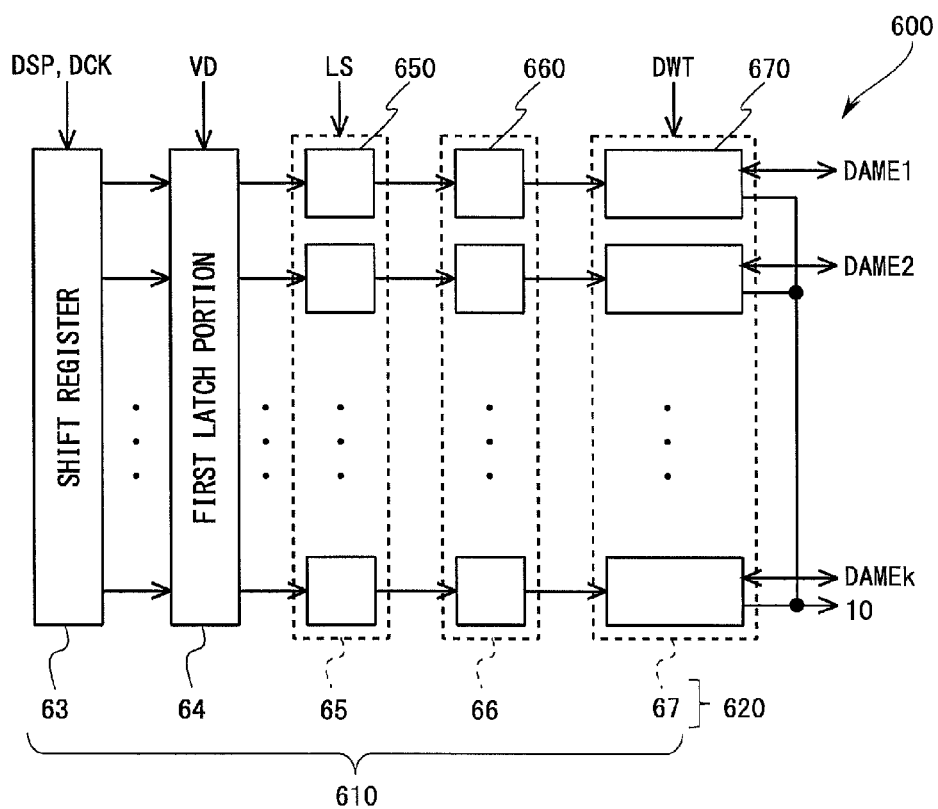
FIG. 3 is a block diagram showing a configuration of a data driver shown in FIG. 1.

FIG. 3 is a block diagram showing a configuration of the data driver 600 shown in FIG. 1. The data driver 600 is provided with a shift register 63, a first latch portion 64, a second latch portion 65, a digital-analog (D/A) conversion portion 66, and a voltage output/current measurement portion 67. Here, the data driver 600 connected to the k data/measurement lines DAME1 to DAMEk is illustrated. The second latch portion 65 is provided with k latch circuits 650 corresponding to the k data/measurement lines DAME1 to DAMEk, respectively. The D/A conversion portion 66 is provided with k D/A convertors (hereinafter each referred to as "DAC") 660 corresponding to the k data/measurement lines DAME1 to DAMEk, respectively. The voltage output/current measurement portion 67 is provided with k voltage output/current measurement circuits 670 corresponding to the k data/measurement lines DAME1 to DAMEk, respectively. The controller 10 sends the video data VD, and a data start pulse DSP, a data clock DCK, a latch strobe signal LS and an input/output control signal DWT as the variety of control signals.

The shift register 63 sequentially transfers the data start pulse DSP in synchronization with the data clock DCK, thereby to sequentially output a predetermined sampling pulse.

The first latch portion 64 sequentially stores gradation values for one row of the video data VD at the timing of the sampling pulse.

Each latch circuit 650 fetches and holds, in accordance with the latch strobe signal LS, a gradation value of a corresponding column out of the gradation values for one row which are stored in the first latch portion 64, and also gives the holding gradation value to the corresponding DAC 660. In the present specification, a gradation value that is given by each latch circuit 650 to the corresponding DAC 660 is also referred to as "video data".

Figure 4:
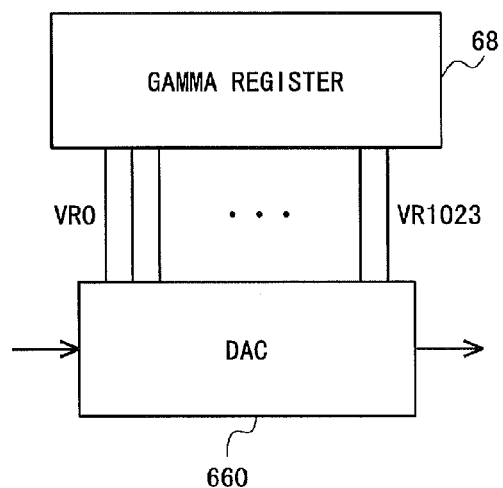
FIG. 4 is a block diagram for explaining an operation of a DAC.

Each DAC 660 selects a gradation voltage in accordance with the video data received from the corresponding latch circuit 650, and gives the gradation voltage as a data voltage to the corresponding voltage output/current measurement circuit 670. It should be noted that the gradation voltage to be a selection target in each DAC 660 is given from a gamma register 68 (not shown in FIG. 3 for the sake of convenience) as shown in FIG. 4, for example. Here, it is assumed that gradation voltages VR0 to VR1023 corresponding to 1024 gradations are given to the DAC 660, but the present invention is not restricted thereto. It is to be noted that a level shifter or the like may be provided between the second latch portion 65 and the D/A conversion portion 66.

The voltage output/current measurement circuits 670 perform different operations in accordance with a level of the input/output control signal DWT. When the input/output control signal DWT is on a "1" level (a high level in the present specification), each voltage output/current measurement circuit 670 functions as a voltage output circuit, and supplies the corresponding data/measurement line DAME with a data voltage received from the DAC 660. That is, when the input/output control signal DWT is on the "1" level, the voltage output/current measurement portion 67 functions as a voltage output portion, and supplies the corresponding data/measurement lines DAME with respective data voltages received from the D/A conversion portion 66. When the input/output control signal DWT is on a "0" level (a low level in the present specification), each voltage output/current measurement circuit 670 functions as a current measurement circuit, and measures a drive current Im outputted from the pixel circuit 51 to the corresponding data/measurement line DAME. That is, when the input/output control signal DWT is on the "0" level, the voltage output/current measurement portion 67 functions as the current measurement portion 620, and measures the drive currents Im outputted from the pixel circuits 51 to the corresponding data/measurement lines DAME. It should be noted that attached drawings show the input/output control signal DWT being on the "1" level as [DWT="1"] and the input/output control signal DWT being on the "0" level as [DWT="0"]. In the present embodiment, the "1" level corresponds to a first level and the "0" level corresponds to a second level.

Out of the constitutional elements shown in FIG. 3, the shift register 63, the first latch portion 64, the second latch portion 65, the D/A conversion portion 66 and a section of the voltage output/current measurement portion 67 which functions as the voltage output portion constitute the data voltage supply portion 610, and a section out of the voltage output/current measurement portion 67 which functions as the current measurement portion 620 constitutes the current measurement portion 620.

1.3 Voltage Output/Current Measurement Circuit

Figure 5:
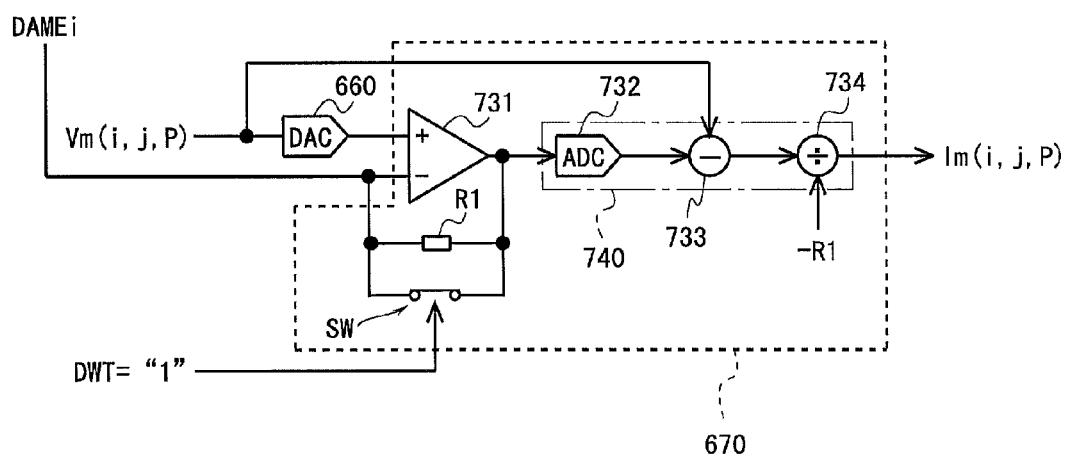
FIG. 5 is a circuit diagram for explaining a configuration of a voltage output/current measurement circuit shown in FIG. 3.

FIG. 5 is a circuit diagram for explaining a detailed configuration of the voltage output/current measurement circuit 670 shown in FIG. 3. It is assumed that the voltage output/current measurement circuit 670 shown in FIG. 3 corresponds to the data/measurement line DAMEi on the i-th column. The voltage output/current measurement circuit 670 is provided with an operational amplifier 731, a resistance element R1, a control switch SW, and a measurement data acquirement portion 740. The operational amplifier 731 and the control switch SW are constitutional elements shared by the data voltage supply portion 610 and the current measurement portion 620. Meanwhile, the resistance element R1 and the measurement data acquirement portion 740 are constitutional element of the current measurement portion 620. In the present embodiment, the resistance element R1 corresponds to the current/voltage conversion element.

A non-inverting input terminal of the operational amplifier 731 is connected to an output terminal of the DAC 660, and an inverting input terminal thereof is connected to the corresponding data/measurement line DAMEi. The resistance element R1 and the control switch SW are connected in parallel between an output terminal and the inverting input terminal of the operational amplifier 731. The control switch SW is controlled by the input/output control signal DWT, and it is closed in the case of DWT="1", while it is opened in the case of DWT="0".

The measurement data acquirement portion 740 acquires measurement data from an output of the operational amplifier 731. The measurement data acquirement portion 740 is, more specifically, provided with an analog/digital (A/D) convertor (hereinafter referred to as "ADC") 732, a subtraction portion 733, and a division portion 734. It should be noted that the configuration of the measurement data acquirement portion 740 is not restricted to the example shown here.

The ADC 732 A/D converts an output voltage of the operational amplifier 731, and gives it to the subtraction portion 733. The subtraction portion 733 receives a digital value of the output voltage of the operational amplifier 731, and video data before D/A conversion (this may be denoted by the same symbol as that of the data voltage for the sake of convenience of explanation) of the data voltage Vm for a gradation P to be given to the pixel circuit 51 on the j-th row and the i-th column (in the present specification, such a data voltage is denoted by a symbol Vm(i,j,P)), and outputs a value obtained by subtracting the video data Vm(i,j,P) from the digital value of the output voltage of the operational amplifier 731. It is to be noted that the gradation P shows either of gradations (a plurality of gradations) that can be set by the controller 10 based on the video signal VS. The division portion 734 outputs a value obtained by dividing an output of the subtraction portion 733 by −R1. The output of this division portion 734 serves as measurement data. It should be noted that a buffer memory for adjusting send timing of measurement data to the controller 10, or the like, may be provided on a subsequent stage of the division portion 734, but its illustration and description will be omitted here for the sake of convenience.

When the input/output control signal DWT is on the "1" level, the control switch SW is closed, and hence the output terminal and the inverting input terminal of the operational amplifier 731 are short-circuited. For this reason, when the input/output control signal DWT is on the "1" level, the operational amplifier 731 functions as a buffer amplifier. Accordingly, a data voltage Vm(i,j,P) is supplied to the data/measurement line DAMEi at low output impedance. In addition, it is desirable that the ADC 732 is controlled by the input/output control signal DWT or the like so as to prevent the data voltage Vm(i,j,P) from being inputted into the ADC 732.

When the input/output control signal DWT is on the "0" level, the control switch SW is open, and hence the output terminal and the inverting input terminal of the operational amplifier 731 are connected to each other via the resistance element R1. For this reason, the operational amplifier 731 functions as a current amplifier taking the resistance element R1 as a feedback resistor. At this time, when the data voltage Vm(i,j,P) is inputted into the non-inverting input terminal of the operational amplifier 731, a potential of the inverting input terminal also becomes Vm(i,j,P) due to a virtual short circuit. Further, at this time, a drive current which flows in accordance with a gate-source voltage Vgs based on the data voltage Vm(i,j,P) (hereinafter the current is denoted by a symbol Im(i,j,P)) is outputted from the pixel circuit 51 on the j-th row and the i-th column to the data/measurement line DAMEi (detailed later). Accordingly, the output voltage of the operational amplifier 731 is "Vm(i,j,P)−R1*Im(i,j,P)". This output voltage is then A/D converted in the ADC 732. The output of the subtraction portion 733, obtained by subtracting Vm(i,j,P) from the output voltage after the A/D conversion, is "−R1*Im(i,j,P)". Further, the output of the division portion 734, obtained by dividing the output of the subtraction portion 733 by "−R1", is Im(i,j,P). In such a manner, the drive current Im(i,j,P) is measured, and measurement data indicating a value of the drive current Im(i,j,P) (the data may be denoted by the same symbol Im(i,j,P) as that of the drive current for the sake of convenience of explanation) is acquired. It is to be noted that the division portion 734 may be replaced by a multiplication portion, and "−1/R1" may be inputted into the multiplication portion in place of "−R1".

1.4 Pixel Circuit

Figure 6:
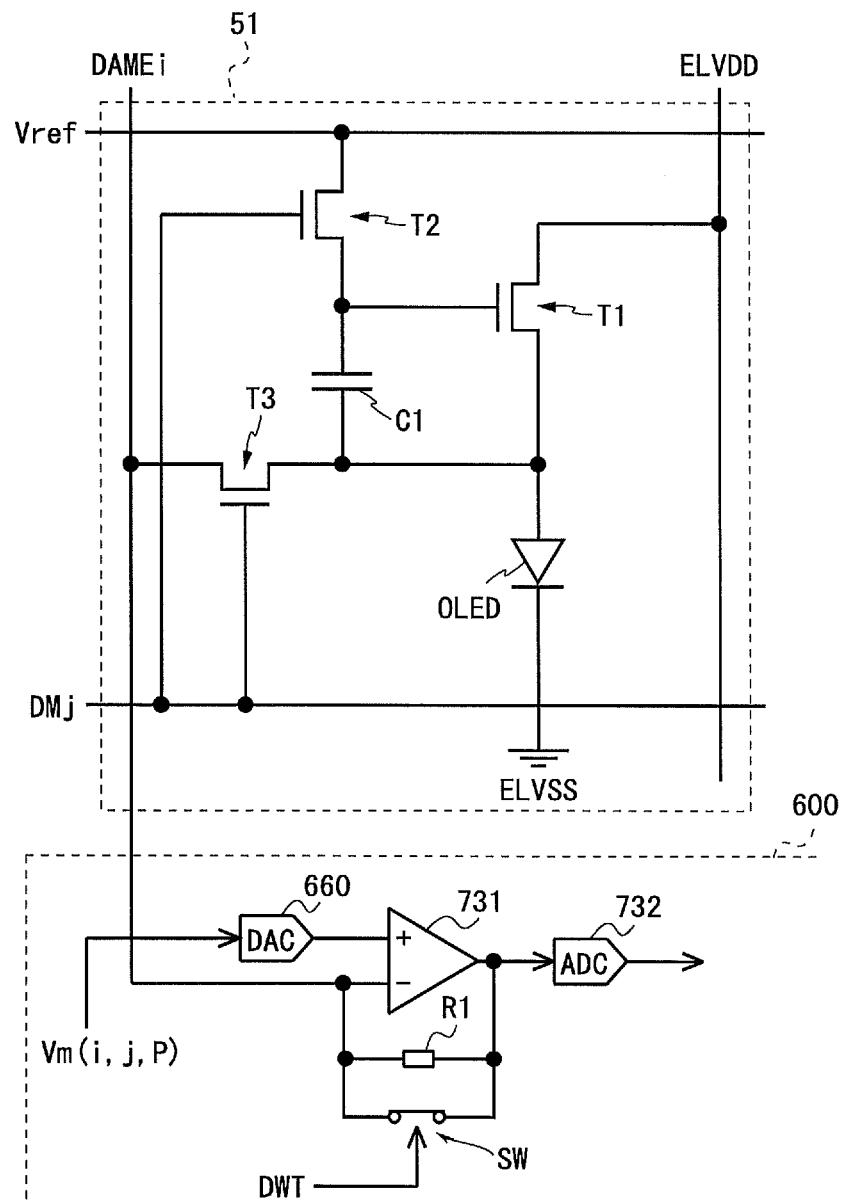
FIG. 6 is a circuit diagram showing a pixel circuit and part of constitutional elements on the data driver side which correspond thereto, both shown in FIG. 1.

FIG. 6 is a circuit diagram showing the pixel circuit 51 and part of constitutional elements on the data driver 600 side which correspond thereto, both shown in FIG. 1. Here, the pixel circuit 51 shown in FIG. 6 is the pixel circuit 51 on the j-th row and the i-th column. In FIG. 6, out of the constitutional elements of the data driver 600, the DAC 660 corresponding to the data/measurement line DAMEi on the i-th column, the operational amplifier 731, the resistance element R1, the control switch SW and the ADC 732 the as part of the voltage output/current measurement circuit 670 are shown, but the subtraction portion 733 and the division portion 734 in the voltage output/current measurement circuit 670 are omitted for the sake of convenience.

The pixel circuit 51 is provided with one organic EL element OLED, three transistors T1 to T3, and one capacitor (drive capacitance element) C1. The transistor T1 is a drive transistor, the transistor T2 is a reference voltage supply transistor, and the transistor T3 is an input transistor. The transistors T1 to T3 are all n-channel types and, for example, oxide TFTs.

The transistor T1 is provided in series with the organic EL element OLED. The transistor T1 has, as a first conduction terminal, a drain terminal connected to the high level power supply line ELVDD, and has, as a second conduction terminal, a source terminal connected to an anode terminal of the organic EL element OLED. The transistor T2 has a gate terminal connected to a scanning line DMj, and is provided between the reference voltage line Vref and a gate terminal of the transistor T1. The transistor T3 has a gate terminal connected to the scanning line DMj, and is provided between the data/measurement line DAMEi and the source terminal of the transistor T1. The capacitor C1 is provided between the gate terminal and the source terminal of the transistor T1. A cathode terminal of the organic EL element OLED is connected to the low level power supply line ELVSS.

1.5 Operation in Video Signal Period

Figure 7:
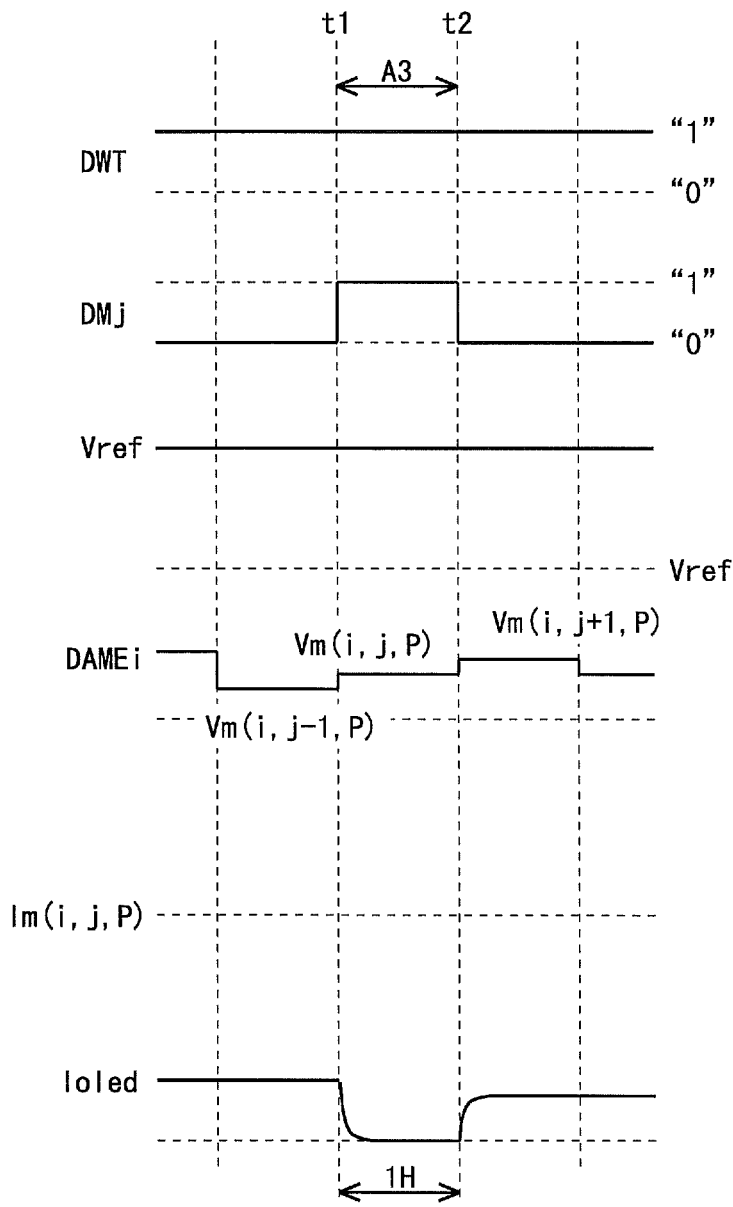
FIG. 7 is a timing chart for explaining operations of the pixel circuit and part of constitutional elements on the data driver side which correspond thereto, both shown in FIG. 6, in a video signal period.

FIG. 7 is a timing chart for explaining operations of the pixel circuit 51 and part of constitutional elements on the data driver 600 side which correspond thereto, both shown in FIG. 6, in the video signal period. "Im(i,j,P)" in timing charts in and after FIG. 7 denotes measurement data. A period A3 from time t1 to time t2 is a period for writing into the pixel circuit 51 the data voltage Vm based on the video data VD corresponding to a desired gradation P (hereinafter the period is referred to as "desired gradation program period"). Hereinafter, "data voltage Vm based on video data VD corresponding to X" may be simply referred to as "data voltage Vm corresponding to X" (X represents a later-mentioned "measuring gradation", the "first gradation P1" or the "second gradation P2").

It is assumed that a potential of the scanning line DMj takes either the "1" level or the "0" level, as does the input/output control signal DWT. In the present embodiment, when the potential of the scanning line DMj is on the "1" level, the scanning line DMj is in a selected state, and when the potential of the scanning line DMj is on the "0" level, the scanning line DMj is in a non-selected state. In the video signal period, n scanning lines DM are sequentially selected as described above. Further, in the video signal period, the input/output control signal is on the "1" level. For this reason, the operational amplifier 731 functions as the buffer amplifier as described above.

Before time t1, the potential of the scanning line DMj is on the "0" level. At this time, the transistors T2, T3 are in the off-state, and the drive current Im(i,j,P) in accordance with the gate-source voltage Vgs held in the capacitor C1 flows through the transistor T1. In addition, the organic EL element OLED emits light with luminance in accordance with the drive current Im(i,j,P). Hereinafter, in the case of distinguishing between the drive current flowing through the transistor T1 and the drive current flowing through the organic EL element OLED, the drive current flowing through the organic EL element OLED is referred to as a light emission drive current Ioled. It should be noted that in one horizontal (1H) period immediately before the desired gradation program period A3, the data/measurement line DAMEi supplies a data voltage Vm(i,j−1,P).

Figure 8:
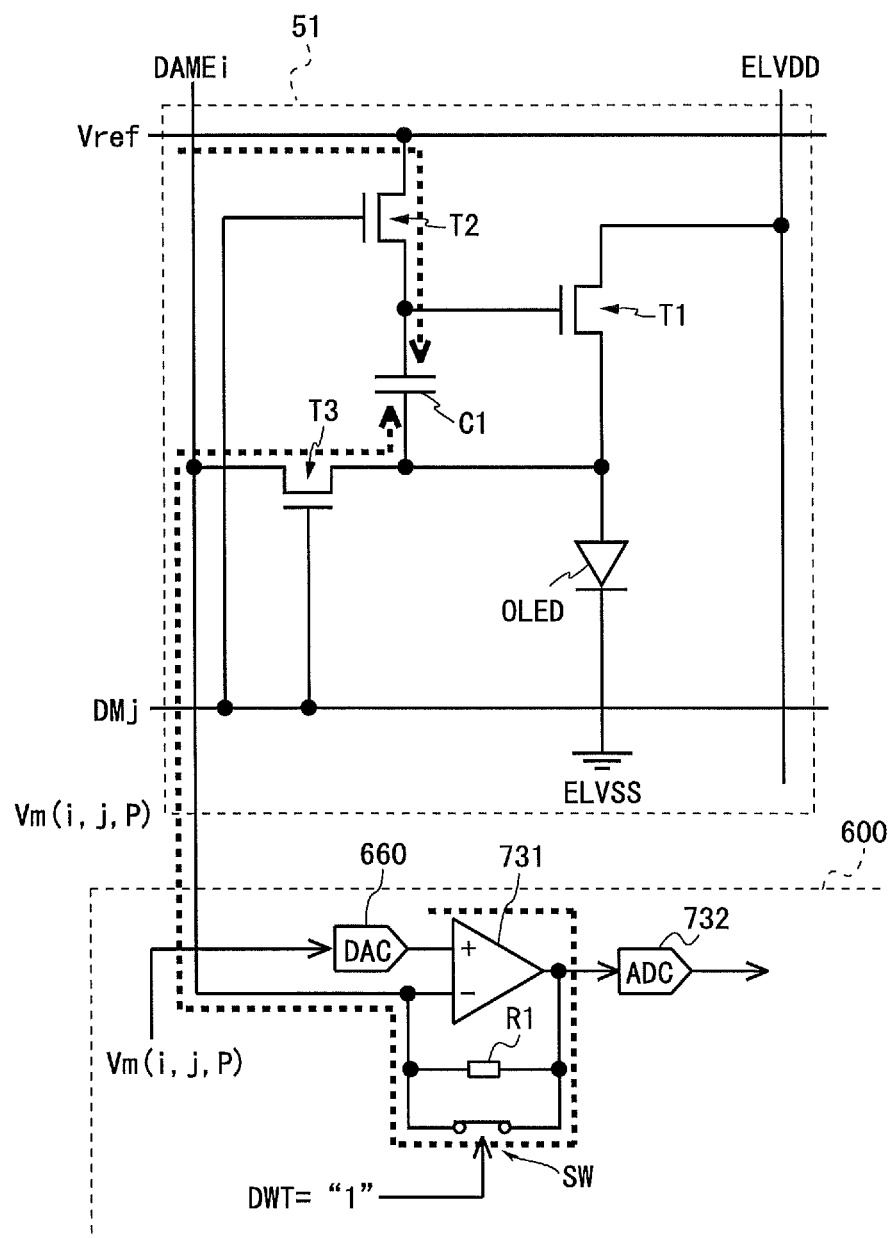
FIG. 8 is a circuit diagram for explaining operations of the pixel circuit and part of constitutional elements on the data driver side which correspond thereto in a desired gradation program period in the above first embodiment.

From time t1, the data voltage Vm(i,j,P) is supplied to the data/measurement line DAMEi via the operational amplifier 731. Further, the potential of the scanning line DMj changes to the "1" level, and the transistors T2, T3 are turned on. Therefore, as shown in FIG. 8, the data voltage Vm(i,j,P) is given to one end (the source terminal side of the transistor T1) of the capacitor C1 via the data/measurement line DAMEi and the transistor T3, and the reference voltage Vref is given to the other end (the gate terminal side of the transistor T1) of the capacitor C1 via the transistor T2. Thereby, the capacitor C1 is charged to have the gate-source voltage Vgs given by the next expression (1) in the desired gradation program period A3 from time t1 to time t2.

$$Vgs = Vref - Vm(i,j,P) \quad (1)$$

In addition, when a threshold voltage of the organic EL element OLED is Vtholed, it is desirable to set the data voltage Vm(i,j,P) to a value given by the next expression (2).

$$Vm(i,j,P) < ELVSS + Vtholed \quad (2)$$

The data voltage Vm(i,j,P) set as in the expression (2) is given to the anode terminal of the organic EL element OLED (the source terminal of the transistor T1), whereby the light emission drive current Ioled becomes zero in the desired gradation program period A3 (the same applies to later-mentioned periods A1, A2). Hence it is possible to stop light emission of the organic EL element OLED.

Figure 9:
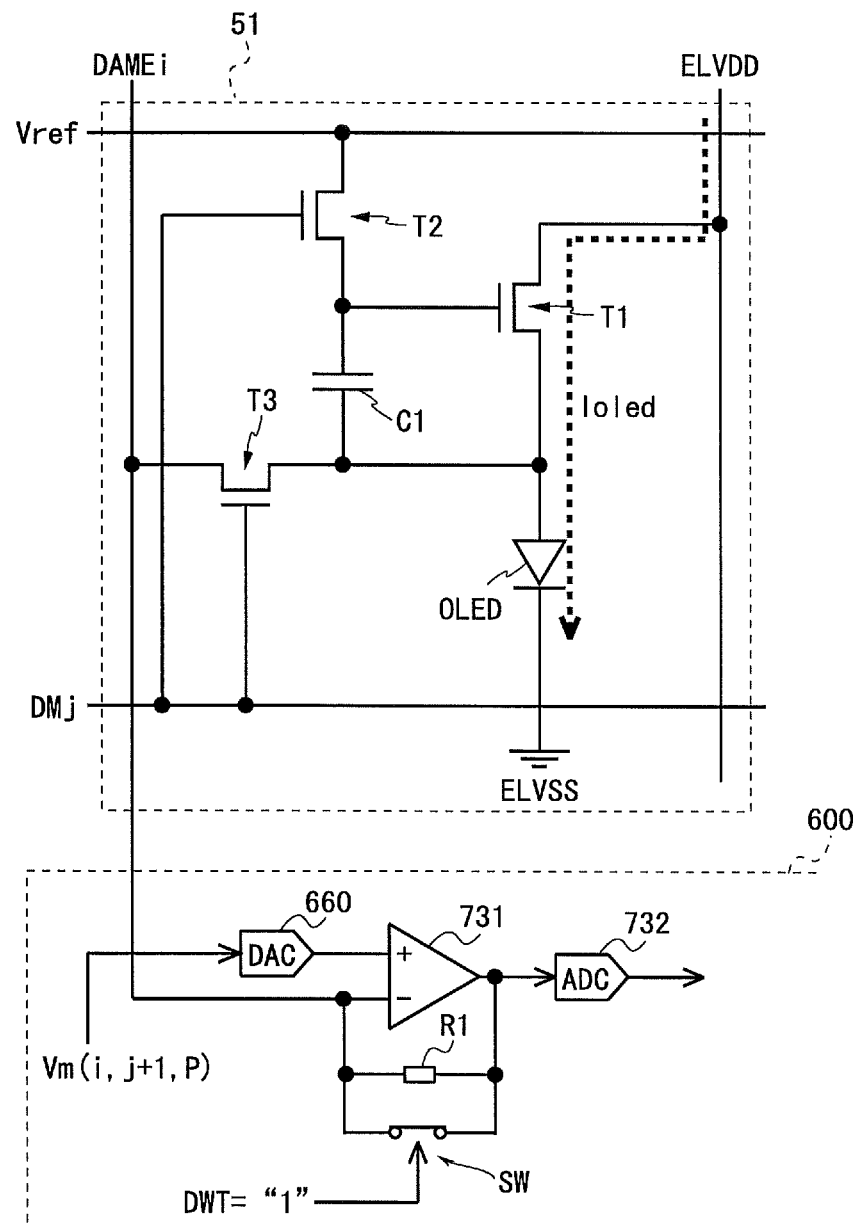
FIG. 9 is a circuit diagram for explaining operations of the pixel circuit and part of constitutional elements on the data driver side which correspond thereto at the time of emission of an organic EL element in the above first embodiment.

At time t2, the potential of the scanning line DMj changes to the "0" level, and the transistors T2, T3 are turned off. For this reason, a holding voltage of the capacitor C1 is determined to be the gate-source voltage Vgs shown in the above expression (1). At this time, since the source terminal of the transistor T1 is electrically separated from the data/measurement line DAMEi, as shown in FIG. 9, the light emission drive current Ioled corresponding to the gate-source voltage Vgs flows, and the organic EL element OLED emits light with luminance in accordance with the light emission drive current Ioled. It should be noted that, when the organic EL element OLED is emitting light with the luminance in accordance with the light emission drive current Ioled as above, Ioled=Im(i,j,P) holds. Since the transistor T1 is operated in a saturation region, the light emission drive current Ioled is given by the next expression (3):

$$Ioled = (\beta/2) * (Vgs - Vt)^2 \quad (3)$$
$$= (\beta/2) * (Vref - Vm(i, j, P) - Vt)^2,$$

where β and Vt represent a gain and a threshold voltage of the transistor T1, respectively. The gain β is given by the following expression (4):

$$\beta = \mu * (W/L) * Cox \quad (4),$$

where μ, W, L and Cox represent mobility, a gate width, a gate length, and a gate insulating film capacitance per unit area of the transistor T1, respectively.

It is to be noted that the data voltage Vm(i,j,P) in the above expression (3) is set such that threshold voltage compensation and gain compensation of the transistor T1 are performed, which will be detailed later. By sequentially performing the above operation in the desired gradation program period A3 with respect to each scanning line DM, the data voltage Vm is written into all the pixel circuits 51 in the video signal period. It should be noted that the drive current Im is not measured in the video signal period.

Incidentally, in the present embodiment, the high level power supply line ELVDD is not connected to the capacitor C1, and hence a value of the gate-source voltage Vgs does not depend on the high level power supply voltage ELVDD. For this reason, as shown in the above expression (3), a value of the light emission drive current Ioled also does not depend on the high level power supply voltage ELVDD. According to such a pixel circuit configuration, even when a large current flows through the high level power supply line ELVDD in order to drive the organic EL element OLED and a drop voltage is generated due to wiring resistance of the high level power supply line ELVDD, the light emission drive current Ioled is not fluctuated.

1.6 Operation in Vertical Synchronization Period

Figure 10:
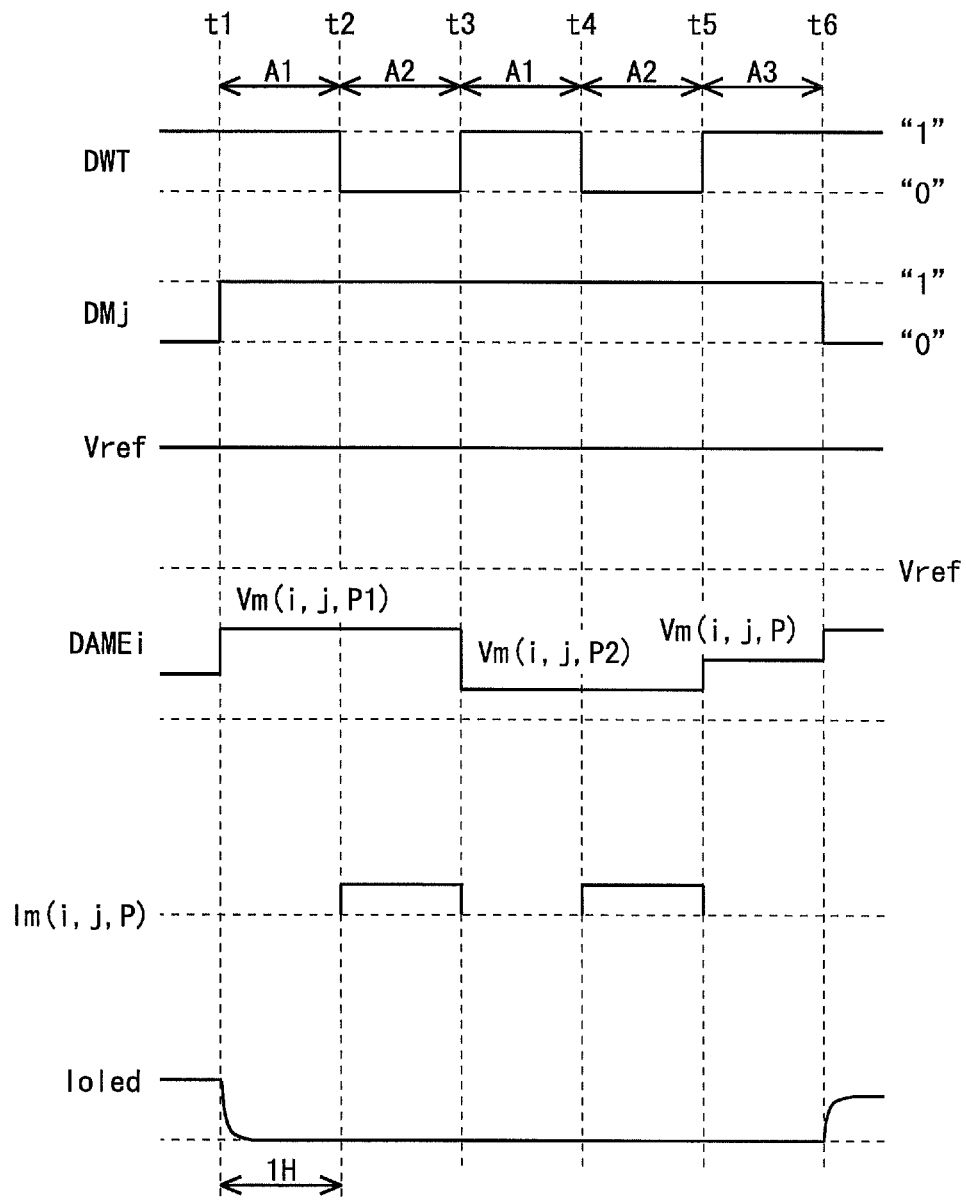
FIG. 10 is a timing chart for explaining operations of the pixel circuit and part of constitutional elements on the data driver side which correspond thereto, both shown in FIG. 6, in a vertical synchronization period.

FIG. 10 is a timing chart for explaining operations of the pixel circuit 51 and part of constitutional elements on the data driver 600 side which correspond thereto, both shown in FIG. 6, in the vertical synchronization period. Each of a period A1 from time t1 to time t2 and a period A1 from time t3 to time t4 is a period (hereinafter referred to as "measuring gradation program period") for writing, into the pixel circuit 51, the data voltage Vm (hereinafter may be simply referred to as "measuring data voltage") based on video data corresponding to a gradation (hereinafter referred to as "measuring gradation") that is used for measuring the drive current Im. There are two kinds of measuring gradations: one is a relatively low first gradation P1 out of gradations settable in the controller 10 based on the video signal VS, and the other is a relatively high second gradation P2 out of the gradations settable in the controller 10 based on the video signal VS. Specific settings of the first and second gradations P1, P2 will be described later. Each of a period A2 from time t2 to time t3 and a period A2 from time t4 to time t5 is a period (hereinafter referred to as "current measurement period") for measuring the drive current Im corresponding to the measuring data voltage Vm. Hereinafter, a measuring data voltage corresponding to the first gradation P1 is referred to as a "first measuring data voltage", and a measuring data voltage corresponding to the second gradation P2 is referred to as a "second measuring data voltage". Further, video data corresponding to the first gradation P1 is referred to as "first measuring video data", and video data corresponding to the second gradation P2 is referred to as "second measuring video data".

In the vertical synchronization period, p scanning lines DM are sequentially selected as described above. Here, when the display panel 40 in the present embodiment is in an FHD (Full High Definition) system, a total number of scanning lines is 1125 and the number of effective scanning lines is 1080. The number n of scanning lines DM corresponds to the number of effective scanning lines. In the FHD system, since the one frame period has 1125H periods and the video signal period has 1080H periods, the vertical synchronization period has 45H periods. In the present embodiment, assuming that p=9, and each of 9 scanning lines DM is sequentially selected every 5H periods in the vertical synchronization period. It should be noted that the value of p, the length of the period for which the scanning line DM is selected, and the like, are mere examples, and the present invention is not restricted thereto.

As shown in FIG. 10, in the 5H periods from time t1 to time t6 during which the potential of the scanning line DMj is on the "1" level, the level of the input/output control signal DWT is switched in sequence of the "1" level, the "0" level, the "1" level, the "0" level, and the "1" level every 1H period. The operational amplifier 731 functions as the buffer amplifier as described above when the input/output control signal DWT is on the "1" level, and it functions as the current amplifier as described above when the input/output control signal DWT is on the "0" level.

Before time t1, the potential of the scanning line DMj is on the "0" level. At this time, the transistors T2, T3 are in the off-state, and the drive current Im(i,j,P) in accordance with the gate-source voltage Vgs held in the capacitor C1 flows through the transistor T1. The drive current Im(i,j,P), which flows through the transistor T1, flows as the light emission drive current Ioled through the organic EL element OLED. In addition, the organic EL element OLED emits light with luminance in accordance with the light emission drive current Ioled.

Figure 11:
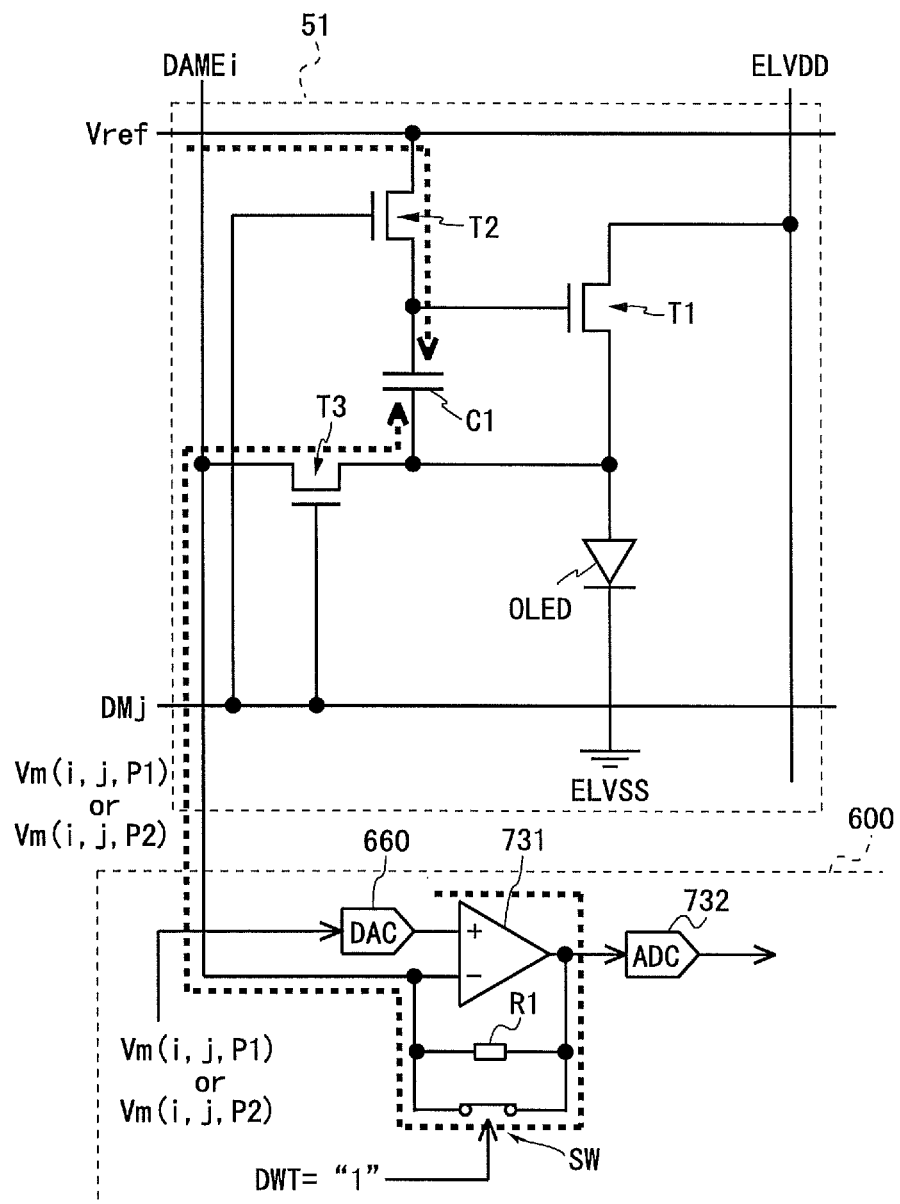
FIG. 11 is a circuit diagram for explaining operations of the pixel circuit and part of constitutional elements on the data driver side which correspond thereto in a measuring gradation program period in the above first embodiment.

At time t1, the potential of the scanning line DMj changes to the "1" level, and the transistors T2, T3 are turned on. Further, the input/output control signal DWT changes to the "1" level, and the control switch SW is closed. Moreover, the first measuring data voltage Vm(i,j,P1) is inputted into the non-inverting input terminal of the operational amplifier 731. Therefore, as shown in FIG. 11, the first measuring data voltage Vm(i,j,P1) is supplied to the data/measurement line DAMEi. Accordingly, similarly to the desired gradation program period A3, in the measuring gradation program period A1 from time t1 to time t2, the capacitor C1 is charged with the gate-source voltage Vgs given by the next expression (5).

$$Vgs = Vref - Vm(i,j,P1) \quad (5)$$

Hereinafter, the measuring gradation program period A1 for writing the first measuring data voltage Vm(i,j,P1) is referred to as a "first measuring gradation program period".

Figure 12:
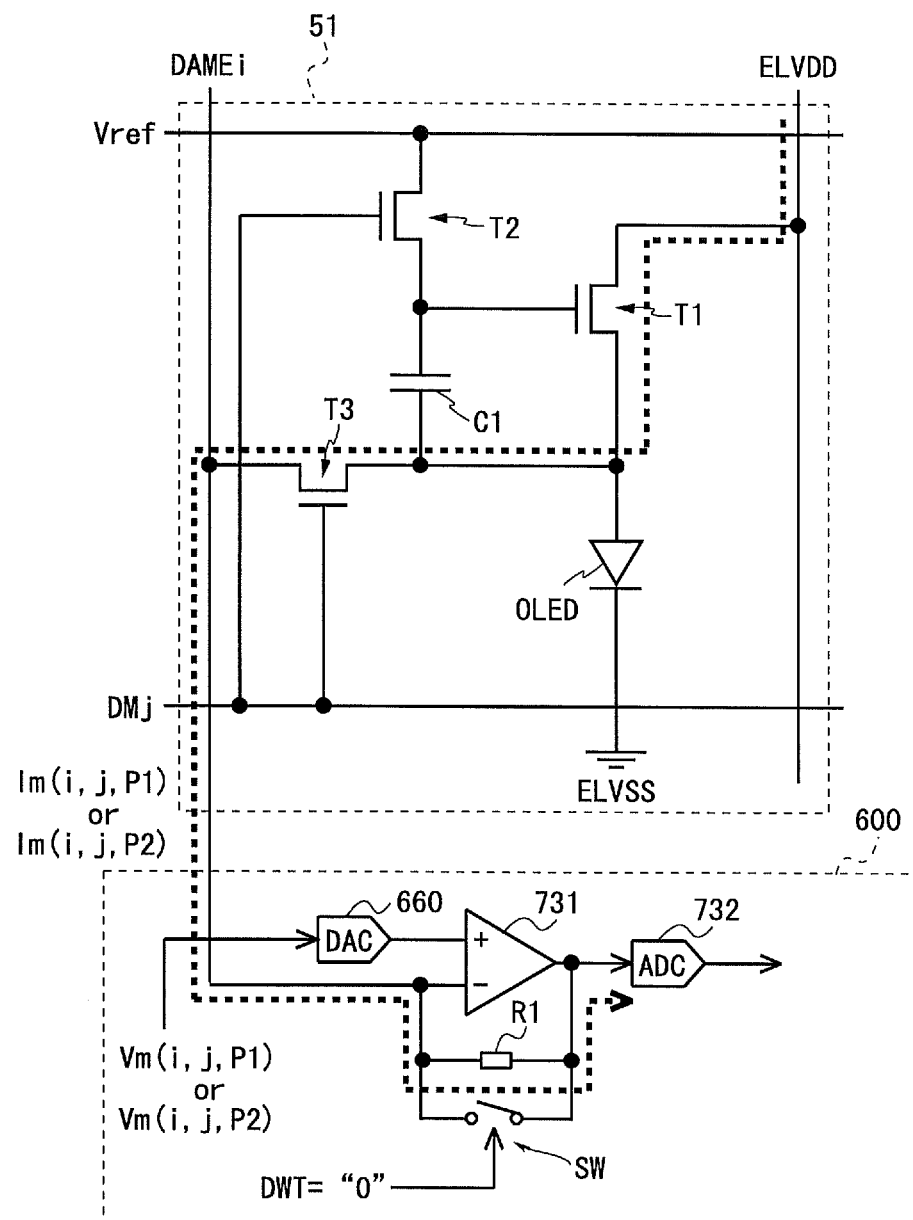
FIG. 12 is a circuit diagram for explaining operations of the pixel circuit and part of constitutional elements on the data driver side which correspond thereto in a current measurement period in the above first embodiment.

At time t2, the input/output control signal DWT changes to the "0" level, and the control switch SW is opened. Further, similarly to time t1, the first measuring data voltage Vm(i,j,P1) is inputted into the non-inverting input terminal of the operational amplifier 731, and hence the potential of the inverting input terminal also becomes the first measuring data voltage Vm(i,j,P1) due to a virtual short circuit. It is to be noted that, since the data/measurement line DAMEi has already been charged to the first measuring data voltage Vm(i,j,P1) in the period A1 from time t1 to time t2, the time required for the potential of the inverting input terminal to become the first measuring data voltage Vm(i,j,P1) is very little. In the current measurement period A2 from time t2 to time t3, as shown in FIG. 12, a current path of the drive current Im(i,j,P1) via the transistor T3 in the on-state is formed, and the drive current Im(i,j,P1) is outputted from the pixel circuit 51 to the data/measurement line DAMEi. It is to be noted that the light emission drive current Ioled does not flow, as seen from the above expression (2). Thus, when the transistor T3 is in the on-state, it can output the drive current Im(i,j,P1) to the data/measurement line DAMEi (the same applies to a later-mentioned drive current Im(i,j,P2)). Since the measurement procedure for the drive current Im(i,j,P1) outputted to the data/measurement line DAMEi is as described above, its description will be omitted here. Hereinafter, the drive current Im(i,j,P1) corresponding to the first gradation P1 is referred to as a "first drive current", and the current measurement period A2 for measuring the first drive current Im(i,j,P1) is referred to as a "first current measurement period". Further, the measurement data Im(i,j,P1) indicating a value of the first drive current Im(i,j,P1) is referred to as "first measurement data".

The operation in the measuring gradation program period A1 from time t3 to time t4 is one obtained only by changing, to the second gradation P2, the first gradation P1 in the operation in the first measuring gradation program period A1 from time t1 to time t2, and hence its detailed description will be omitted. Hereinafter, the measuring gradation program period A1 for writing the second measuring data voltage Vm(i,j,P2) is referred to as a "second measuring gradation program period".

The operation in the current measurement period A2 from time t4 to time t5 is one obtained only by changing, to the second gradation P2, the first gradation P1 in the operation in the first current measurement period A2 from time t2 to time t3, and hence its detailed description will be omitted. Hereinafter, the drive current Im(i,j,P2) corresponding to the second gradation P2 is referred to as a "second drive current", and the current measurement period A2 for measuring the second drive current Im(i,j,P2) is referred to as a "second current measurement period". Further, the measurement data Im(i,j,P2) indicating a value of the second drive current Im(i,j,P2) is referred to as "second measurement data".

The operation in the desired gradation program period A3 from time t5 to time t6 is similar to that in the video signal period, and hence its detailed description will be omitted. However, the data voltage Vm(i,j,P) that is written into the pixel circuit 51 in the desired gradation program period A3 during the vertical synchronization period in the present embodiment is a value to which correction data updated based on the first and second measurement data Im(i,j,P1), Im(i,j,P2) acquired during the vertical synchronization period has been reflected (detailed later).

At time t6, the potential of the scanning line DMj changes to the "0" level, and the transistors T2, T3 are turned off. For this reason, a holding voltage of the capacitor C1 is determined to be the gate-source voltage Vgs shown in the above expression (1). At this time, since the source terminal of the transistor T1 is electrically separated from the data/measurement line DAMEi, the light emission drive current Ioled shown in the above expression (3) flows, and the organic EL element OLED emits light with luminance in accordance with the light emission drive current Ioled.

It is to be noted that although it is assumed here that the second measuring gradation program period A1 and the second current measurement period A2 are provided after the first measuring gradation program period A1 and the first current measurement period A2, the first measuring gradation program period A1 and the first current measurement period A2 may be provided after the second measuring gradation program period A1 and the second current measurement period A2.

By performing the respective operations in the first measuring gradation program period A1, the first current measurement period A2, the second measuring gradation program period A1, the second current measurement period A2 and the desired gradation program period A3 with respect to each of the p scanning lines DM, the drive current Im is measured with respect to each of the pixel circuits 51 ((m×p) circuits) corresponding to the p scanning lines DM.

It is to be noted that, when the drive current Im is measured with respect to each of the pixel circuits 51 corresponding to scanning lines DM1 to DMp on the first to p-th rows in the vertical synchronization period of a certain frame period, the drive current Im is measured with respect to each of the pixel circuits 51 corresponding to scanning lines DMp+1 to DM2p on the (p+1)-th to 2p-th rows in the vertical synchronization period of the next frame period. Moreover, when the drive current Im is measured in each of the pixel circuits 51 corresponding to scanning lines DMn-p+1 to DMn on the (n-p+1)-th to nth rows in the vertical synchronization period of a certain frame period, the drive current Im is measured with respect to each of the pixel circuits 51 corresponding to the scanning lines DM1 to DMp on the first to p-th rows in the vertical synchronization period of the next frame period. In such a manner, by sequentially shifting the (m×p) pixel circuits as measurement targets every one frame period without overlapping, the drive current Im can be measured with respect to each of the (m×n) pixel circuits 51. As described above, when p=9 in the FHD system, the drive current Im can be measured for all the pixel circuits 51 in 120 frame periods (1080 rows/9 rows), namely in 2 seconds.

1.7 Operation in Each Frame Period

Figure 13:
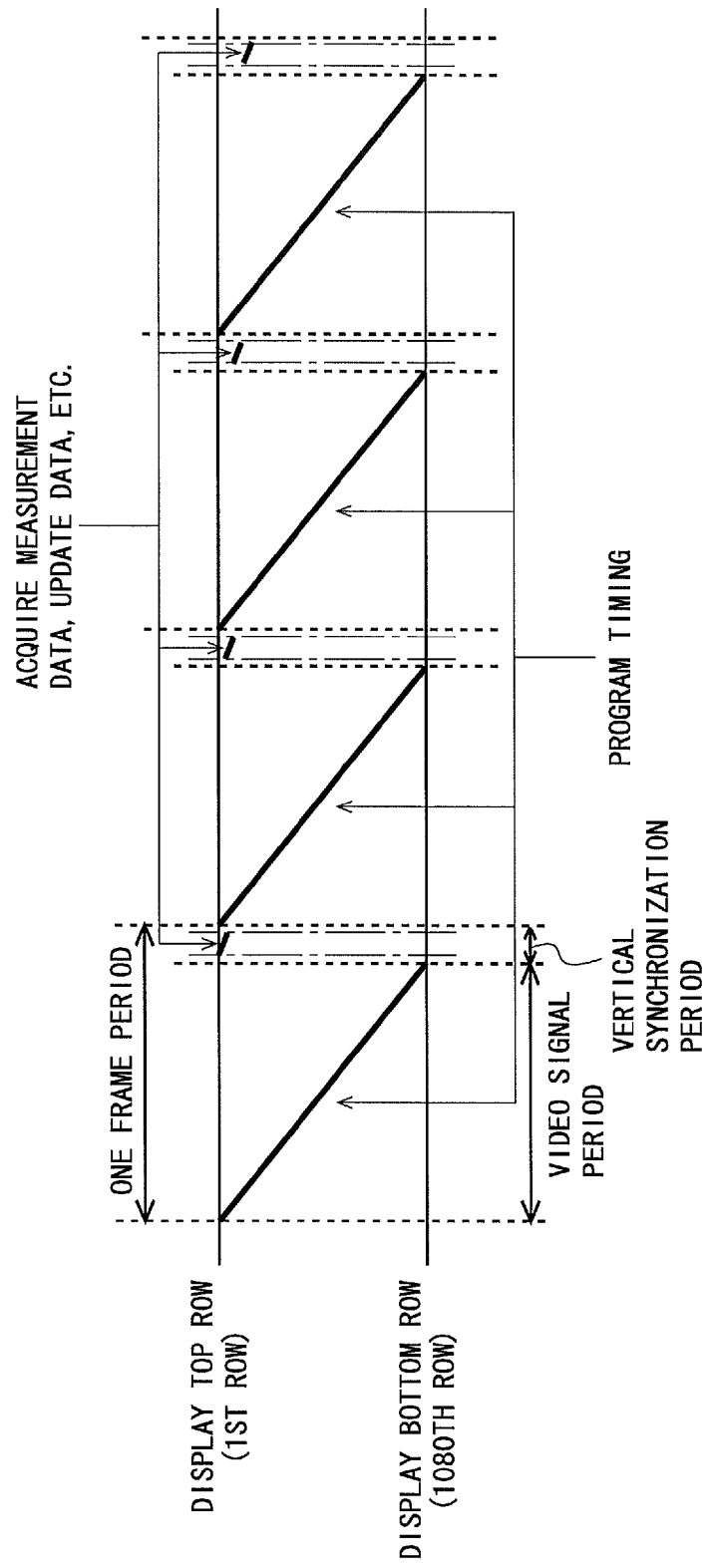
FIG. 13 is a diagram for explaining an operation in each frame period in the above first embodiment.

FIG. 13 is a diagram for explaining an operation in each frame period in the present embodiment. Program timing in FIG. 13 shows timing for selecting each scanning line DM and writing the data voltage Vm into the pixel circuit 51 corresponding to the scanning line DM in the video signal period. In the vertical synchronization period of the first frame period, measurement data is acquired with respect to each of the pixel circuits 51 corresponding to the scanning lines DM1 to DMp on the first to p-th rows, and the correction data is updated based on the measurement data. In the vertical synchronization period of the second frame period, measurement data is acquired with respect to each of the pixel circuits 51 corresponding to the scanning lines DMp+1 to DM2p on the (p+1)-th to 2p-th rows, and the correction data is updated based on the measurement data. Also in the third frame period and thereafter, a similar operation is performed by shifting the p scanning lines DM every one frame period without overlapping.

1.8 Data Driver for One Column

Figure 14:
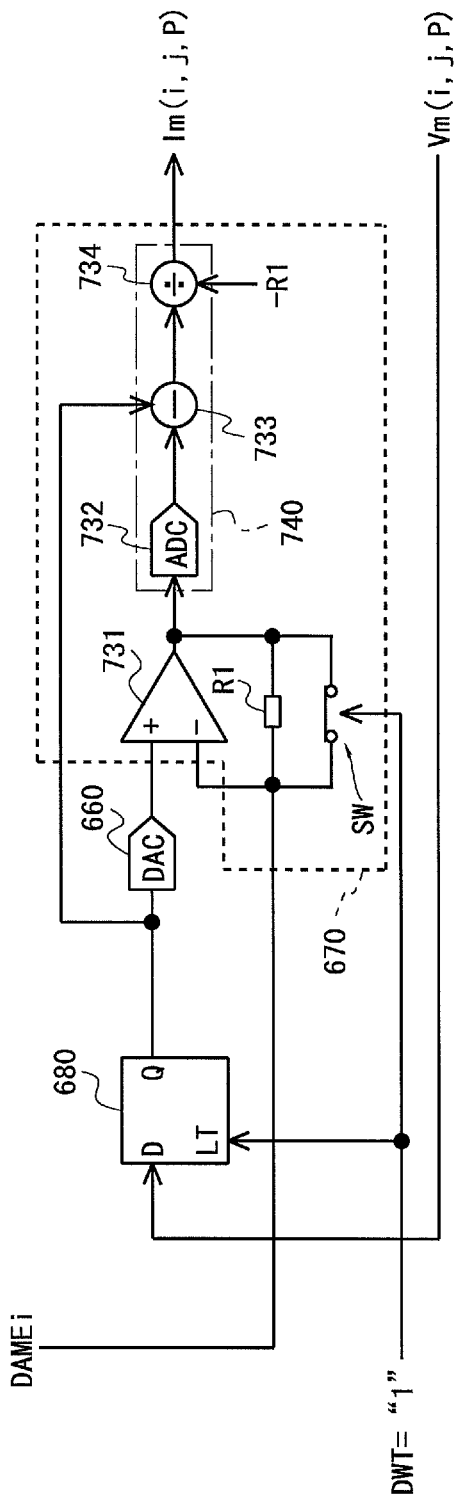
FIG. 14 is a circuit diagram showing a constitutional example of the data driver shown in FIG. 3 for one column.

FIG. 14 is a circuit diagram showing a constitutional example of the data driver 600 for one column shown in FIG. 3. It is to be noted that in FIG. 14, the shift register 63, the first latch portion 64 and the latch circuit 650 are omitted for the sake of convenience. The data driver 600 is provided with a D latch 680 provided on a preceding stage to the DAC 660, corresponding to each data/measurement line DAME. The D latch 680 in the present embodiment corresponds to the data latch portion. In addition, although the D latches 680 are actually provided for a plurality of bit numbers with respect to each one column, a description will be given hereinafter assuming that the D latch 680 is provided for one bit with respect to each one column for the sake of convenience.

The D latch 680 is provided with a D input terminal, an LT input terminal and a Q output terminal. The D latch 680 receives the video data Vm(i,j,P) from the D input terminal, receives the input/output control signal DWT from the LT input terminal, and outputs from the Q output terminal the video data Vm(i,j,P) to be given to the DAC 660 and the subtraction portion 733. When the input/output control signal DWT is on the "1" level, the D latch 680 outputs the video data Vm(i,j,P) received from the D input terminal, as it is from the Q output terminal. When the input/output control signal DWT is on the "0" level, the D latch 680 latches the video data Vm(i,j,P) obtained at the time when the input/output control signal DWT is on the "1" level immediately before, and outputs it from the Q output terminal.

Figure 15:
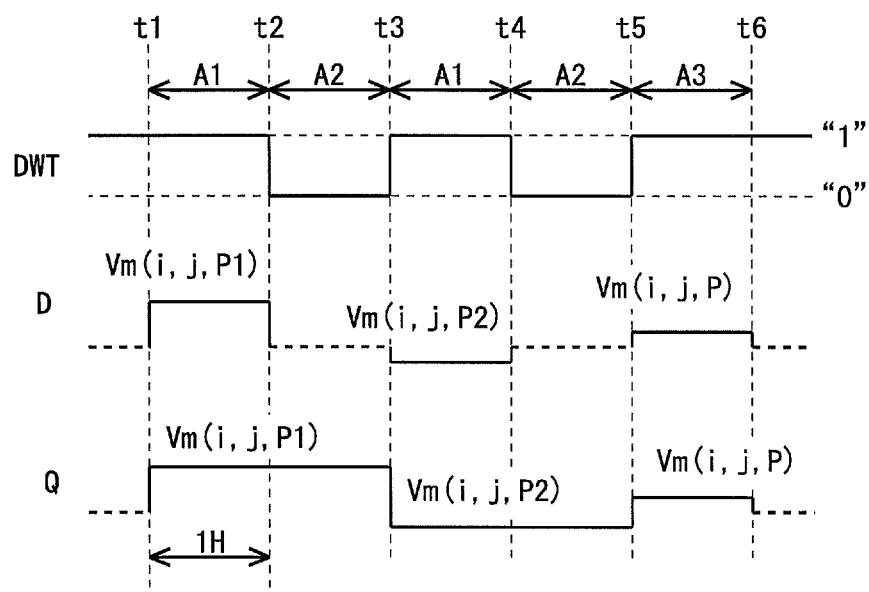
FIG. 15 is a timing chart for explaining an operation of a D latch shown in FIG. 14 in the vertical synchronization period.

FIG. 15 is a timing chart for explaining an operation of the D latch 680 shown in FIG. 14 in the vertical synchronization period. In FIG. 15, an input to the D input terminal is denoted by a symbol D, and an output from the Q output terminal is denoted by a symbol Q.

In the first measuring gradation program period A1 from time t1 to time t2, the first measuring video data Vm(i,j,P1) is inputted into the D input terminal. At this time, the input/output control signal DWT is on the "1" level, and hence the first measuring video data Vm(i,j,P1) inputted into the D input terminal is outputted as it is from the Q output terminal.

In the first current measurement period A2 from time t2 to time t3, for example, there is no input into the D input terminal. Since the input/output control signal DWT is on the "0" level at this time, the first measuring video data Vm(i,j,P1) as the input into the D input terminal in the first measuring gradation program period A1 immediately therebefore is latched, and then outputted from the output terminal. In addition, more specifically, the first measuring video data Vm(i,j,P1) is latched at the time of the input/output control signal DWT being changed from the "1" level to the "0" level. The same applies to latching of the second measuring video data Vm(i,j,P2).

In the second measuring gradation program period A1 from time t3 to time t4, the second measuring video data Vm(i,j,P2) is inputted into the D input terminal. At this time, the input/output control signal DWT is on the "1" level, and hence the second measuring video data Vm(i,j,P2) inputted into the D input terminal is outputted as it is from the Q output terminal.

In the second current measurement period A2 from time t4 to time t5, for example, there is no input into the D input terminal. Since the input/output control signal DWT is on the "0" level at this time, the second measuring video data Vm(i, j,P2) as an input into the D input terminal in the second measuring gradation program period A1 immediately therebefore is latched, and then outputted from the output terminal.

In the desired gradation program period A3 from time t5 to time t6, the video data Vm(i,j,P) corresponding to the gradation P is inputted into the D input terminal. At this time, the input/output control signal DWT is on the "1" level, and hence the video data Vm(i,j,P) inputted into the D input terminal is outputted as it is from the Q output terminal.

In such a manner as above, the potential of the data/measurement line DAMEi in the timing chart shown in FIG. 10 is obtained. The configuration for obtaining the potential of the data/measurement line DAMEi as thus described can be modified in a variety of manners, and is not restricted to the example of using the D latch 680.

It is to be noted that in the video signal period, the input/output control signal DWT is constantly on the "1" level, and hence the D latch 680 outputs the video data Vm(i,j,P) received from the D input terminal, as it is from the Q output terminal.

1.9 Data Communication Between Controller and Data Driver

Figure 16:
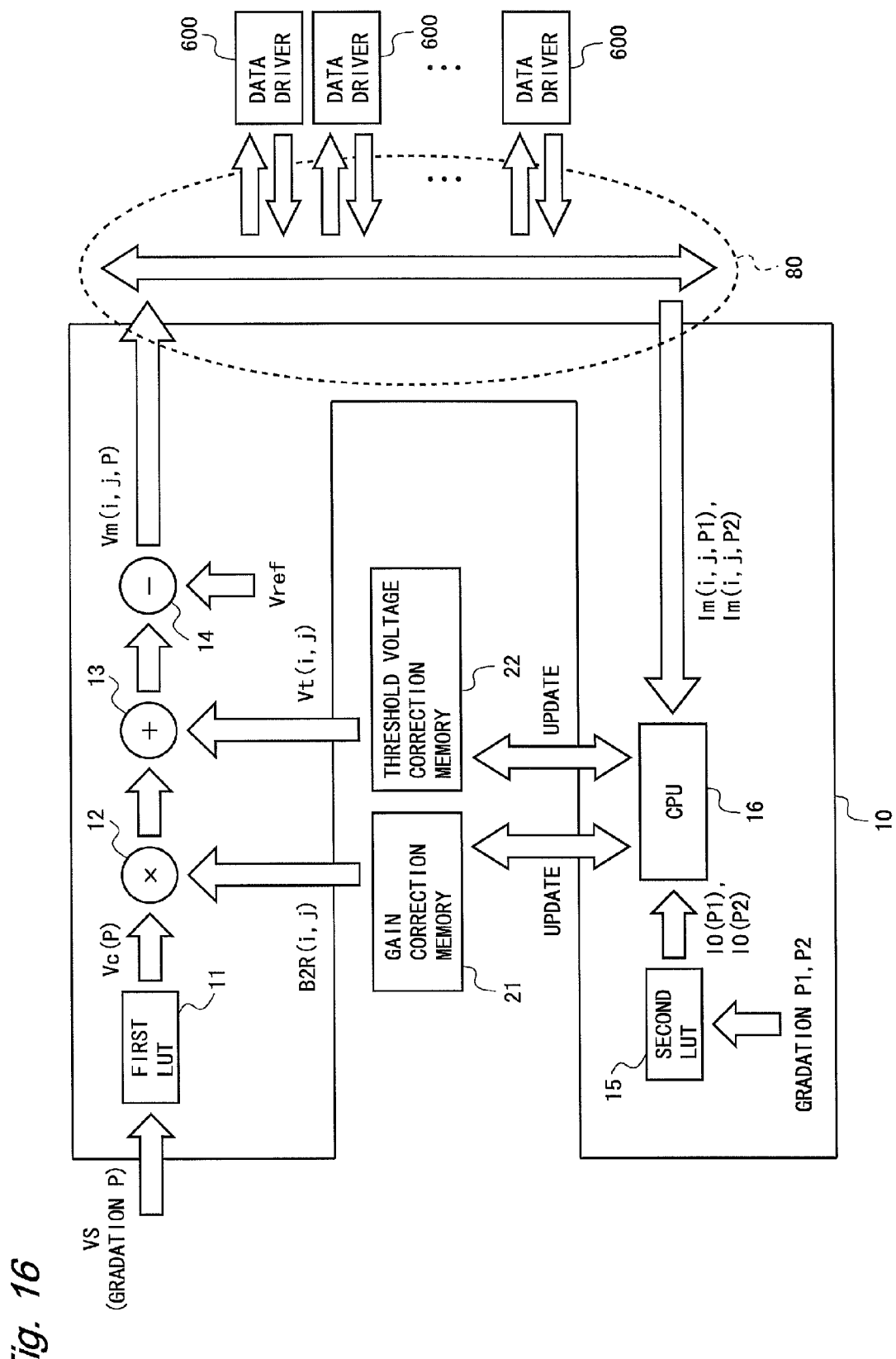
FIG. 16 is a block diagram for explaining data communication between a controller and the data driver in the above first embodiment.

FIG. 16 is a block diagram for explaining data communication between the controller 10 and the data driver 600 in the present embodiment. The communication bus 80 in the present embodiment is configured of a unidirectional communication bus from the controller 10 to the data driver 600 (hereinafter referred to as "first unidirectional communication bus"), and a unidirectional communication bus from the data driver 600 to the controller 10 (hereinafter referred to as "second unidirectional communication bus"). It is to be noted that, although the kinds of first and second unidirectional communication buses are not particularly restricted, for example, they are LVDS (Low Voltage Differential Signaling), MIPI (Mobile Industry Processor Interface), e-DP (Embedded Display Port), or the like.

A gain correction memory 21 and a threshold voltage correction memory 22 shown in FIG. 16 are provided in a predetermined storage region of the DRAM 20. The gain correction memory 21 stores gain correction data for correcting the video data Vm(i,j,P) so that gain compensation of the transistor T1 (drive transistor) is performed. The threshold voltage correction memory 22 stores threshold voltage correction data for correcting the video data Vm(i,j,P) so that threshold voltage compensation of the transistor T1 is performed. Each of the gain correction data and the threshold voltage correction data is prepared with respect to each pixel circuit 51. Hereinafter, the gain correction data corresponding to the pixel circuit 51 on the j-th row and the i-th column is denoted by a symbol B2R(i,j). Further, the threshold voltage correction data corresponding to the pixel circuit on the j-th row and the i-th column is denoted by a symbol Vt(i,j). In the present embodiment, the gain correction data B2R(i,j) corresponds to second correction data, and the threshold voltage correction data Vt(i,j) corresponds to first correction data. In addition, it is assumed that an initial value of the gain correction data B2R(i,j) is set to 1, and an initial value of the threshold voltage correction data Vt(i,j) is set to a common predetermined value in each pixel circuit 51.

As shown in FIG. 16, the controller 10 is provided with a first LUT (Look up Table) 11, a multiplication portion 12, an addition portion 13, a subtraction portion 14, a second LUT 15, and a CPU (Central Processing Unit) 16. It is to be noted that a logic circuit or the like may be used in place of the CPU 16. The CPU 16 controls a variety of operations of the controller 10.

The first LUT 11 receives the video signal VS from the outside, converts the gradation P shown by the video signal VS to the control voltage Vc(P) with respect to each pixel circuit 51. The conversion in the first LUT 11 will be detailed later.

The multiplication portion 12 receives the control voltage Vc(P) from the first LUT 11, and receives the gain correction data B2R(i,j) read from the gain correction memory 21. The timing for reading the gain correction data B2R(i,j) from the gain correction memory 21 is controlled by the CPU 16 or the like. The multiplication portion 12 outputs "Vc(P)*B2R(i,j)" obtained by multiplying the control voltage Vc(P) by the gain correction data B2R(i,j).

The addition portion 13 receives an output of the multiplication portion 12, and receives the threshold voltage correction data Vt(i,j) read from the threshold voltage correction memory 22. The timing for reading the threshold voltage correction data Vt(i,j) from the threshold voltage correction memory 22 is controlled by the CPU 16 or the like. The addition portion 13 outputs "Vc(P)*B2R(i,j)+Vt(i,j)" obtained by adding the threshold voltage correction data Vt(i,j) to the output of the multiplication portion 12.

The subtraction portion 14 receives the output of the addition portion 13 and the reference voltage Vref, and outputs, as the video data Vm(i,j,P), a value obtained by subtracting the output of the addition portion 13 from the reference voltage Vref. The video data Vm(i,j,P) outputted from the subtraction portion 14 is held by, for example, a buffer memory, not shown, or the like and is sent to the corresponding data driver 600 via the first unidirectional communication bus at predetermined timing based on control by the CPU 16. The video data Vm(i,j,P) outputted by the subtraction portion 14 is given by the next expression (6).

$$Vm(i,j,P)=Vref-Vc(P)*B2R(i,j)-Vt(i,j) \tag{6}$$

Here, when the expression (6) is substituted for the above expression (3), the next expression (7) is obtained.

$$Ioled=(\beta/2)*(Vc(P)*B2R(i,j)+Vt(i,j)-Vt)^2 \tag{7}$$

It is found from the above expression (7) that setting the gain correction data B2R(i,j) and the threshold voltage correction data Vt(i,j) to values in accordance with the state of the transistor T1 enables the gain compensation and the threshold voltage compensation.

The foregoing conversion in the first LUT 11 will be further described. Here, it is assumed that a current for lighting the organic EL element OLED with the maximum luminance Yw is Iw, and the gate-source voltage Vgs of the transistor T1 at that time is given by the next expression (8).

$$Vgs=Vw+Vth \tag{8}$$

In this case, the conversion in the first LUT 11 may be performed in accordance with the next expression (9), for example.

$$Vc(P)=Vw*P^{1.1} \tag{9}$$

By selecting the control voltage Vc(P) in such a manner, the light emission drive current Ioled(P) corresponding to the gradation P is given by the next expression (10). In addition, it is assumed: B2R(i,j)=1, Vt(i,j)=Vt.

$$Ioled(P)=(\beta/2)*Vw^2*P^{2.2} \quad (10)$$

Figure 17:
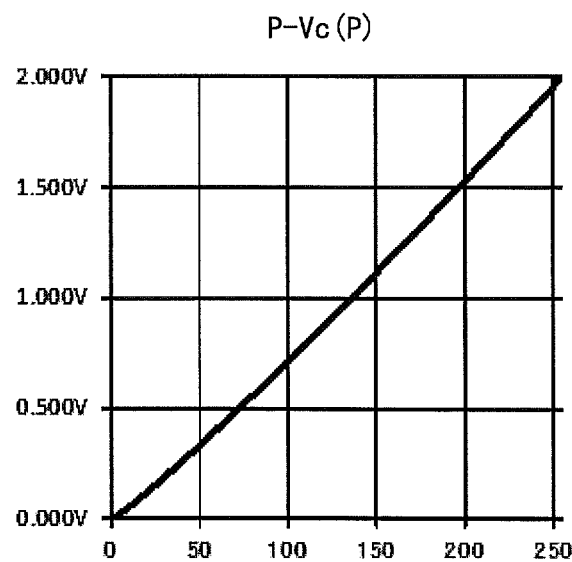
FIG. 17 is a diagram showing gradation/control voltage characteristics.
Figure 18:
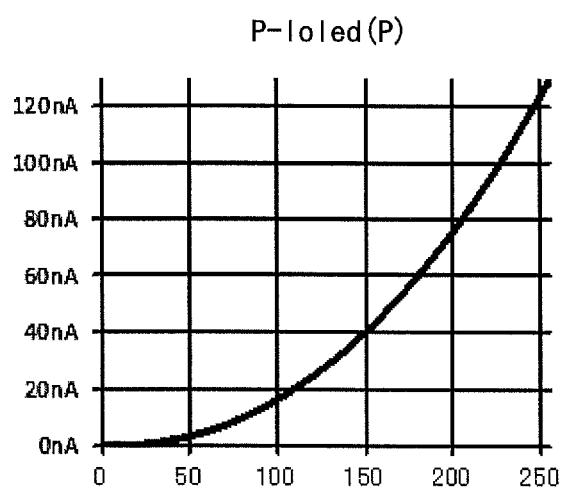
FIG. 18 is a diagram showing gradation/light emission drive current characteristics.
Figure 19:
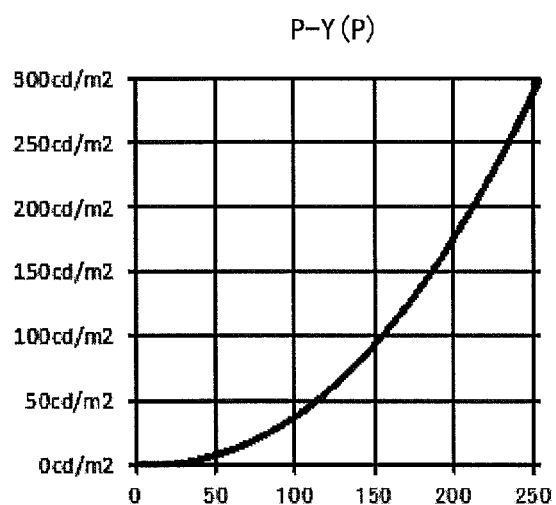
FIG. 19 is a diagram showing gradation/light emission luminance characteristics.

Accordingly, the light emission drive current Ioled has a characteristic of γ=2.2 with respect to the gradation P, and the light emission luminance which is proportional to the light emission drive current Ioled also has a characteristic of γ=2.2. The input/output relation of the first LUT 11 at the time of Iw=130 nA and Vw=2.0 V are shown in the following. Gradation P/control voltage Vc(P) characteristics are shown in FIG. 17, gradation P/light emission drive current Ioled(P) characteristics are shown in FIG. 18, and gradation P/light emission luminance Y(P) characteristics are shown in FIG. 19.

Incidentally, the expression (10) shows an ideal case where the output current (drive current) of the transistor T1 has a characteristic of being a square of the input control voltage, but in a region with a small output current, the output current actually deviates from the square characteristic. Accordingly, in the conversion in the first LUT 11, Vc(P) normalized by the next expression (11) in place of the above expression (9) is desirably taken as an output. This can improve conversion accuracy in the first LUT 11:

$$Vc(P)=Vw*Vn(P) \quad (11),$$

where Vn(P) is a non-linear value with respect to the gradation P.

Figure 20:
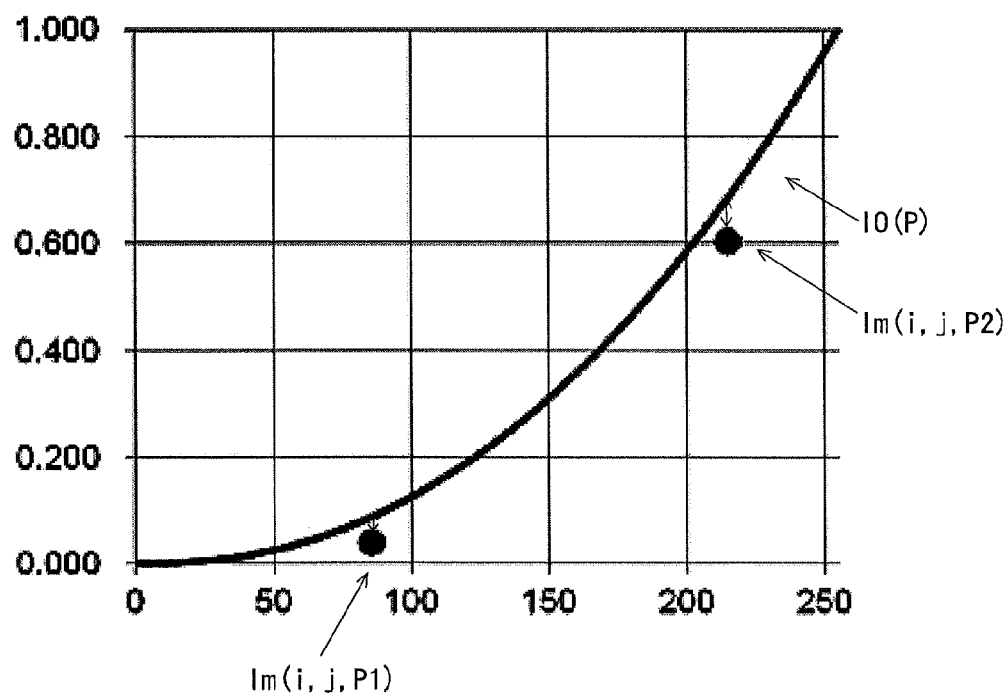
FIG. 20 is a diagram showing ideal characteristic data.
Figure 21:
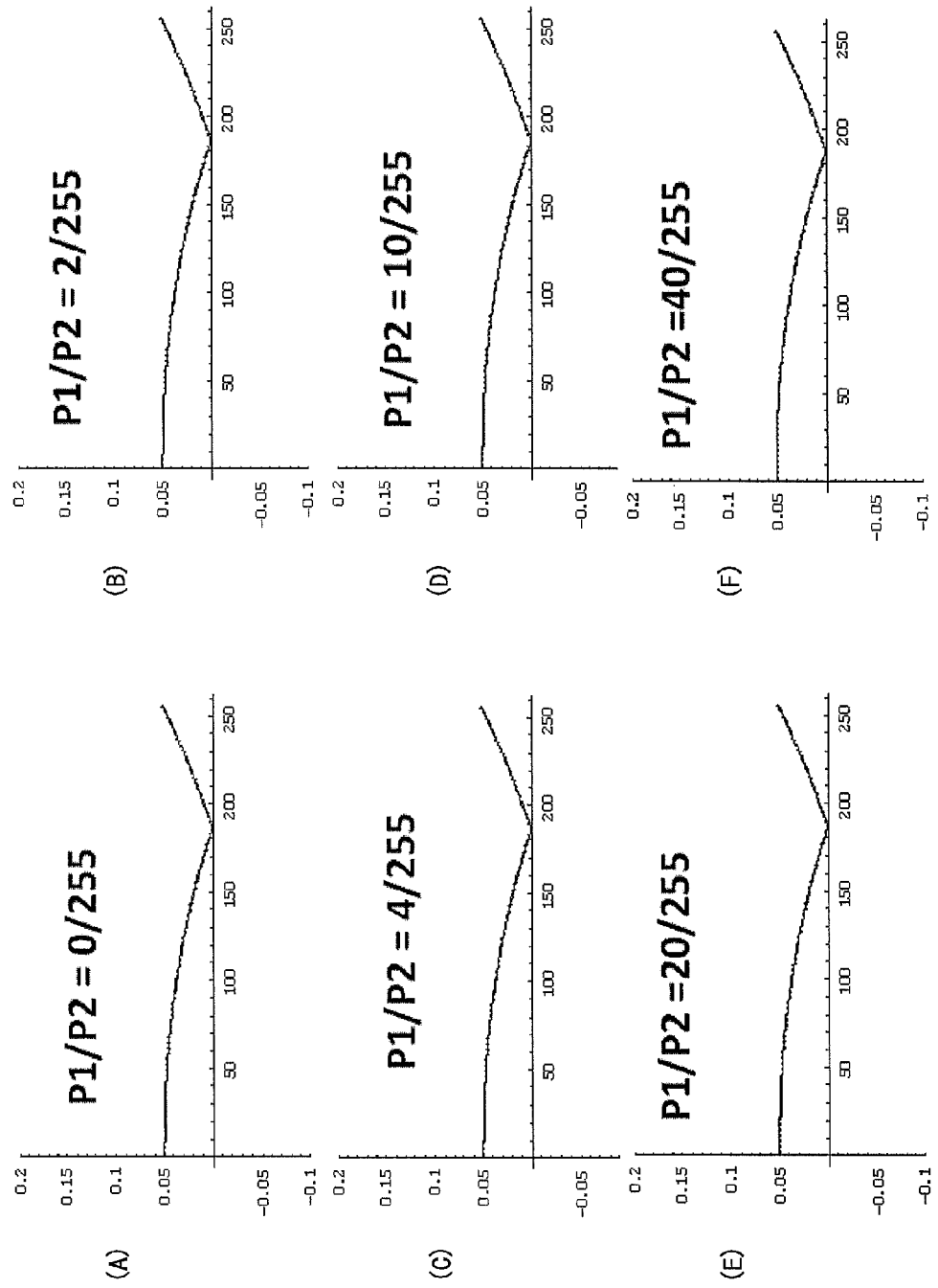
FIGS. 21(A) to 21(F) are diagrams showing measurement error simulation results, in which (A) is a diagram showing a simulation result in a case where a first gradation P1 is 0 and a second gradation P2 is 255, (B) is a diagram showing a simulation result in a case where the first gradation P1 is 2 and the second gradation P2 is 255, (C) is a diagram showing a simulation result in a case where the first gradation P1 is 4 and the second gradation P2 is 255, (D) is a diagram showing a simulation result in a case where the first gradation P1 is 10 and the second gradation P2 is 255, (E) is a diagram showing a simulation result in a case where the first gradation P1 is 20 and the second gradation P2 is 255, and (F) is a diagram showing a simulation result in a case where the first gradation P1 is 40 and the second gradation P2 is 255.
Figure 22:
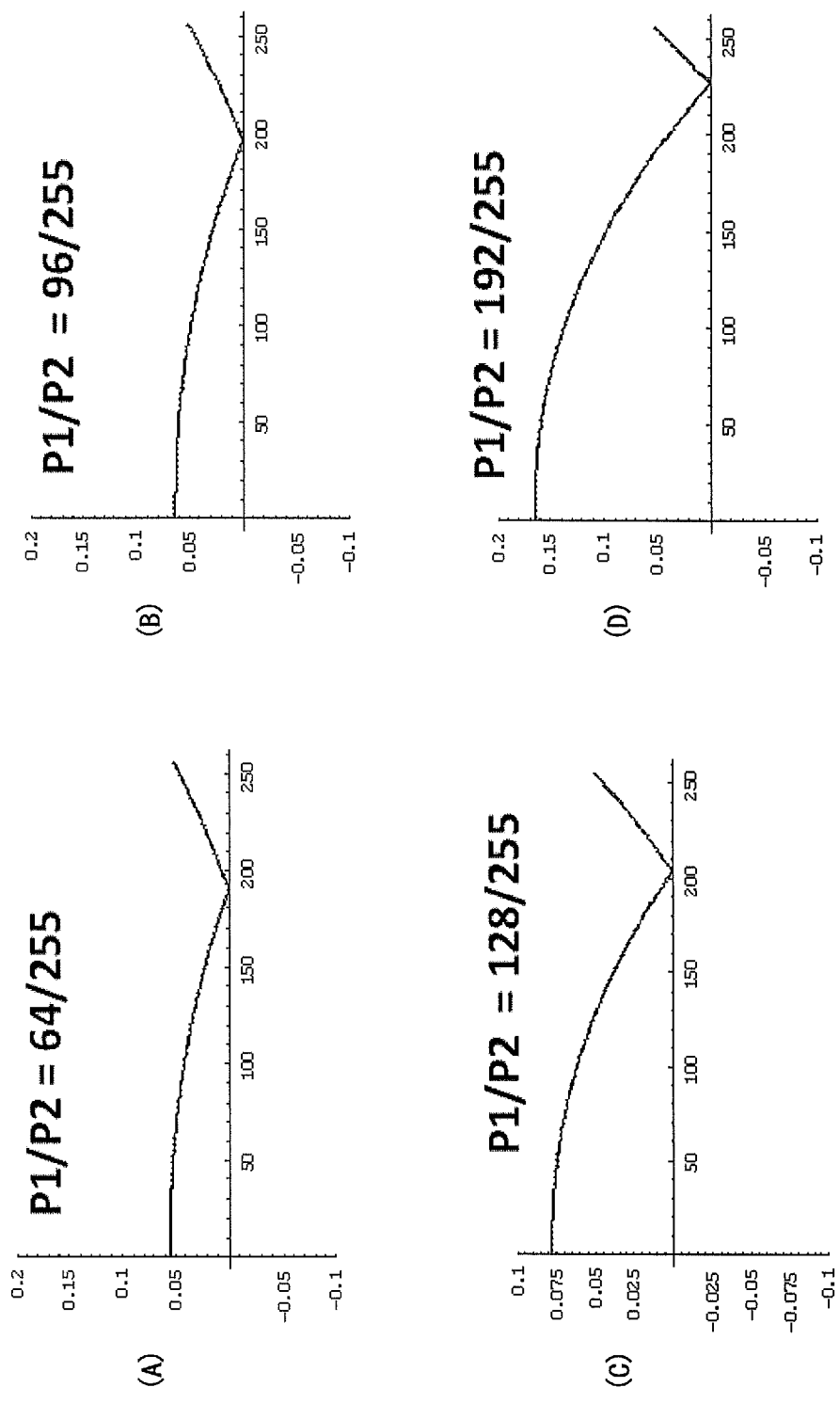
FIGS. 22(A) to 22(D) are diagrams showing measurement error simulation results, in which (A) is a diagram showing a simulation result in a case where the first gradation P1 is 64 and the second gradation P2 is 255, (B) is a diagram showing a simulation result in a case where the first gradation P1 is 96 and the second gradation P2 is 255, (C) is a diagram showing a simulation result in a case where the first gradation P1 is 128 and the second gradation P2 is 255, and (D) is a diagram showing a simulation result in a case where the first gradation P1 is 192 and the second gradation P2 is 255.
Figure 23:
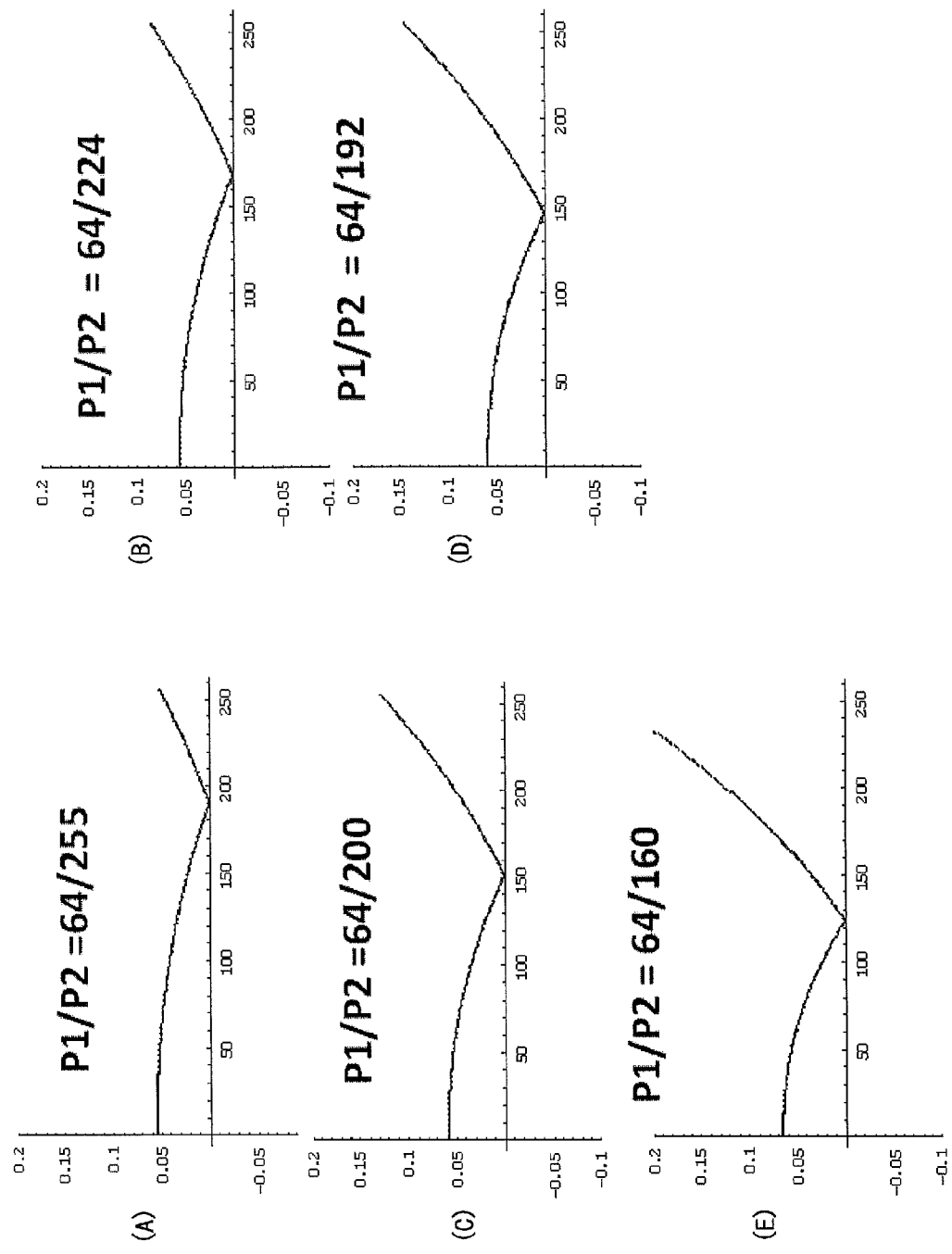
FIGS. 23(A) to 23(E) are diagrams showing measurement error simulation results, in which (A) is a diagram showing a simulation result in a case where the first gradation P1 is 64 and the second gradation P2 is 255, (B) is a diagram showing a simulation result in a case where the first gradation P1 is 64 and the second gradation P2 is 224, (C) is a diagram showing a simulation result in a case where the first gradation P1 is 64 and the second gradation P2 is 200, (D) is a diagram showing a simulation result in a case where the first gradation P1 is 64 and the second gradation P2 is 192, and (E) is a diagram showing a simulation result in a case where the first gradation P1 is 64 and the second gradation P2 is 160.

The second LUT 15 receives the first and second gradations P1, P2, and converts these to the ideal characteristic data IO(P) indicating ideal display characteristics corresponding to the respective first and second gradations P1, P2 (more specifically, ideal values of the gradation to the drive current) and outputs the ideal characteristic data IO(P). Here, the ideal characteristic data IO(P) is given by the next expression (12), and shown in FIG. 20.

$$IO(P)=Iw*P^{2.2} \quad (12)$$

The CPU 16 receives first and second measurement data Im(i,j,P1), Im(i,j,P2) from the data driver 600 via the second unidirectional communication bus at predetermined timing. In the case of receiving the first measurement data Im(i,j,P1), the CPU 16 receives the ideal characteristic data IO(P1) corresponding to the first gradation P1 from the second LUT 15. The CPU 16 then compares the ideal characteristic data IO(P1) and the first measurement data Im(i,j,P1), and updates the threshold voltage correction data Vt(i,j) based on the comparison result.

Specifically, the CPU 16 makes the threshold voltage correction data Vt(i,j) be "Vt(i,j)+ΔV" in the case of the first measurement data Im(i,j,P1) satisfying the next expression (13), makes the threshold voltage correction data Vt(i,j) be "Vt(i,j)−V" in the case of the first measurement data Im(i,j,P1) satisfying the next expression (14), and allows the threshold voltage correction data Vt(i,j) to remain "Vt(i,j)" in the case of the first measurement data Im(i,j,P1) satisfying the next expression (15), thereby to update the threshold voltage correction data Vt(i,j). Here, ΔV represents a previously set fixed value for changing a value of the threshold voltage correction data Vt(i,j), and more specifically represents the minimum value by which the threshold voltage correction data Vt(i,j) can be changed. That is, the threshold voltage correction data Vt(i,j) is updated by the minimum amount.

$$IO(P1)-Im(i,j,P1)>0 \quad (13)$$

$$IO(P1)-Im(i,j,P1)<0 \quad (14)$$

$$IO(P1)-Im(i,j,P1)=0 \quad (15)$$

In the case of receiving the second measurement data Im(i,j,P2), the CPU 16 receives the ideal characteristic data IO(P2) corresponding to the second gradation P2 from the second LUT 15. The CPU 16 then compares the ideal characteristic data IO(P2) and the second measurement data Im(i,j,P2), and updates the gain correction data B2R(i,j) based on the comparison result.

Specifically, the CPU 16 makes the gain correction data B2R(i,j) be "B2R(i,j)+ΔB" in the case of the second measurement data Im(i,j,P2) satisfying the next expression (16), makes the gain correction data B2R(i,j) be "B2R(i,j)−ΔB" in the case of the second measurement data Im(i,j,P2) satisfying the next expression (17), and makes the gain correction data B2R(i,j) remain to be "B2R(i,j)" in the case of the second measurement data Im(i,j,P2) satisfying the next expression (18), thereby to update the gain correction data B2R(i,j). Here, ΔB represents a previously set fixed value for changing a value of the gain correction data B2R(i,j), and more specifically represents the minimum value by which the gain correction data B2R(i,j) can be changed. That is, the gain correction data B2R(i,j) is updated by the minimum amount.

$$IO(P2)-Im(i,j,P2)>0 \quad (16)$$

$$IO(P2)-Im(i,j,P2)<0 \quad (17)$$

$$IO(P2)-Im(i,j,P2)=0 \quad (16)$$

In such a manner as above, with respect to each pixel circuit 51, the threshold voltage correction data Vt(i,j) and the gain correction data B2R(i,j) are updated every time the first and second measurement data Im(i,j,P1), Im(i,j,P2) are received, respectively, and the video data Vm(i,j,P) based on the threshold voltage correction data Vt(i,j) and the gain correction data B2R(i,j) is generated. In other words, the video data Vm(i,j,P) is corrected based on the first and second measurement data Im(i,j,P1), Im(i,j,P2) or based on the threshold voltage correction data Vt(i,j) and the gain correction data B2R(i,j).

Here, the reason for the use of the first measurement data Im(i,j,P1) as a determination standard for updating the threshold voltage correction data Vt(i,j) is as follows. When the transistor T1 is driven in accordance with the first measuring data voltage Vm(i,j,P1), the gate-source voltage Vgs of the transistor T1 is relatively small. For this reason, a discrepancy of threshold voltage Vt with respect to the gate-source voltage Vgs is greatly reflected to the first drive current Im(i,j,P1). Therefore, the first measurement data Im(i,j,P1) is suitable as the determination standard for updating the threshold voltage correction data Vt(i,j).

Meanwhile, the reason for the use of the second measurement data Im(i,j,P2) as a determination standard for updating the gain correction data B2R(i,j) is as follows. When the transistor T1 is driven in accordance with the second measuring data voltage Vm(i,j,P2), the gate-source voltage Vgs of the transistor T1 is relatively large. For this reason, a discrepancy of threshold voltage Vt with respect to the gate-source voltage Vgs is hardly reflected to the second drive current Im(i,j,P2), whereas a discrepancy of the gain β is relatively greatly reflected to the second drive current Im(i,j,P2). Therefore, the second measurement data Im(i,j,P2) is suitable as the determination standard for updating the gain correction data B2R(i,j).

1.10 First Gradation and Second Gradation

Specific settings of the first and second gradations P1, P2 will be considered. As described above, the ideal characteristic data IO(P) is given by the above expression (12). It is assumed for the sake of convenience here that Iw is 1 and the ideal characteristic data IO(P) is given by the next expression (19).

$$IO(P)=P^{2.2} \tag{19}$$

Further, an error function Ie(P) representing a measurement error is defined by the next expression (20).

$$Ie(P) = IO(P) - (\alpha 1 * P^{2.2} + \alpha 2) \tag{20}$$
$$= P^{2.2} - (\alpha 1 * P^{2.2} + \alpha 2)$$

Here, when measurement errors in the cases of the first and second gradations P1, P2 are represented by n1 and n2, n1 and n2 are given by the next expressions (21), (22), respectively.

$$n1=Ie(P1)=P1^{2.2}-(\alpha 1*P1^{2.2}+\alpha 2) \tag{21}$$

$$n2=Ie(P2)=P2^{2.2}-(\alpha 1*P2^{2.2}+\alpha 2) \tag{22}$$

By the expressions (21), (22), α1 and α2 are given by the next expressions (23), (24), respectively.

$$\alpha 1=1-(n2-n1)/(P2^{2.2}-P1^{2.2}) \tag{23}$$

$$\alpha 2=(n2*P1^{2.2}-n1*P2^{2.2})/(P2^{2.2}-P1^{2.2})) \tag{24}$$

When the expressions (23) and (24) are substituted for the above expression (20), the error function Ie(P) is given by the next expression (25).

$$Ie(P)=[(n2-n1)*P^{2.2}+n1*P2^{2.2}-n2*P1^{2.2}]/(P2^{2.2}-P1^{2.2}) \tag{25}$$

FIG. 21(A) to FIG. 21(F), FIG. 22(A) to FIG. 22(D) and FIG. 23(A) to FIG. 23(E) show simulation results of the measurement error (error function Ie(P) given by the expression (25)) in the case of n1=0.05 and n2=−0.05. In each figure, a vertical axis and a horizontal axis represent |Ie(P)| and the gradation P, respectively. In addition, it is assumed here that the maximum gradation is 255. FIG. 21(A) to FIG. 21(F) are a diagram showing a simulation result in the case of the first gradation P1 being 0 and the second gradation P2 being 255, a diagram showing a simulation result in the case of the first gradation P1 being 2 and the second gradation P2 being 255, a diagram showing a simulation result in the case of the first gradation P1 being 4 and the second gradation P2 being 255, a diagram showing a simulation result in the case of the first gradation P1 being 10 and the second gradation P2 being 255, a diagram showing a simulation result in the case of the first gradation P1 being 20 and the second gradation P2 being 255, and a diagram showing a simulation result in the case of the first gradation P1 being 40 and the second gradation P2 being 255, respectively. FIG. 22(A) to FIG. 22(D) are a diagram showing a simulation result in the case of the first gradation P1 being 64 and the second gradation P2 being 255, a diagram showing a simulation result in the case of the first gradation P1 being 96 and the second gradation P2 being 255, a diagram showing a simulation result in the case of the first gradation P1 being 128 and the second gradation P2 being 255, and a diagram showing a simulation result in the case of the first gradation P1 being 192 and the second gradation P2 being 255, respectively. FIG. 23(A) to FIG. 23(E) are a diagram showing a simulation result in the case of the first gradation P1 being 64 and the second gradation P2 being 255, a diagram showing a simulation result in the case of the first gradation P1 being 64 and the second gradation P2 being 224, a diagram showing a simulation result in the case of the first gradation P1 being 64 and the second gradation P2 being 200, a diagram showing a simulation result in the case of the first gradation P1 being 64 and the second gradation P2 being 192, and a diagram showing a simulation result in the case of the first gradation P1 being 64 and the second gradation P2 being 160, respectively.

It is found from FIG. 21(A) to FIG. 21(F), FIG. 22(A) to FIG. 22(D) and FIG. 23(A) to FIG. 23(E) that the measurement error increases when the first gradation P1 is larger than 64 and the measurement error increases when the second gradation P2 is smaller than 200. Accordingly, when the maximum gradation is 255, the first and second gradations P1, P2 are desirably set to 0 to 64 and 200 to 255, respectively. However, the present invention does not exclude settings of the first and second gradations P1, P2 to those other than 0 to 64 and other than 200 to 255, respectively, and the first gradation P1 may only be a relatively low gradation while the second gradation P2 may only be a relatively high gradation.

1.11 Data Update

Figure 24:
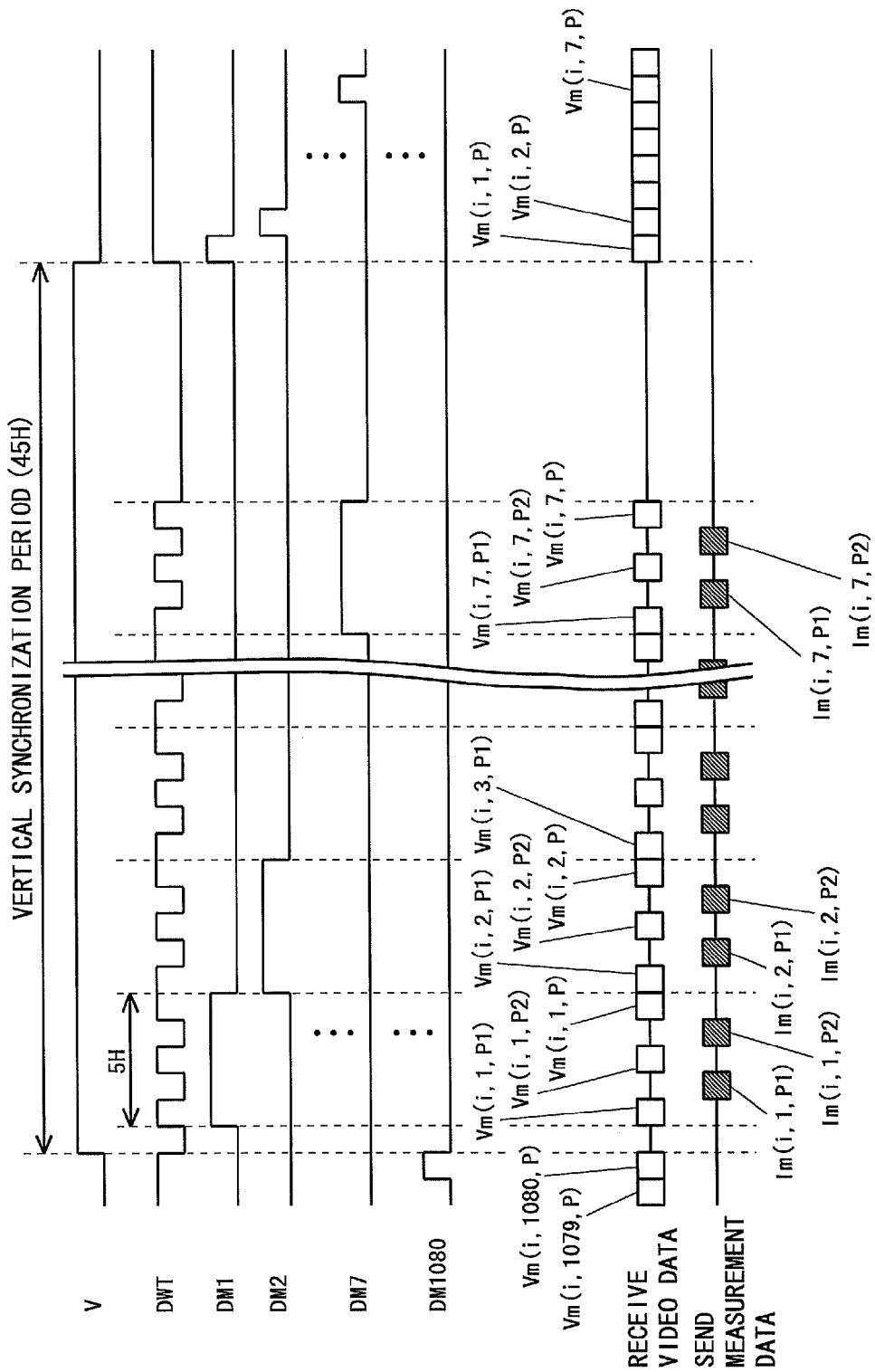
FIG. 24 is a timing chart for explaining timing for receiving video data and sending measurement data in the vertical synchronization period of an N-th frame period in the above first embodiment.

FIG. 24 is a timing chart for explaining timing for receiving video data and sending measurement data in the vertical synchronization period of an N-th frame period (N is a natural number) in the present embodiment. In the vertical synchronization period of the N-th frame period, the drive current Im is measured with respect to each of the pixel circuits 51 corresponding to the scanning lines DM1 to DMp. Here, assuming p=7, and a 1H-period margin and a 9H-period margin are provided on the start side and the end side of the vertical synchronization period (45H periods), respectively. It should be noted that such margins are not necessarily provided. For example, the margin may not be provided and p=9 may be used as above described. Further, V in FIG. 24 denotes a period type signal indicating whether the period is the video signal period or the vertical synchronization period. The period type signal V is on the "0" level in the video signal period, and is on the "1" level in the vertical synchronization period.

After the period type signal V is switched to the "1" level, the vertical synchronization period starts, and after the 1H-period margin, the scanning line DM1 on the first row is selected for 5H periods. In these 5H periods, as described above, the first measuring gradation program period A1, the first current measurement period A2, the second measuring gradation program period A1, the second current measurement period A2 and the desired gradation program period A3 concerning the pixel circuit 51 on the first row are sequentially switched every 1H period. Hereinafter, the expression "concerning the pixel circuit 51 on the j-th row" or "of the pixel circuit 51 on the j-th row" will be abbreviated to "on the j-th row" as appropriate. In the selection period for each scanning line DM during the vertical synchronization period, the level of the input/output control signal DWT is switched in sequence of the "1" level, the "0" level, the "1" level, the "0" level, and the "1" level every 1H period. It is to be noted that in descriptions with reference to FIG. 24 and later-mentioned FIGS. 25, 40, 41, 44 and 45, it is assumed that attention is focused on the pixel circuit 51 on the i-th column for the sake of convenience.

In the first measuring gradation program period A1 for the first row, first measuring video data Vm(i,1,P1) is sent from the controller 10 to the data driver 600 via the first unidirectional communication bus, and a first measuring data voltage Vm(i,1,P1) is written.

In the first current measurement period A2 for the first row, first measurement data Im(i,1,P1) is acquired, and the first measurement data Im(i,1,P1) is sent from the data driver 600 to the controller 10 via the second unidirectional communication bus. Then in the controller 10, the threshold voltage correction data Vt(i,1) is updated based on the received first measurement data Im(i,1,P1).

In the second measuring gradation program period A1 for the first row, second measuring video data Vm(i,1,P2) is sent from the controller 10 to the data driver 600 via the first unidirectional communication bus, and a second measuring data voltage Vm(i,1,P2) is written. Here, the threshold voltage correction data Vt(i,1) after updated has been reflected to the second measuring video data Vm(i,1,P2).

In the second current measurement period A2 for the first row, second measurement data Im(i,1,P2) is acquired, and the second measurement data Im(i,1,P2) is sent from the data driver 600 to the controller 10 via the second unidirectional communication bus. Then in the controller 10, the gain correction data B2R(i,1) is updated based on the received second measurement data Im(i,1,P2).

In the desired gradation program period A3 for the first row, video data Vm(i,1,P) is sent from the controller to the data driver 600 via the first unidirectional communication bus, and a data voltage Vm(i,1,P) is written. Here, the threshold voltage correction data Vt(i,1) after updated and the gain correction data B2R(i,1) after updated have been reflected to the video data Vm(i,1,P).

Subsequently, the selection period for the first row is completed, and the scanning lines DM2 to DM7 on the second to seventh rows are sequentially selected, whereby an operation similar to that on the first row is performed on each of the second to seventh rows. After completion of the selection period for the seventh row and after a lapse of the 9H-period margin, the period type signal V is switched to the "0" level, and the vertical synchronization period is completed.

Subsequently, the video signal period of the (N+1)-th frame period is started, and data voltages, to which the update result in the vertical synchronization period of the N-th frame period has been reflected, are written for the first to seventh rows, while data voltages, to which the update result in the vertical synchronization periods of the (N−1)-th or earlier frame periods has been reflected, are written for the eighth to 1080th rows. It is to be noted that in the present embodiment, as for the first to seventh rows, the latest update result has already been reflected to the data voltage in the vertical synchronization period of the N-th frame period.

Figure 25:
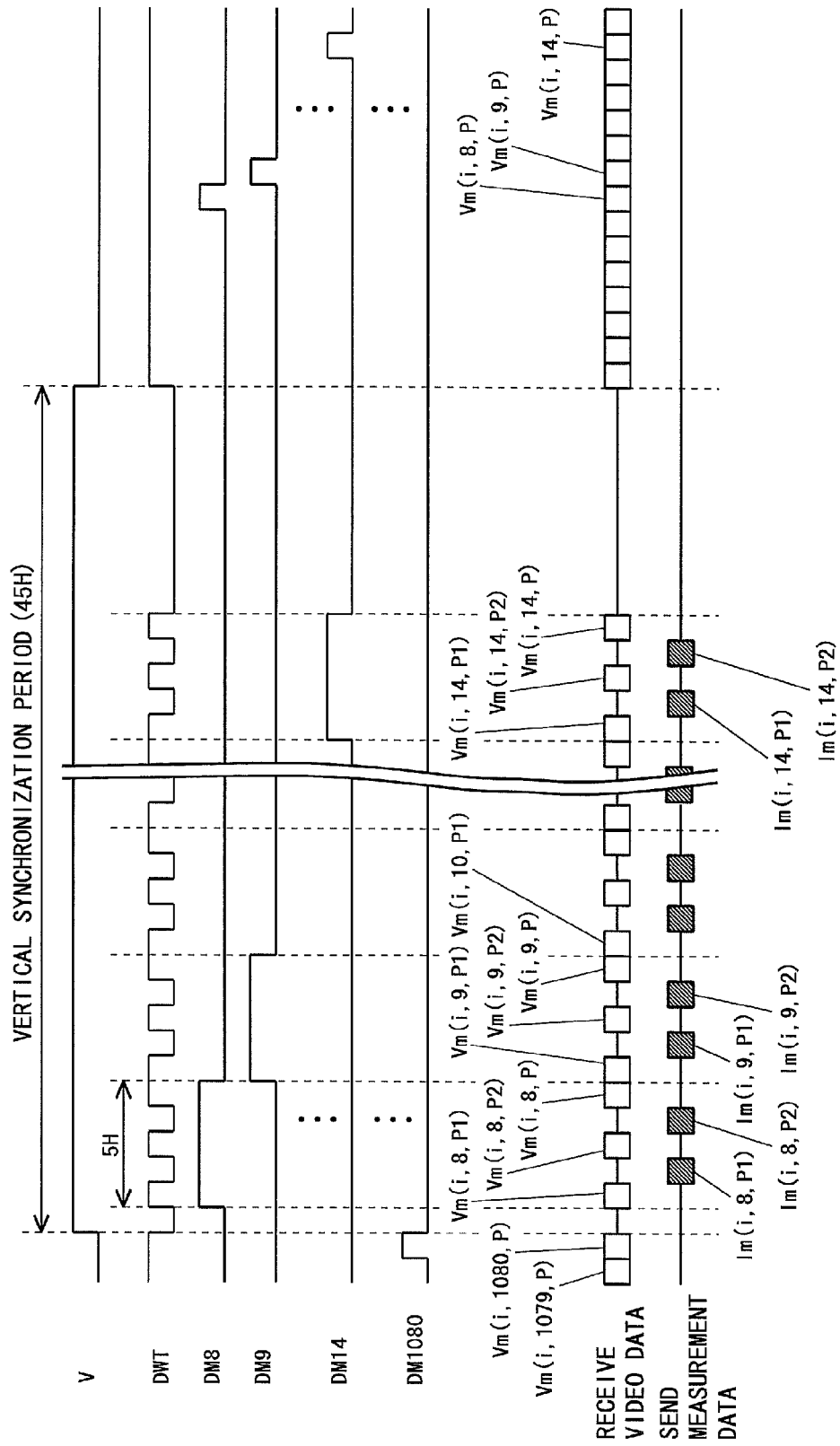
FIG. 25 is a timing chart for explaining timing for receiving video data and sending measurement data in the vertical synchronization period of an (N+1)-th frame period in the above first embodiment.

FIG. 25 is a timing chart for explaining timing for receiving video data and sending measurement data in the vertical synchronization period of the (N+1)-th frame period in the present embodiment. In the vertical synchronization period of the (N+1)-th frame period, as shown in FIG. 25, an operation similar to that for the first to seventh rows is performed for the eighth to fourteenth rows. In the video signal period of the (N+2)-th frame period, data voltages, to which the update result in the vertical synchronization period of the (N+1)-th frame period has been reflected, are written for the eighth to fourteenth rows, while data voltages, to which the update result in the vertical synchronizations period of the N-th or earlier frame periods has been reflected, are written for the first to seventh rows and the fifteenth to 1080th rows.

As described above, in the present embodiment, 5H periods are allocated for one row, and the threshold voltage correction data Vt(i,j) and the gain correction data B2R(i,j) are updated. Further, by simultaneously acquiring each measurement data and sending the same, the update result is reflected to video data (data voltage) in real time. In addition, even when a bidirectional communication bus is used in place of the first and second unidirectional communication buses, it is possible to update the threshold voltage correction data Vt(i,j) and the gain correction data B2R(i,j) in a procedure similar to that in the present embodiment. When the first and second unidirectional communication buses are used as in the present embodiment, it is also possible to send the first measuring video data Vm(i,j,P1) and the second measuring video data Vm(i,j,P2) from the controller 10 to the data driver 600 in the first current measurement period A2 and the second current measurement period A2, respectively. In this case, the foregoing D latch 680 may not be used.

1.12 Scanning Drive Portion

Figure 26:
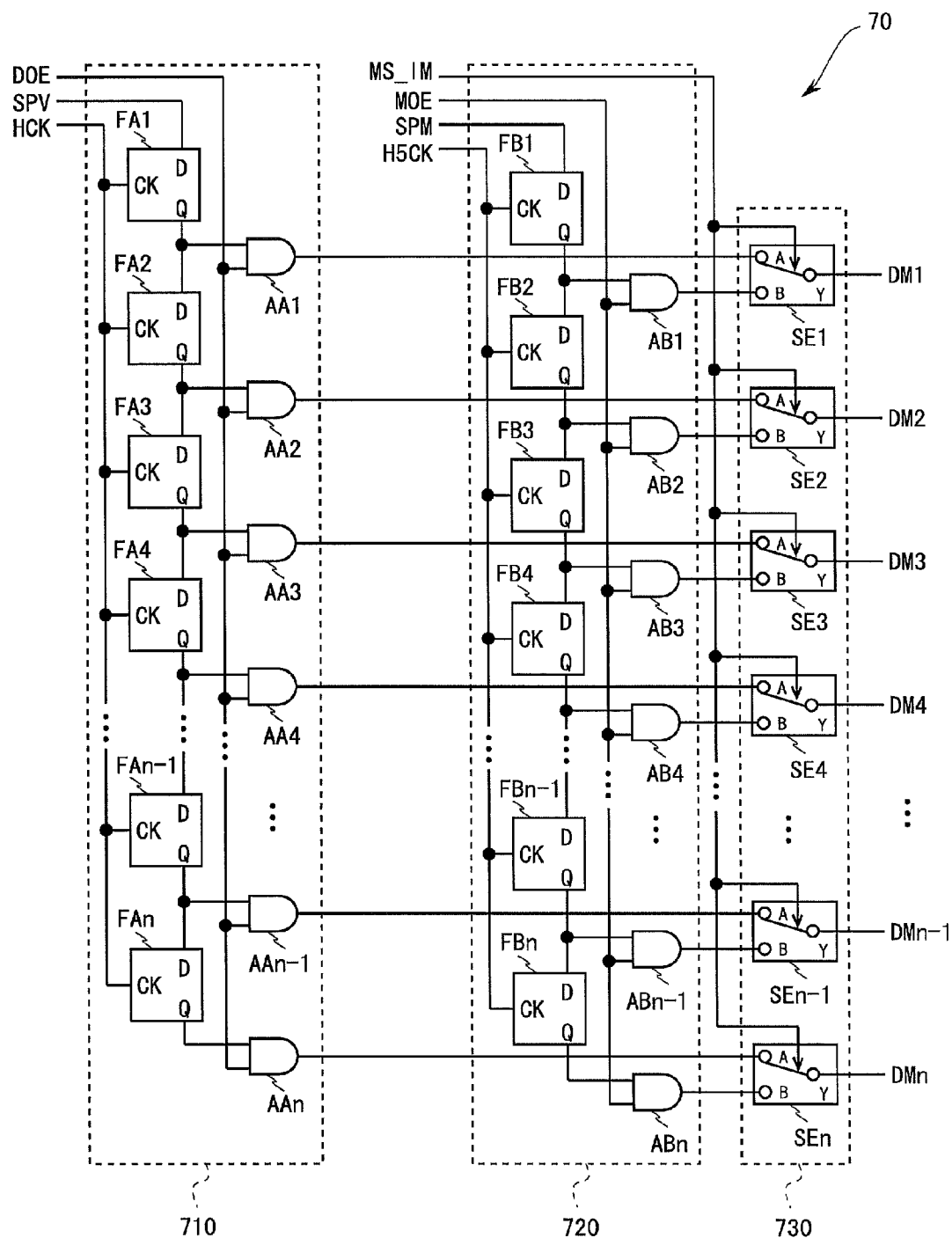
FIG. 26 is a circuit diagram showing a detailed configuration of a scanning drive portion shown in FIG. 1.

FIG. 26 is a circuit diagram showing a detailed configuration of the scanning drive portion 70 shown in FIG. 1. The scanning drive portion 70 is provided with a first shift register 710, a second shift register 720, and a selector group 730. The first shift register 710 is a shift register for driving the n scanning lines DM1 to DMn in the video signal period. The second shift register 720 is a shift register for driving the n scanning lines DM1 to DMn in the vertical synchronization period. The selector group 730 gives an output of each stage of the first shift register 710 to the corresponding scanning line in the video signal period, and gives an output of each stage of the second shift register 720 to the corresponding scanning line in the vertical synchronization period.

The first shift register 710 is provided with n first flip flops FA1 to FAn (on n stages) and n first AND circuits AA1 to AAn (on n stages). The constitutional elements on the n stages of the first shift register 710 correspond to the n scanning lines DM1 to DMn, respectively. Hereinafter, when it is not particularly necessary to distinguish the first flip flops FA1 to FAn on the n stages, these are simply denoted by a symbol FA, and when it is not particularly necessary to distinguish the first AND circuits AA1 to AAn on the n stages, these are simply denoted by a symbol AA. The first shift register 710 receives from the controller 10 a first enable signal DOE, a first start pulse SPV and a first clock HCK as a variety of control signals.

The first flip flop FA is provided with a D input terminal, a CK input terminal and a Q output terminal. An output from the Q output terminal (hereinafter referred to as "Q output") of the first flip flop FA on a previous stage is inputted into the D input terminal of the first flip flop FA on each stage. However, the first start pulse SPV is inputted into the D input terminal of the first flip flop FA1 on the first stage. The first clock HCK is inputted into the CK input terminal of the first flip flop FA on each stage. The Q output of the first flip flop FA on the same stage is inputted into a first input terminal of the first AND circuit AA on each stage, and the first enable signal DOE is inputted into a second input terminal.

The second shift register 720 is provided with n second flip flops FB1 to FBn (on n stages) and n second AND circuits AB1 to ABn (on n stages). The constitutional elements on the n stages of the second shift register 720 correspond to the n scanning lines DM1 to DMn, respectively. Hereinafter, when it is not particularly necessary to distinguish the second flip flops FB1 to FBn on the n stages, these are simply denoted by a symbol FB, and when it is not particularly necessary to distinguish the second AND circuits AB1 to ABn on the n stages, these are simply denoted by a symbol AB. The second shift register 720 receives from the controller 10 a second enable signal MOE, a second start pulse SPM and a second clock H5CK as a variety of control signals.

The second flip flop FB is provided with a D input terminal, a CK input terminal and a Q output terminal. The Q output of the second flip flop FB on a previous stage is inputted into the D input terminal of the second flip flop FB on each stage.

However, the second start pulse SPM is inputted into the D input terminal of the second flip flop FB1 on the first stage. The second clock H5CK is inputted into the CK input terminal of the second flip flop FB on each stage. The Q output of the second flip flop on the same stage is inputted into a first input terminal of the second AND circuit AB on each stage, and the second enable signal MOE is inputted into a second input terminal.

The selector group 730 is provided with n selectors SE1 to SEn (on n stages). The selectors SE1 to SEn on the n stages correspond to the n scanning lines DM1 to DMn, respectively. Hereinafter, when it is not particularly necessary to distinguish the selectors SE1 to SEn on the n stages, these are simply denoted by a symbol SE. The selector group 730 receives from the controller 10 a selector control signal MS_IM as a variety of control signals.

The selector SE is provided with an A input terminal, a B input terminal and a Y output terminal. Out of inputs into the A input terminal and the B input terminal, the selector SE selects which input is to be made an output from the Y output terminal (hereinafter referred to as "Y output") in accordance with the selector control signal MS_IM. Specifically, the selector SE takes the input into the A input terminal as the Y output when the selector control signal MS_IM is on the "0" level, and the selector SE takes the input into the B input terminal as the Y output when the selector control signal MS_IM is on the "1" level. On each stage, the output of the first AND circuit AA on the same stage is inputted into the A input terminal of the selector SE, and the output of the second AND circuit AB on the same stage is inputted into the B input terminal. The Y output of the selector SE on each stage is inputted into the scanning line DM on the same stage.

As described above, the scanning drive portion 70 in the present embodiment is provided with two gate drivers 700. For example, out of the constitutional elements of the scanning drive portion 70 shown in FIG. 26, the constitutional elements on odd-number stages correspond to one gate driver 700, and the constitutional elements on even-number stages correspond to the other gate driver 700. Further, in the two gate drivers 700, when a time constant of the scanning line is poor with respect to a 1H period as in the case of the display portion 50 having high definition or in the case of performing driving at a double-speed or quadruple-speed frame frequency, the two gate drivers 700 are driven by means of the same drive signals from the right and left of the display portion 50, whereby the poor time constant of the scanning line can be compensated.

Figure 27:
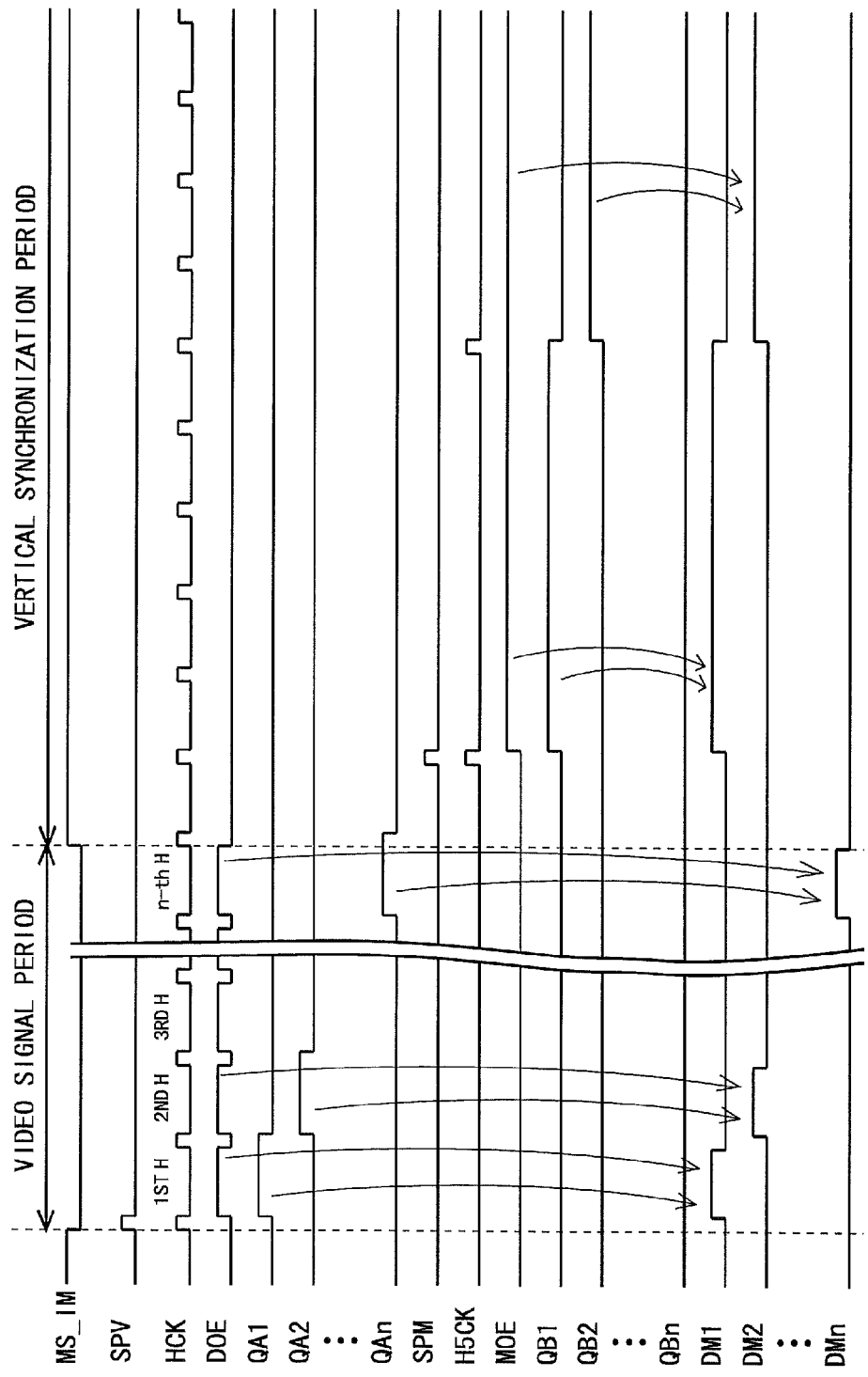
FIG. 27 is a timing chart for explaining an operation of the scanning drive portion shown in FIG. 26 in the N-th frame period.

FIG. 27 is a timing chart for explaining an operation of the scanning drive portion 70 shown in FIG. 26 in the N-th frame period. In FIG. 27, QA1 to QAn denote the Q outputs of the first flip flops FA1 to FAn, and QB1 to QBn denote the Q outputs of the second flip flops FB1 to FBn, respectively. The first clock HCK generates a pulse on the "1" level with the 1H period taken as a cycle in the video signal period. The second clock H5CK generates seven pulses on the "1" level with the 5H periods taken as a cycle in the vertical synchronization period. In FIG. 27, it is assumed that the first clock HCK generates the pulse on the "1" level with the 1H period taken as the cycle also in the vertical synchronization period, but the first clock HCK may be constantly on the "0" level in the vertical synchronization period. The second clock H5CK is constantly on the "0" level in the video signal period. The first enable signal DOE is on inverse levels of the first clock HCK in the video signal period, and is constantly on the "0" level in the vertical synchronization period. In the video signal period, the second enable signal MOE is constantly on the "0" level, and in the vertical synchronization period, it changes to the "1" level simultaneously with falling of a first pulse of the second clock H5CK, and changes to the "0" level 5H periods after falling of a seventh pulse.

At the start of the video signal period of the N-th frame period, simultaneously with the selector control signal MS_IM changing to the "0" level, the first start pulse SPV on the "1" level is given to the D input terminal of the first flip flop FA1 on the first stage. After the input of the first start pulse SPV on the "1" level, the Q output on the "1" level is shifted in synchronization with the first clock HCK. In the video signal period, with the selector control signal MS_IM being on the "0" level, a result of AND computing of the Q output of the first flip flop FA on each stage and the first enable signal DOE is given to the scanning line DM on the corresponding row via the selector SE. In such a manner, the scanning lines DM1 to DMn on the first to nth rows are sequentially selected in the video signal period. It is to be noted that the operations in the video signal periods are similar in respective frame periods.

At the start of the vertical synchronization period of the N-th frame period, the selector control signal MS_IM changes to the "1" level. Subsequently, a 1H-period margin is provided, and the Q output based on the second start pulse SPM on the "1" level shifts in synchronization with the second clock H5CK. It is to be noted that the period of the margin is not particularly restricted. In the vertical synchronization period of the 45H periods, the Q outputs of the second flip flops FB1 to FB7 on the first to seventh stages sequentially change to the "1" level. In the vertical synchronization period, with the selector control signal MS_IM being on the "1" level, a result of AND computing of the Q output of the second flip flop FB on each stage and the second enable signal MOE is given to the scanning line DM on the corresponding row via the selector SE. In such a manner, each of the scanning lines DM1 to DM7 on the first to seventh rows is sequentially selected every 5H periods in the vertical synchronization period of the N-th frame period. After generating a seventh pulse, the second clock H5CK is fixed to the "0" level, and hence the shift operation of the second shift register 720 is stopped. For this reason, the Q output of the second flip flop FB7 on the seventh stage is held on the "1" level. It is to be noted that, after the stoppage of the shift operation of the second shift register 720, the second enable signal MOE changes to the "0" level as described above, and hence the scanning line DM7 on the seventh row changes from the selected state to the non-selected state.

Figure 28:
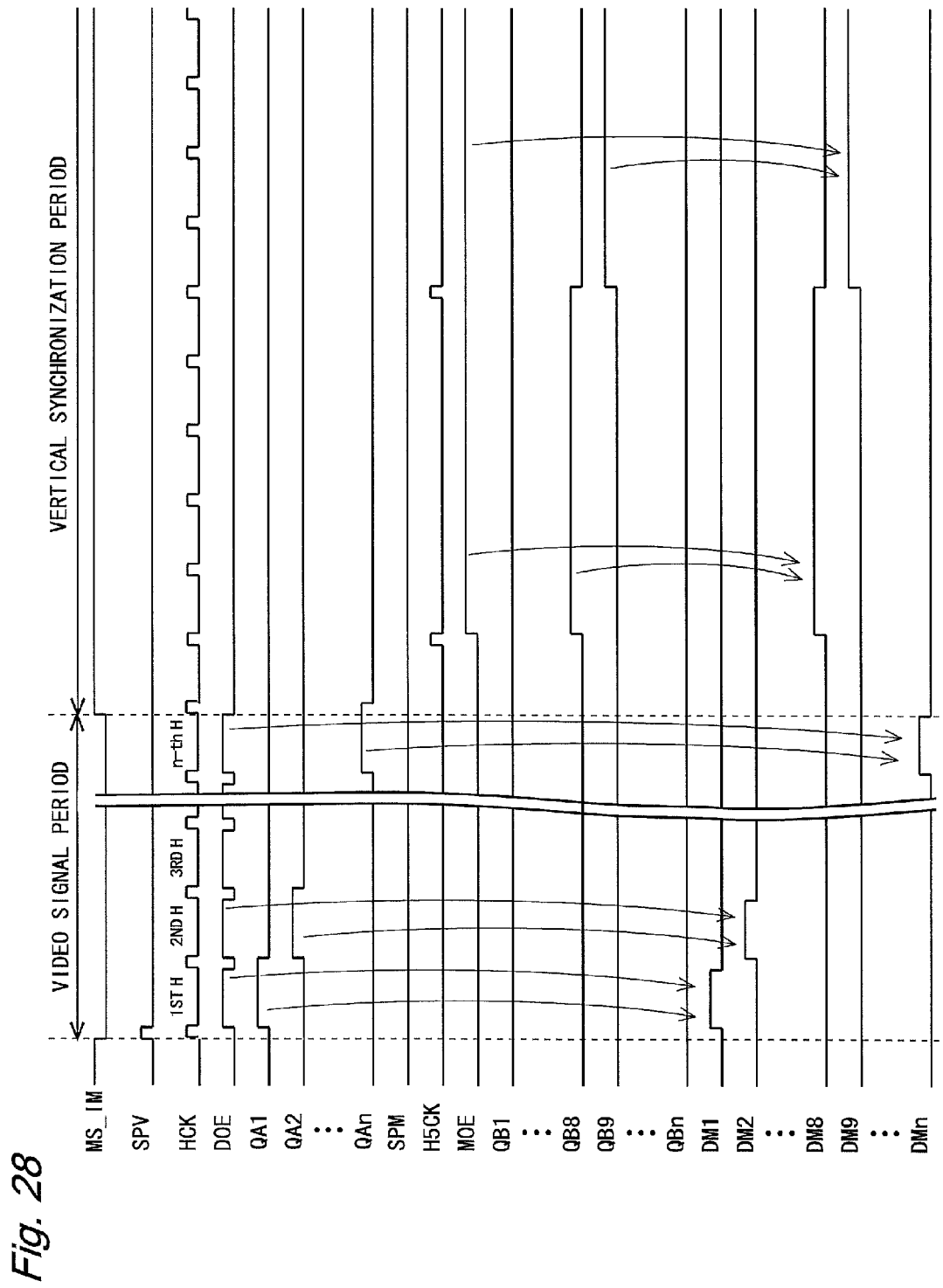
FIG. 28 is a timing chart for explaining an operation of the scanning drive portion shown in FIG. 26 in the (N+1)-th frame period.

FIG. 28 is a timing chart for explaining an operation of the scanning drive portion 70 shown in FIG. 26 in the (N+1)-th frame period. Since the operation in the video signal period of the (N+1)-th frame period is similar to that in the N-th frame period, its description will be omitted. At the start of the vertical synchronization period of the (N+1)-th frame period, the selector control signal MS_IM changes to the "1" level. Subsequently, a 1H-period margin is provided, and the second clock H5CK generates a pulse on the "1" level. For this reason, the shift operation of the second shift register 720 is resumed, and by an operation similar to that in the N-th frame period, the Q outputs of the second flip flops FB8 to FB14 on the eighth to fourteenth stages sequentially change to the "1" level. It is to be noted that the second start pulse SPM is constantly on the "0" level in the (N+1)-th frame period. In the vertical synchronization period, with the selector control signal MS_IM on the "1" level, a result of AND computing of the Q output of the second flip flop FB on each stage and the second enable signal MOE is given to the scanning line DM on the corresponding row via the selector SE. In such a manner, each of the scanning lines DM8 to DM14 on the eighth to fourteenth rows is sequentially selected every 5H periods in the vertical synchronization period of the (N+1)-th frame period. After generating a seventh pulse, the second clock H5CK is fixed to the "0" level, and hence the shift operation of the second shift register 720 is stopped. For this reason, the Q output of the second flip flop FB14 on the fourteenth stage is held on the "1" level. It is to be noted that, after the stoppage of the shift operation of the second shift register 720, the second enable signal MOE goes to the "0" level as described above, and hence the scanning line DM14 on the fourteenth row changes from the selected state to the non-selected state. By repeating such an operation as being similar to that in the (N+1)-th frame period in the (N+2)-th frame period, the (N+3)-th frame period, . . . , it is possible to select all the scanning lines DM in the vertical synchronization period. Thereafter, a similar operation is performed in the N-th frame period, the (N+1)-th frame period, the (N+2)-th frame period, . . . .

In the examples shown in FIGS. 27 and 28, seven scanning lines DM can be selected in the vertical synchronization period of each frame period, and 155 frame periods are required for performing current measurement for the 1080 rows. In this case, the second start pulse SPM on the "1" level is given to the second flip flop FB1 on the first stage only once in the 155 frame periods.

1.13 Comparison with Conventional Examples

Next, a description will be given comparing the present embodiment and the conventional examples. Here, the conventional examples cited as targets to be compared are the organic EL display device described in Patent Document 4 (hereinafter referred to as "first conventional example"), and the organic EL display device described in Patent Document 8 (hereinafter referred to as "second conventional example").

1.13.1 Comparison with First Conventional Example

Figure 29:
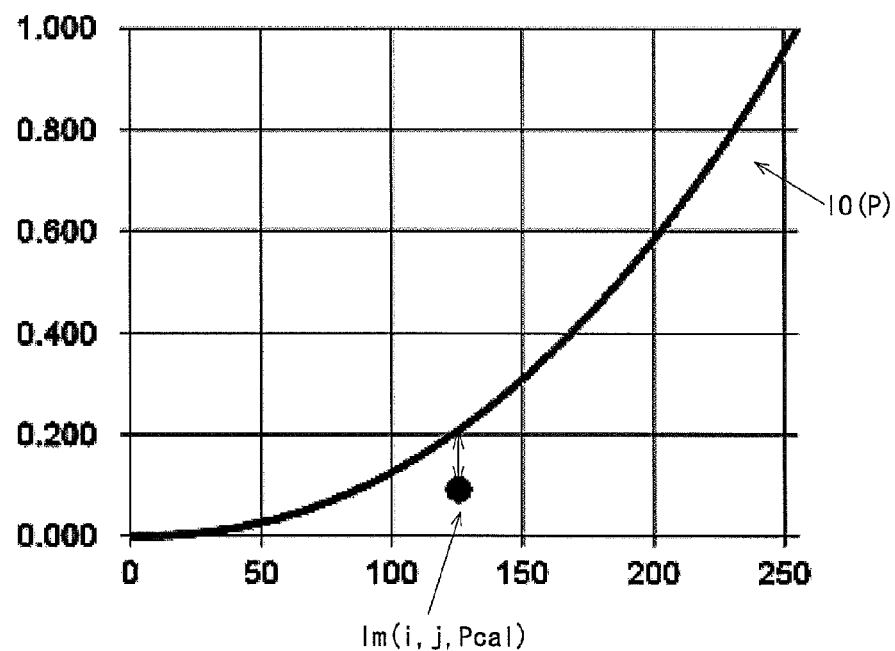
FIG. 29 is a diagram for explaining correction by use of ideal characteristic data in a first conventional example.

FIG. 29 is a diagram for explaining correction by use of the ideal characteristic data IO(P) in the first conventional example. Here, the "target current" in the first conventional example is called an "ideal characteristic" for the sake of convenience of description. In the first conventional example, ideal characteristic data IO(Pcal) with the gradation Pcal and measurement data Im(i,j,Pcal) of a certain pixel circuit are compared, and based on the comparison result, an update similar to the update of the threshold voltage correction data Vt(i,j) in the present embodiment is performed. The compensation operation in this case is performed only in an offset direction with respect to the ideal characteristic data IO(P). For this reason, only the threshold voltage compensation is performed and the gain compensation is not performed.

In comparison, in the present embodiment, as described above, the ideal characteristic data IO(P) and the first and second measurement data Im(i,j,P1), Im(i,j,P2) are compared, and both the threshold voltage correction data Vt(i,j) and the gain correction data B2R(i,j) are updated, whereby both the threshold voltage compensation and the gain compensation can be performed.

1.13.2 Comparison with Second Conventional Example

Figure 30:
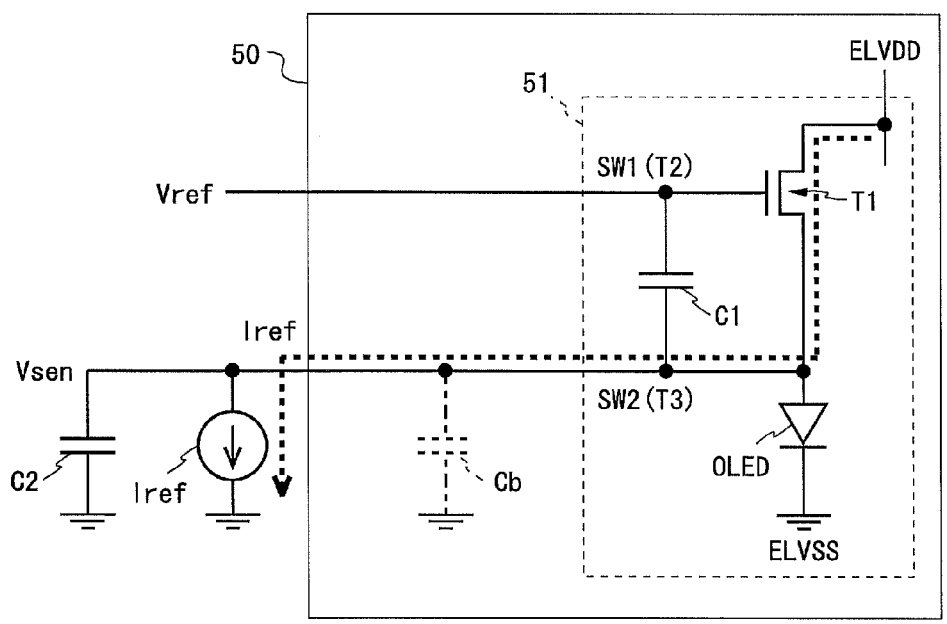
FIG. 30 is a circuit diagram for explaining a charging operation in a second conventional example.

FIG. 30 is a circuit diagram for explaining a charging operation in the second conventional example. It is assumed that the pixel circuit in the second conventional example has a configuration basically similar to that of the pixel circuit 51 in the present embodiment, and the same elements as those in the present embodiment are provided with the same reference numerals to omit descriptions thereof. SW1, SW2 in FIG. 30 denote that two switches each in the closed state actually exist. The switches SW1, SW2 correspond to the transistors T2, T3 in the present embodiment, respectively. The organic EL display device according to the second conventional example is provided with a current power Iref and a capacitor C2, connected to the data/measurement line DAME (not shown), outside the pixel circuit 51. Hereinafter, a reference current made to flow by the current source Iref is also denoted by a symbol Iref.

In the second conventional example, the reference current Iref is made to flow through the data/measurement line DAME, to charge the capacitor C2 to the detection voltage Vsen in accordance with the threshold voltage Vt. In other words, the data/measurement line DAME is charged to the detection voltage Vsen. By controlling the transistor T1 with a voltage obtained by adding a data fluctuation amount ΔVdata' in accordance with the movement deviation amount MV corresponding to each pixel circuit 51 to the detection voltage Vsen obtained as thus described, whereby it is possible to perform both the threshold voltage compensation and the mobility compensation.

Here considered is the time necessary for reading the reference current Iref from the pixel circuit 51 to acquire the detection voltage Vsen. Assuming that a capacitance of the data/measurement line DAME is 30 pF and a drive current for an intermediate gradation is 50 nA, in order for the potential of the data/measurement line DAME to change by 1 V, 0.6 msec is required as shown in the next expression (26):

$$T = C * \Delta V / I \qquad (26)$$
$$= (30 * 10^{-12} * 1)/(50 * 10^{-9})$$
$$= 0.6 * 10^{-3},$$

where T represents the time required for charging, C represents the capacitance of the data/measurement line DAME, ΔV represents the potential change in data/measurement line DAME, and I represents the drive current for the intermediate gradation. Therefore, relatively long time is required for reading the reference current Iref from the pixel circuit 51 to acquire the detection voltage Vsen.

Figure 31:
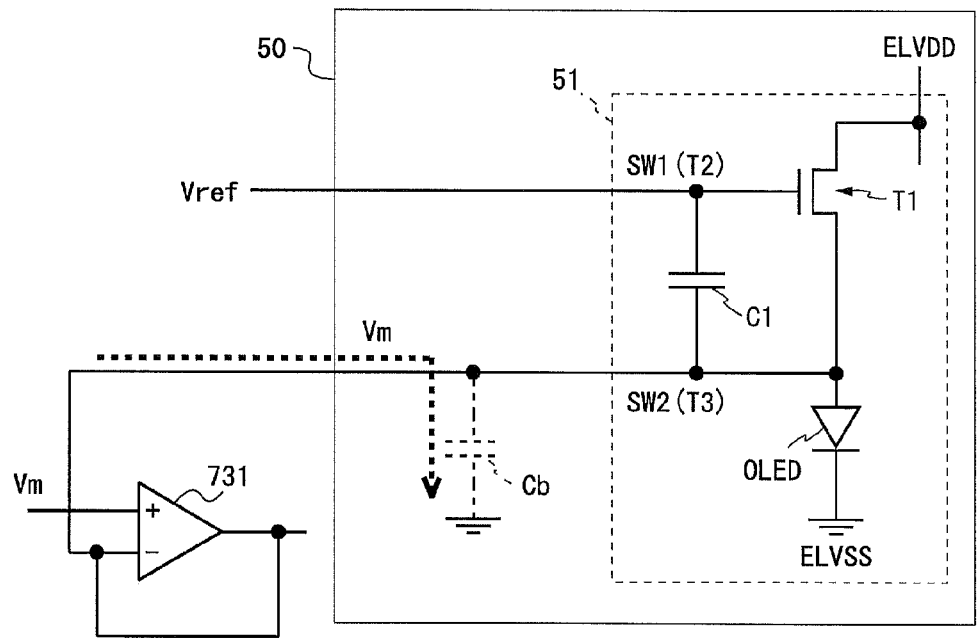
FIG. 31 is a circuit diagram for explaining a charging operation in the above first embodiment.
Figure 32:
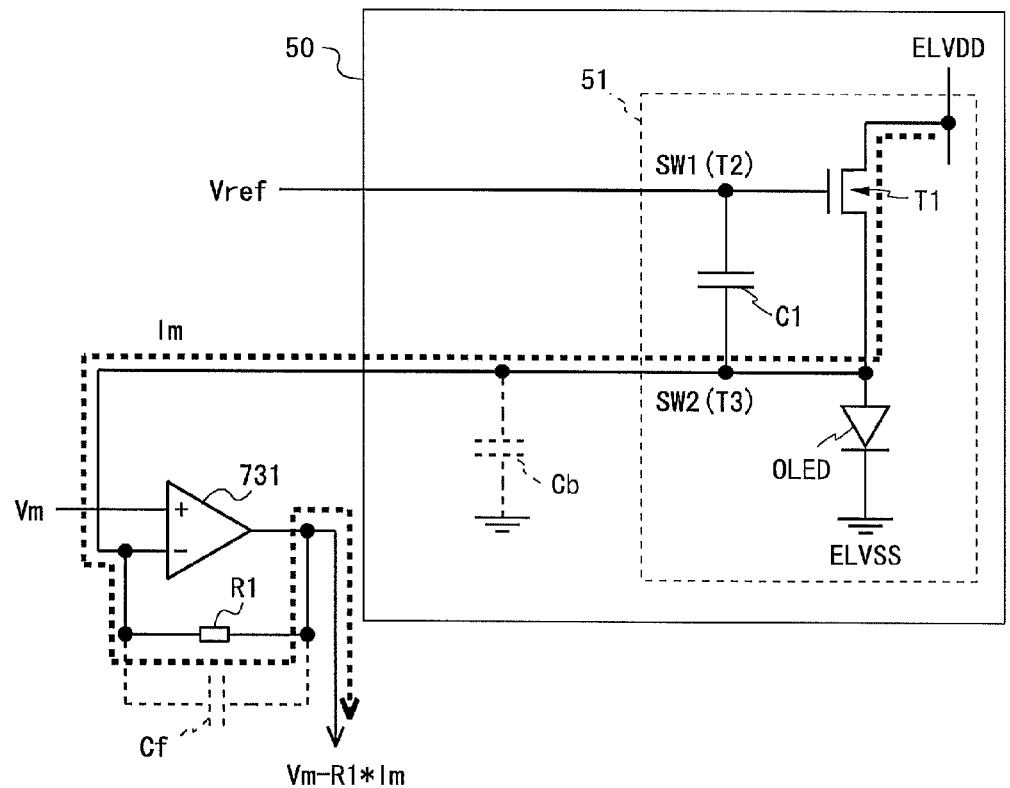
FIG. 32 is a circuit diagram for explaining an operation of measuring a drive current in the above first embodiment.

FIG. 31 is a circuit diagram for explaining a charging operation in the present embodiment. FIG. 32 is a circuit diagram for explaining an operation of measuring the drive current Im in the present embodiment. In the present embodiment, as described above, in the measuring gradation program period A1 immediately before the current measurement period A2, the data/measurement line DAME is previously charged to the data voltage Vm. Accordingly, assuming that the feedback resistance R1=$10^7$Ω and a stray capacitance is 0.5 pF, a time constant CR indicating the time required for reading the drive current Im needed for compensation from the pixel circuit 51 is 5 μsec as shown in the next expression (27).

$$CR = 10^7 * 0.5 * 10^{-12} \qquad (27)$$
$$= 5 * 10^{-6}$$

For this reason, when attention is focused on the operation of reading the current to the outside of the pixel circuit 51, it is possible to read the drive current Im at high speed in the present embodiment as compared to the second conventional example.

Figure 33:
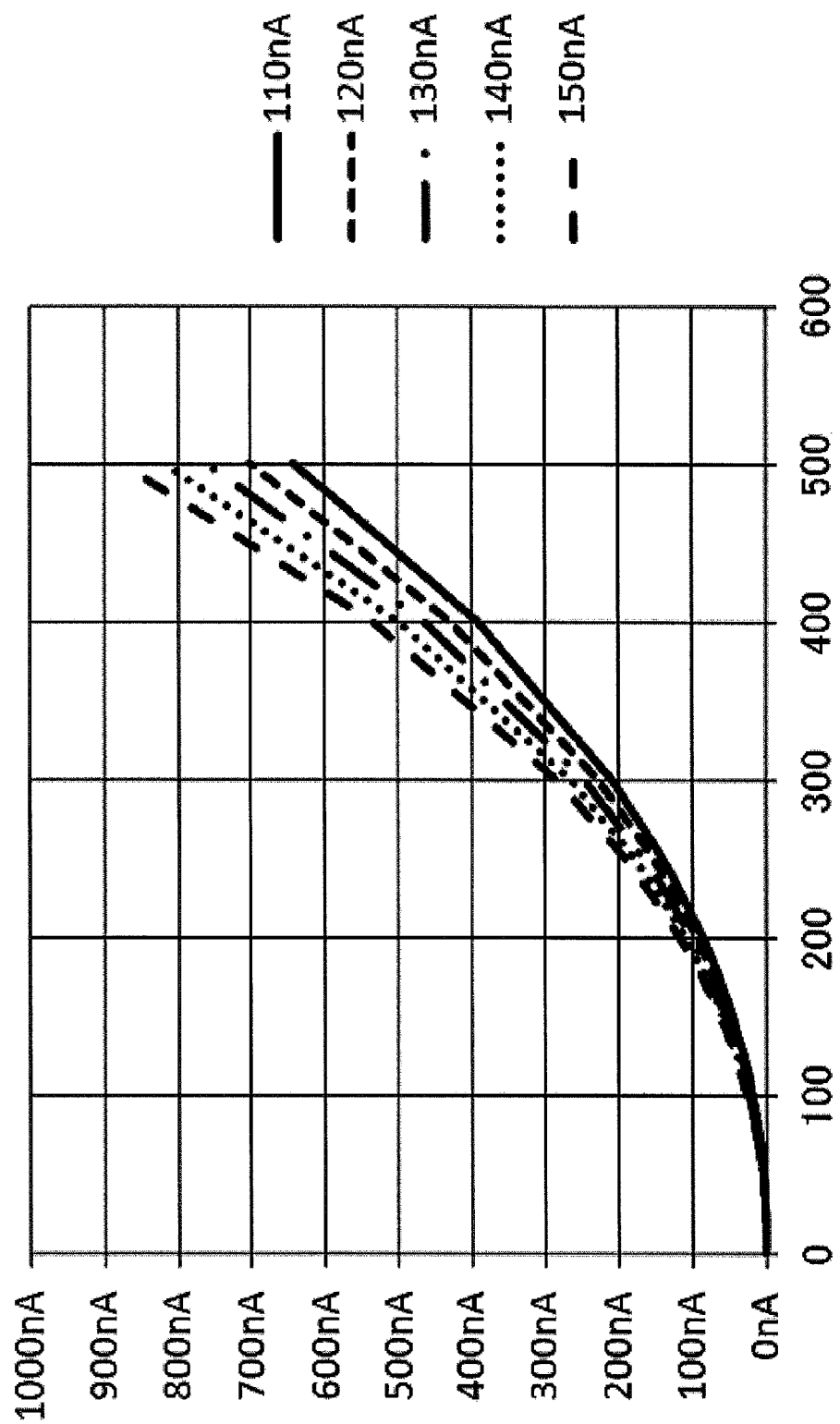
FIG. 33 is a diagram showing gradation/drive current characteristics before compensation by use of a reference current in the above second conventional example.

FIG. 33 is a diagram showing gradation/drive current characteristics before compensation by use of the reference current Iref in the above second conventional example. Here, Iref=0 nA. In FIG. 33, 110 nA, 120 nA, 130 nA, 140 nA and 150 nA show drive currents (hereinafter referred to as "specified-gradation drive current") which are outputted by five kinds of drive transistors (transistor T1 in the present embodiment), respectively, with different characteristics when a data voltage corresponding to the gradation of 255 is given to the five kinds of drive transistors. That the specified-gradation drive current is different means that the characteristic of the drive transistor (more specifically, mobility) is different.

Figure 34:
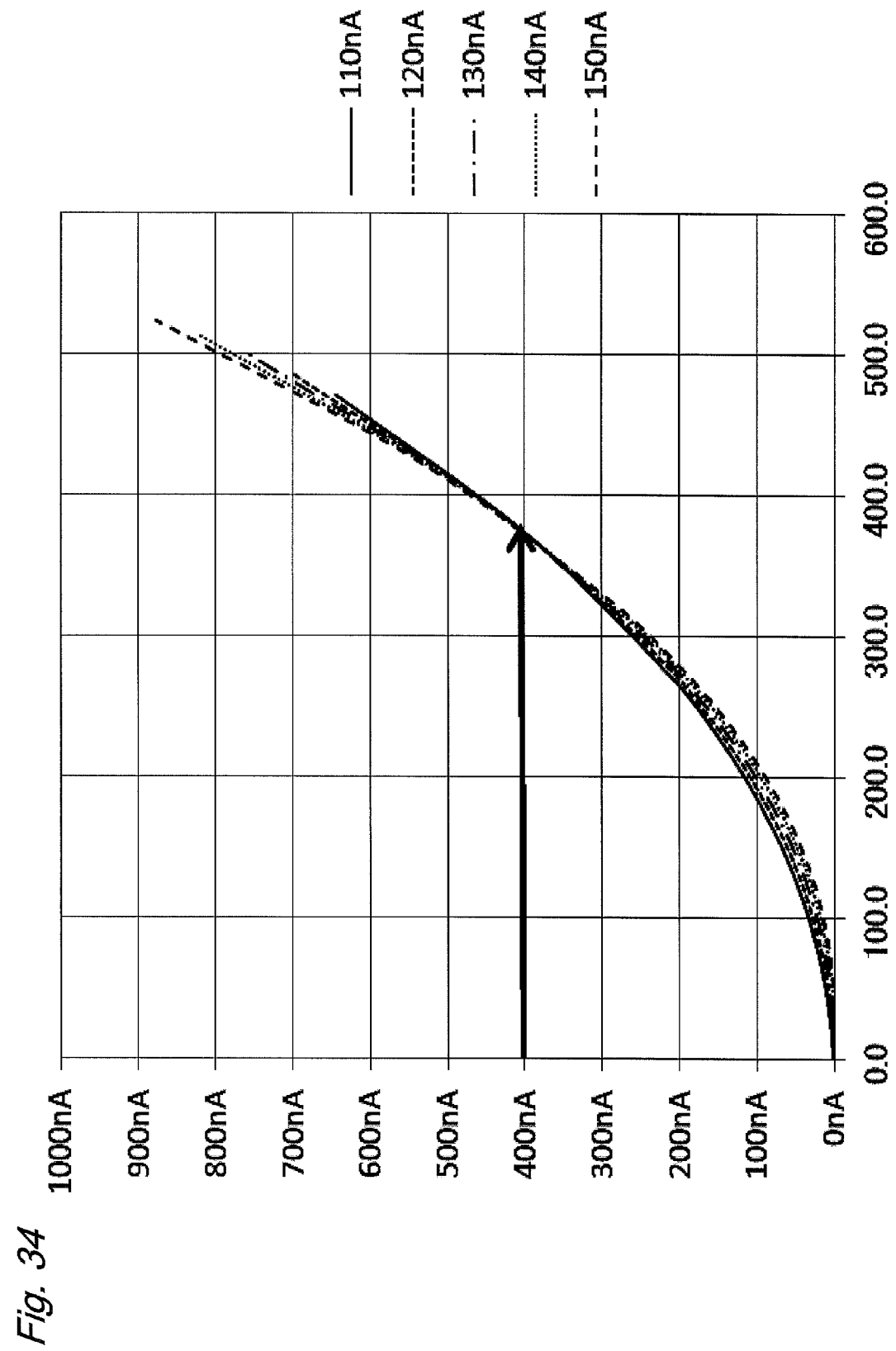
FIG. 34 is a diagram showing gradation/drive current characteristics after the compensation by use of the reference current in the above second conventional example.

FIG. 34 is a diagram showing gradation/drive current characteristics after the compensation by use of the reference current Iref in the above second conventional example. Here, Iref=400 nA. As shown in FIG. 34, it is found that a variation in characteristics of the drive transistor is suppressed after the compensation by use of the reference current Iref has been performed, as compared to that before the compensation. Specifically, it is possible to match the characteristic of each drive transistor at a place where the drive current Im matches with the reference current Iref (in the vicinity of a gradation 380). However, the variation in characteristics of the drive transistor becomes larger as being more distant from the vicinity of the gradation 380. Therefore, when a gradation region that is used for actual driving (hereinafter referred to as "drive region") is gradations of 0 to 255, the variation in characteristics of the drive transistor cannot be sufficiently suppressed in the drive region. In contrast, when the reference current Iref is set to, for example, approximately 100 nA, the characteristic of each drive transistor can be matched at a place where the drive current Im is approximately 100 nA (in the vicinity of a gradation of 200). Accordingly, as compared to the case of setting the current to the 400 nA, the variation in characteristics of the drive transistor in the drive region can be suppressed. However, in this case, the charging time T to the detection voltage Vsen shown in the above expression (26) is long. Further, in the above second conventional example, since the movement deviation amount MV corresponding to each pixel circuit 51 needs to be previously measured and prepared, compensation cannot be performed as following a change in mobility of the drive transistor when it changes with time.

Figure 35:
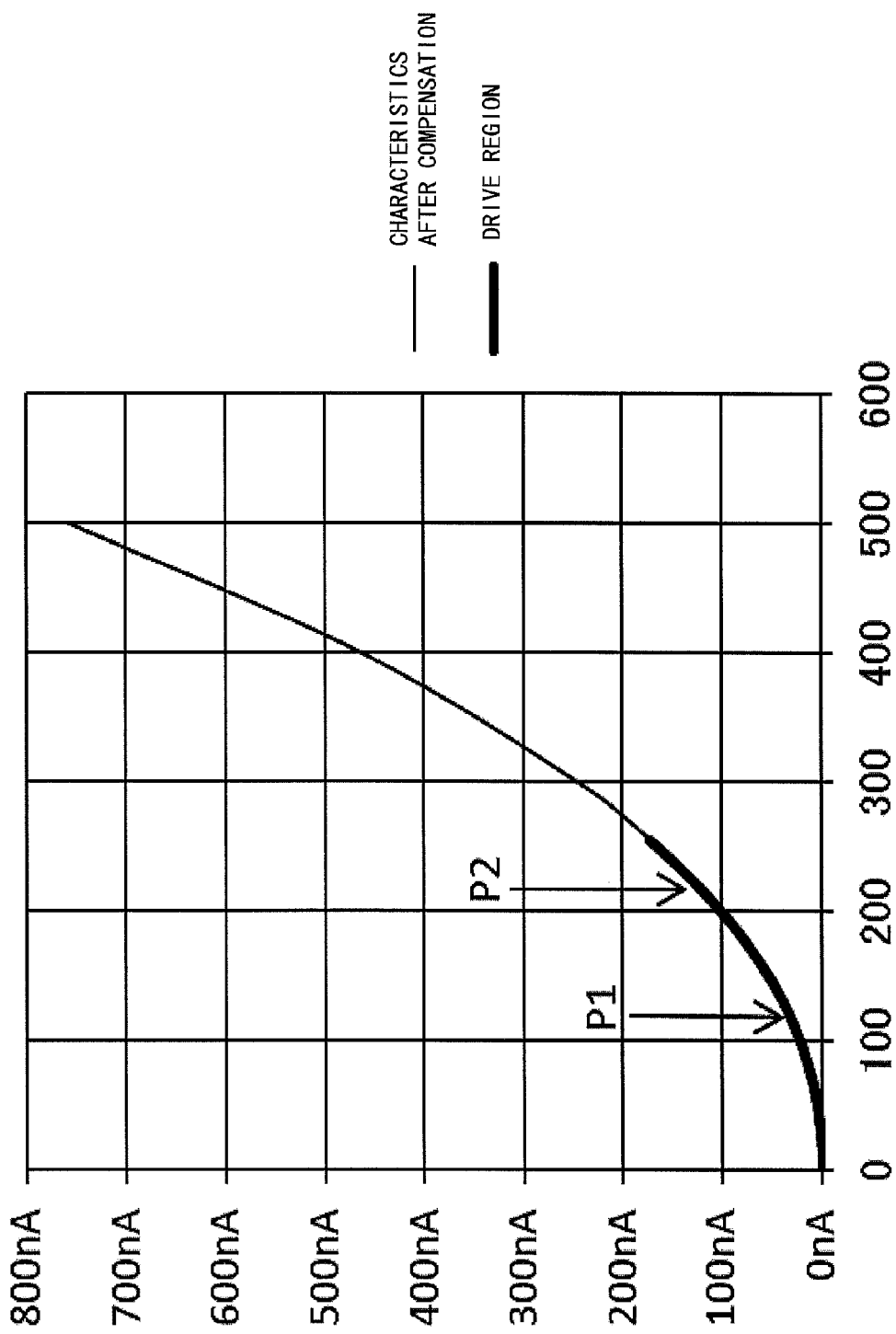
FIG. 35 is a diagram showing gradation/drive current characteristics after compensation by use of a drive current corresponding to the above first and second gradations P1, P2 in the first embodiment.

FIG. 35 is a diagram showing gradation/drive current characteristics after compensation by use of the drive current Im corresponding to the first and second gradations P1, P2 in the present embodiment. In the present embodiment, the reference current Iref in the second conventional example is not used, and both the threshold voltage compensation and the gain compensation are performed using the first and second measurement data Im(i,j,P1), Im(i,j,P2). Accordingly, the compensation is performed such that the drive current Im(i,j,P) is getting closer to the ideal characteristic data IO(P) with respect to each gradation in the drive region, whereby it is possible to suppress the variation in characteristics of the drive transistor (transistor T1) as compared to the above second conventional example. Further, in the present embodiment, with respect to each pixel circuit 51, the threshold voltage correction data Vt(i,j) and the gain correction data B2R(i,j) are updated in each predetermined period, whereby compensation can be performed as following a change in characteristics of the transistor T1 with time.

1.14 Effects

According to the present embodiment, in the vertical synchronization period, p scanning lines are sequentially selected and the drive current Im is measured with respect to each data/measurement line DAME, whereby the first and second measurement data Im(i,j,P1), Im(i,j,P2) are acquired with respect to each pixel circuit 51, and based on those, the video data Vm(i,j,P) is corrected. When the transistor T1 is driven in accordance with the first measuring data voltage Vm(i,j,P1), the gate-source voltage Vgs of the transistor T1 is relatively small, and hence a discrepancy of the threshold voltage Vt with respect to the gate-source voltage Vgs is greatly reflected to the first drive current Im(i,j,P1). In contrast, when the transistor T1 is driven in accordance with the second measuring data voltage Vm(i,j,P2), since the gate-source voltage Vgs of the transistor T1 is relatively large, a discrepancy of the threshold voltage Vt with respect to the gate-source voltage Vgs is hardly reflected to the second drive current Im(i,j,P2), whereas a discrepancy of the gain β is relatively greatly reflected to the second drive current Im(i,j,P2). For this reason, the first measurement data Im(i,j,P1) is data to which the discrepancy of the threshold voltage Vt has been greatly reflected, and the second measurement data Im(i,j,P2) is data to which the discrepancy of the gain β has been greatly reflected. In such a manner as above, the video data Vm(i,j,P) is corrected based on the first measurement data Im(i,j,P1) to which the discrepancy of the threshold voltage Vt has been greatly reflected and the second measurement data Im(i,j,P2) to which the discrepancy of the gain β has been greatly reflected, whereby it is possible to perform the threshold voltage compensation and the gain compensation of the transistor T1 with respect to each pixel circuit 51. Further, in the vertical synchronization period, light emission of the organic EL element OLED does not need to be stopped except for the pixel circuit 51 as the measurement target of the drive current Im, whereby it is possible to perform the compensation while performing display. Moreover, since the video data Vm(i,j,P) is corrected based on the first and second measurement data Im(i,j,P1), Im(i,j,P2) acquired in the vertical synchronization period, it is possible to perform the compensation following a change in characteristics of the transistor T1 with time.

Further, according to the present embodiment, the DRAM 20 where the threshold voltage correction data Vt(i,j) and the gain correction data B2R(i,j) are stored is provided, and based on comparison results between the ideal characteristic data IO(P) and the first and second measurement data Im(i,j,P1), Im(i,j,P2), the threshold voltage correction data Vt(i,j) and the gain correction data B2R(i,j) are updated, respectively. By performing such an update, it is possible to reliably perform the compensation following a change in characteristics of the transistor T1 with time. Further, since the DRAM 20 is provided outside the data drive portion 60, the configuration of the data drive portion 60 can be simplified. Moreover, by use of the ideal characteristic data IO(P), it is possible to update the threshold voltage correction data Vt(i,j) and the gain correction data B2R(i,j) by simple processing.

Further, according to the present embodiment, only one flash memory 30 is provided on the controller 10 side as corresponding to the DRAM 20, and no flash memory 30 is required on each data driver 600 side. Hence it is possible to reduce the cost.

Further, according to the present embodiment, since the threshold voltage correction data Vt(i,j) and the gain correction data B2R(i,j) are updated by the minimum amounts (fixed amounts), the compensation can be performed as more reliably following a change in characteristics of the transistor T1 with time.

Further, according to the present embodiment, the operational amplifier 731 and the control switch SW common in the data voltage supply portion 610 and the current measurement portion 620, and the resistance element R1 are provided, and the control switch SW is controlled by the input/output control signal DWT. Therefore, the operational amplifier 731 functions as a buffer amplifier for supplying the data voltage Vm(i,j,P) to the data/measurement line DAMEi at low output impedance when the input/output control signal DWT is on the "1" level, and the measuring data voltage Vm(i,j,P) is inputted into the non-inverting input terminal of the operational amplifier 731 when the input/output control signal DWT is on the "0" level, whereby the output voltage of the operational amplifier has a value obtained by subtracting, from the measuring data voltage Vm(i,j,P), the product of the drive current Im and the resistance value R1. The measurement data acquirement portion 740 can acquire the measurement data Im(i,j,P) by measuring the drive current Im(i,j,P) in consideration of the known measuring data voltage Vm(i,j,P) and the resistance value R1, based on the output voltage of the operational amplifier 731. Thus, the configuration of the data drive portion 60 for the operation of measuring the drive current Im(i,j,P) may be formed only by adding the resistance element R1, the control switch SW and the measurement data acquirement portion 740 to the conventional data drive portion. This allows the data drive portion 60 to be provided at low cost.

Further, according to the present embodiment, the first measuring gradation program period A1, the first current measurement period A2, the second measuring gradation program period A1, the second current measurement period A2 and the desired gradation program period A3 are sequentially provided within the selection period for each scanning line DM in the vertical synchronization period. Hence it is possible to acquire both the first and second measurement data Im(i,j,P1), Im(i,j,P2) in each selection period. Further, in the desired gradation program period A3, the data voltage Vm(i,j,P) corresponding to the desired gradation P is written into the pixel circuit 51. Accordingly, at the start of the video signal period immediately thereafter, it is possible to prevent display with luminance based on the second measuring data voltage Vm(i,j,P2) with respect to the pixel circuit 51 corresponding to the scanning line DM selected in the vertical synchronization period. Further, immediately before acquirement of the first or second measurement data Im(i,j,P1) or Im(i,j,P2), the data/measurement line DAMEi is charged with the first or second measuring data voltage Vm(i,j,P1) or Vm(i,j,P2), respectively. Accordingly, when the first or second measurement data Im(i,j,P1) or Im(i,j,P2) is to be acquired, the first or second drive current Im(i,j,P1) or Im(i,j,P2) can be measured at high speed without changing the potential of the data/measurement line DAMEi (without bringing about charge/discharge). Such an operation can be reliably performed, for example, by using the D latch 680 as described above. Further, since the first and second unidirectional communication buses are used in the present embodiment, the first and second measuring video data Vm(i,1,P1), Vm(i,1,P2) may be sent from the controller 10 to the data driver 600 also in the first and second current measurement periods A2, so as not to use the D latch 680.

Moreover, according to the present embodiment, in each selection period of the vertical synchronization period, the first and second measurement data Im(i,j,P1), Im(i,j,P2) acquired in the selection period are sent to the controller 10 before the desired gradation program period A3. Hence it is possible to perform correction on the video data Vm(i,j,P) to be sent to the data driver 600 by the controller 10 in the desired gradation program period A3, based on the first and second measurement data Im(i,j,P1), Im(i,j,P2) acquired in the selection period. It is thus possible to perform compensation of the variation in characteristics of the transistor T1 in real time in the vertical synchronization period.

Further, according to the present embodiment, the gate-source voltage Vgs of the transistor T1 is decided based on the reference voltage Vref and the data voltage Vm. That is, the gate-source voltage Vgs of the transistor T1 does not depend on the high level power supply voltage ELVDD. Therefore, even when a large current flows through the high level power supply line ELVDD in order to drive the organic EL element OLED and a drop voltage is generated due to wiring resistance of the high level power supply line ELVDD, the light emission drive current Ioled is not fluctuated.

Moreover, in the present embodiment, when the re-channel transistors T1 to T3 are the oxide TFTs, it is possible to reduce the writing time and increase luminance.

1.15 Modified Example

Figure 36:
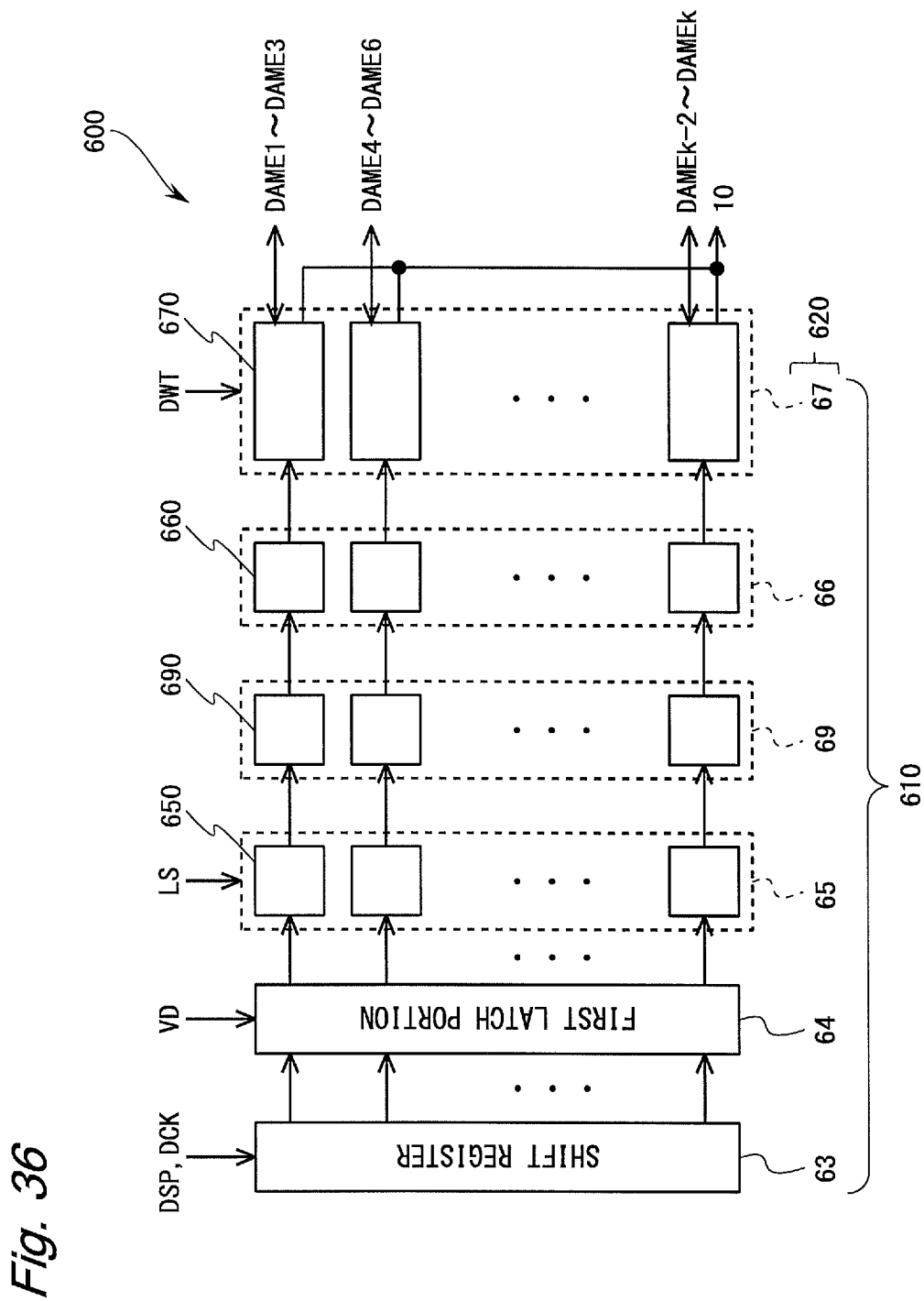
FIG. 36 is a block diagram showing a configuration of a data driver in a modified example of the above first embodiment.

FIG. 36 is a block diagram showing a configuration of a data driver in a modified example of the above first embodiment. The organic EL display device 1 in the present modified example employs an SSD (Source Shared Driving) system, and the configuration of the data driver 600 is one formed by adding an SSD switch portion 69 to the configuration of the above first embodiment. The SSD switch portion 69 is provided with k/3 SSD switches 690, and is provided between the second latch portion 65 and the D/A conversion portion 66.

For each data driver 600, k/3 latch circuits 650, k/3 DACs 660 and k/3 voltage output/current measurement circuits 670 in the present modified example are provided. Each of the latch circuits 650, the SSD switches 690, the DACs 660 and the voltage output/current measurement circuits 670 corresponds to three data/measurement lines DAME. These three data/measurement lines DAME are connected with the pixel circuit 51 which forms an R subpixel (hereinafter referred to as "R subpixel circuit"), the pixel circuit 51 which forms a G subpixel (hereinafter referred to as "G subpixel circuit"), and the pixel circuit 51 which forms a B subpixel (hereinafter referred to as "B subpixel circuit"), respectively.

The latch circuit 650 captures and holds video data (gradation values) for three pixels which are the R subpixel, the G subpixel and the B subpixel in accordance with the latch strobe signal LS, and gives the holding video data to the corresponding SSD switch 690.

The SSD switch 690 outputs the video data for the three subpixels received from the corresponding latch circuit 650 for each one subpixel in a time division manner in a 1H period. Thereafter, by an operation similar to that in the above first embodiment, the data voltage Vm of the subpixel of each color is outputted from the operational amplifier 731. It should be noted that, the output terminal of the operational amplifier 731 and three data/measurement lines DAME which correspond thereto are connected to each other via a predetermined selection circuit, not shown, and by way of the selection circuit, the data voltage Vm of each color outputted from the operational amplifier 731 is selectively given to the corresponding data/measurement line DAME.

In the present modified example, out of the constitutional elements shown in FIG. 36, the shift register 63, the first latch portion 64, the second latch portion 65, the SSD switch portion 69, the D/A conversion portion 66 and part of the voltage output/current measurement portion 67 which functions as the voltage output portion constitute the data voltage supply portion 610, and a portion out of the voltage output/current measurement portion 67 which functions as the current measurement portion 620 constitutes the current measurement portion 620.

According to the present modified example, in the organic EL display device 1 that employs the SSD system, it is possible to exert an effect similar to that of the above first embodiment. It is to be noted that in the present modified example, the data voltage Vm supplied to each data/measurement line DAME can be held in a stray capacitance in the data/measurement line DAME. However, when the stray capacitance of the data/measurement line DAME is insufficient as a capacitance for holding the data voltage Vm, a capacitor which functions as an additional capacitance may be provided for holding the data voltage Vm.

2. Second Embodiment 2.1 Data Driver

Figure 37:
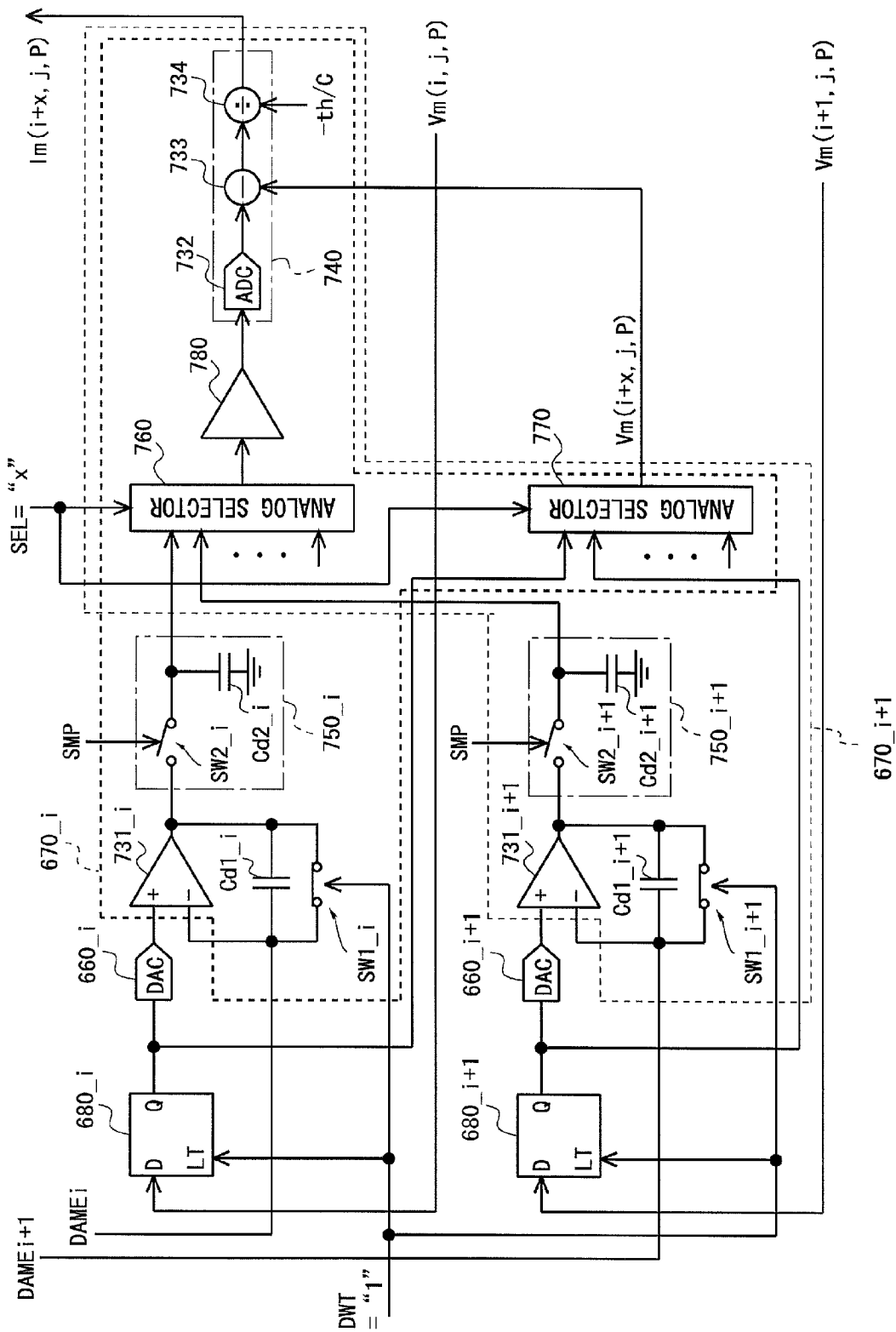
FIG. 37 is a circuit diagram showing a constitutional example of a data driver in a second embodiment of the present invention.

FIG. 37 is a circuit diagram showing a constitutional example of a data driver 600 in a second embodiment of the present invention. Out of the constitutional elements of the present embodiment, the same elements as those in the above first embodiment are provided with the same reference numerals, to omit descriptions thereof as appropriate. It is to be noted that in FIG. 37, only the constitutional elements on the i-th column and (i+1)-th column are shown (however, later-mentioned first and second selectors 760, 770, buffer amplifier 780 and measurement data acquirement portion 740 are constitutional elements in common between the plurality of columns). In a description of the present embodiment, as for symbols of the constitutional elements corresponding to the i-th column and the (i+1)-th column, "_i" and "_i+1" are added to the ends of those, respectively. It should be noted that hereinafter, the constitutional elements on the i-th column are mainly described, and descriptions of the constitutional elements on the (i+1)-th column will be omitted as appropriate. In FIG. 37, similarly to FIG. 14 above, the shift register 63, the first latch portion 64 and the latch circuit 650 are omitted for the sake of convenience.

As shown in FIG. 37, a D latch 680_i, a DAC 660_i and a voltage output/current measurement circuit 670_i are provided corresponding to the data/measurement line DAMEi on the i-th column. The voltage output/current measurement circuit 670_i on the i-th column is provided with an operational amplifier 731_i, a first capacitance (capacitance element) Cd1_i, a first control switch SW1_i, a voltage holding portion 750_i, the first and second selectors 760, 770, the buffer amplifier 780, and the measurement data acquirement portion 740. The first and second selectors 760, 770, the buffer amplifier 780 and the measurement data acquirement portion 740 are common constitutional elements on the Ns columns. Here, assuming i=1, Ns is an integer not smaller than two and not larger than k when the data drive portion 60 is configured of a plurality of data drivers 600, and Ns is an integer not smaller than two and not larger than m when the data drive portion 60 is configured of one data driver 600. The first control switch SW1_i in the present embodiment is one similar to the control switch SW in the above first embodiment. Further, the measurement data acquirement portion 740 in the present embodiment is one similar to the measurement data acquirement portion 740 in the above first embodiment. In the present embodiment, a first capacitor Cd1_i is provided in place of the resistance element R1 in the above first embodiment, and the first capacitor Cd1_i corresponds to the current/voltage conversion element. It is to be noted that a function of the first capacitor Cd1_i will be detailed later.

The voltage holding portion 750_i is provided between the operational amplifier 731_i and the measurement data acquirement portion 740, and holds an output voltage of the operational amplifier 731_i. The voltage holding portion 750_i is, more specifically, provided with a second control switch SW2_i and a second capacitor (capacitance element) Cd2_i. The second control switch SW2_i is provided between an output terminal of the operational amplifier 731_i and one end of the second capacitor Cd2_i, and the second control switch SW2_i is closed when a sampling signal SMP is on the "1" level, while it is opened when the sampling signal SMP is on the "0" level. The sampling signal SMP is, for example, given from the controller 10. The other end of the second capacitor Cd2_i is, for example, grounded.

The analog selector 760 as a first selector receives output voltages of Ns operational amplifiers 731_i to 731_i+Ns−1, and based on an address signal SEL, any of output voltages of the Ns operational amplifiers 731_i to 731_i+Ns−1 is given to the measurement data acquirement portion 740 via the buffer amplifier 780. The address signal SEL is, for example, given from the controller 10 and shows an address "x" (x=0 to Ns−1). When the address signal SEL="x", the analog selector 760 gives an output voltage of the operational amplifier 731_i+x to the measurement data acquirement portion 740 via the buffer amplifier 780. The analog selector 760 is, more specifically, provided with Ns first input terminals, one second input terminal and one output terminal, not shown. The Ns first input terminals of the analog selector 760 are connected to one ends of second capacitors Cd2_i to Cd2_i+Ns−1 of Ns voltage holding portions 750_i to 750_i+Ns−1, respectively. Here, inputs into the Ns first input terminals connected to the one ends of the second capacitors Cd2_i to Cd2_i+Ns−1 are referred to as "inputs of the analog selectors 760 on the i-th to (i+Ns-1)-th columns", and denoted by symbols Vc2_i to Vc2_i+Ns−1, respectively. The address signal SEL is given to the second input terminal of the analog selector 760. An input terminal of the buffer amplifier 780 is connected to the output terminal of the analog selector 760.

The digital selector 770 as a second selector receives video data Vm(i,j,P) to Vm(i+Ns−1,j,P) before conversion of data voltages which are given to non-inverting input terminals of the Ns operational amplifiers 731_i to 731_i+Ns−1, and gives any of the video data Vm(i,j,P) to Vm(i+Ns−1,j,P) to an input terminal on the minuend side of the subtraction portion 733 based on the address signal SEL. In the case of the address signal SEL "x", the digital selector 770 gives the video data Vm(i+x,j,P) to the input terminal on the minuend side of the subtraction portion 733. The digital selector 770 is, more specifically, provided with Ns first input terminals, one second input terminal and one output terminal, not shown. The Ns first input terminals of the digital selector 770 are connected with Q output terminals of Ns D latches 680_i to 680_i+Ns−1, respectively. The address signal SEL is given to the second input terminal of the digital selector 770. The input terminal on the minuend side of the subtraction portion 733 is connected to the output terminal of the digital selector 770.

As described above, the input terminal of the buffer amplifier 780 is connected to the output terminal of the analog selector 760, and an output terminal of the buffer amplifier 780 is connected to an input terminal of the ADC 732. It is to be noted that the buffer amplifier 780 may not be provided and the output terminal of the analog selector 760 may be directly connected to the input terminal of the ADC 732.

2.2 Operation

Figure 38:
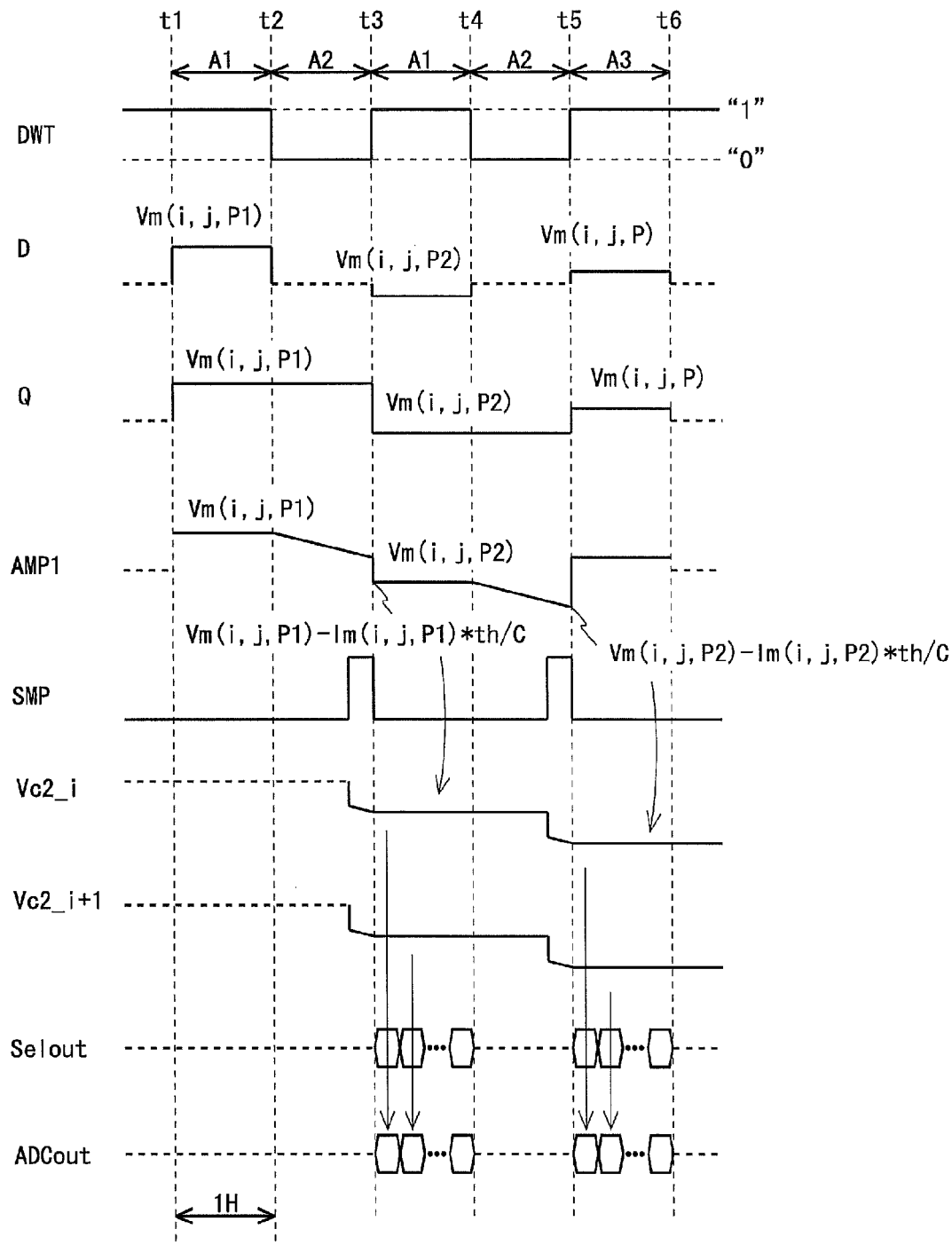
FIG. 38 is a timing chart for explaining an operation of each constitutional element shown in FIG. 37 in a vertical synchronization period.

FIG. 38 is a timing chart for explaining an operation of each constitutional element shown in FIG. 37 in a vertical synchronization period. In FIG. 38, AMP1 denotes the output voltage of the operational amplifier 731_$i$, Vc2_$i$, Vc2_$i$+1 denote inputs of the analog selectors 760 on the i-th column and the (i+1)-th column, respectively, Selout denotes an output of the analog selector 760, and ADCout denotes an output of the ADC 732. It should be noted that, since operations of the D latch 680_$i$ and the DAC 660_$i$ are similar to those in the above first embodiment, descriptions thereof will be omitted as appropriate.

In the first measuring gradation program period A1 from time t1 to time t2, first measuring video data Vm(i,j,P1), inputted into the D input terminal of the D latch 680_$i$, is outputted as it is from the Q output terminal. Further, from time t1 to time t2, since the sampling signal SMP is on the "0" level, the second control switch SW2_$i$ is opened.

In the first current measurement period A2 from time t2 to time t3, similarly to the above first embodiment, the first measuring video data Vm(i,j,P1) continues to be outputted from an output terminal of the D latch 680_$i$. Further, from time t2 to time t3, since the input/output control signal DWT is on the "0" level, the first control switch SW1_$i$ is opened. Therefore, the drive current Im(i,j,P1) flowing through the data/measurement line DAMEi is integrated by the first capacitor Cd1_$i$ in a period th. In the present embodiment, th=A2. Further, from time t2 to time t3, the potential of the inverting input terminal is the first measuring data voltage Vm(i,j,P1) due to a virtual short circuit of the operational amplifier 731_$i$. Accordingly, at time t3, the output voltage AMP1out of the operational amplifier 731_$i$ becomes a value given by the following expression (28):

$$AMP1out=Vm(i,j,P1)-Im(i,j,P1)*(th/C) \quad (28),$$

where C represents a capacitance value of the first capacitor Cd1_$i$. In addition, it is assumed hereinafter that capacitance values of the first capacitors Cd1_$i$ to Cd1_$i$+Ns−1 are mutually the same, and are assumed to be C.

In the first half of time t2 to time t3, since the sampling signal SMP is on the "0" level, the second control switch SW2_$i$ is opened. In the latter half of time t2 to time t3, since the sampling signal SMP is on the "1" level, the second control switch SW2_$i$ is closed. For this reason, in the latter half of time t2 to time t3, the second capacitor Cd2_$i$ is charged to the output voltage AMP1out of the operational amplifier 731_$i$.

In the second measuring gradation program period A1 from time t3 to time t4, since the sampling signal SMP is on the "0" level, the second control switch SW2_$i$ is opened. For this reason, the second capacitor Cd2_$i$ holds the output voltage AMP1out of the operational amplifier 731_$i$. In such a manner, the output voltages of the Ns operational amplifiers 731_$i$ to 731_$i$+Ns−1 are given to the analog selector 760. Further, from time t3 to time t4, the address signal SEL is given to the analog selector 760. The analog selector 760 selects an input Vc2_$i$+x on the (i+x)-th row based on the address signal SEL, and gives the input Vc2_$i$+x on the (i+x)-th row to the ADC 732 via the buffer amplifier 780. From time t3 to time t4, x changes from 0 to Ns−1, for example. However, the sequence of changes in x is not particularly restricted. It is to be noted that the address signal SEL is also given to the digital selector 770. Therefore, the digital selector 770 selects the first measuring video data Vm(i+x,j,P1) based on the address signal SEL, and gives it to the input terminal on the minuend side of the subtraction portion 733.

It is to be noted that from time t3 to time t4, since the second measuring video data Vm(i,j,P2) is being outputted from the Q output terminal of the D latch 680_$i$, the first measuring video data Vm(i+x,j,P1) is desirably selected by the digital selector 770 during a period from time t1 to time t2 or from time t2 to time t3 when the first measuring video data Vm(i,j,P1) is being outputted from the Q output terminal of the D latch 680_$i$. In this case, the timing for outputting the first measuring video data Vm(i+x,j,P1) by the digital selector 770 may be suitably adjusted.

The operation of the measurement data acquirement portion 740 from time t3 to time t4 will be described. The ADC 732 A/D converts the input Vc2_$i$+x on the (i+x)-th column which is given via the buffer amplifier 780, namely "Vm(i+x,j,P1)−Im(i+x,j,P1)*(th/C)", and gives it to an input terminal on the subtrahend side of the subtraction portion 733. As described above, since the first measuring video data Vm(i+x,j,P1) is given to the input terminal on the minuend side of the subtraction portion 733, the output of the subtraction portion 733 is "−Im(i+x,j,P1)*(th/C)". Further, the output of the division portion 734 obtained when dividing the output of the subtraction portion 733 by "−th/C", is Im(i+x,j,P1). In such a manner, first measurement data Im(i+x,j,P1) is acquired. More specifically, in the case of x sequentially changing from 0 to Ns−1, the first measurement data Im(i,j,P1), Im(i+1,j,P1), Im(i+2,j,P1), Im(i+Ns−1,j,P1) are sequentially obtained from time t3 to time t4. It should be noted that "−th/C" that is inputted into the division portion 734 may, for example, be previously calculated and stored into a register, and may be read from the register when it is to be inputted into the division portion 734. Further, the division portion 734 may be replaced by a multiplication portion, and "−C/th" may be inputted into the multiplication portion in place of "−th/C".

It is to be noted that the operations concerning the voltage holding portion 750_$i$, the analog selector 760, the digital selector 770, the buffer amplifier 780 and the measurement data acquirement portion 740 in the second current measurement period A2 from time t4 to time t5 and the desired gradation program period A3 from time t5 to time t6 are obtained only by changing, to the second gradation P2, the first gradation P1 of the operation in the first current measurement period A2 from time t2 to time t3 and the second gradation program period A1 from time t3 to time t4, and hence detailed descriptions thereof will be omitted. Further, since the operation in the video signal period in the present embodiment is similar to that in the above first embodiment, a description thereof will be omitted. It should be noted that the present embodiment is not restricted to the example of using the D latch 680_$i$, similarly to the above first embodiment.

2.3 First Capacitor

Next, the function of the first capacitor Cd1_$i$ will be described. In the above first embodiment, the resistance element R1 is used as the current/voltage conversion element provided between the output terminal and the inverting input terminal of the operational amplifier 731. When the control switch SW (a first control switch SW1 in the present embodiment) is closed, a current flowing through the resistance element R1 is converted to a voltage.

Incidentally, in the case of using the resistance element R1 as the current/voltage conversion element, when a shot noise (also called 1/f noise; f represents frequency) generated by the operational amplifier 731 itself, a thermal noise or the like is denoted by an input equivalent noise current In, a noise of "In*R1+sqrt(4kTBR1)" appears in the output of the operational amplifier. Here, k represents a Boltzmann's constant, T represents an absolute temperature, and B represents a bandwidth. Such noises bring about deterioration in detection accuracy at the time of detecting a current of several nanoamperes.

Further, when a capacitive load such as the data/measurement line DAMEi (bus line) is connected to the inverting input terminal of the operational amplifier 731, a phase margin becomes short and the operation tends to become unstable. Against such a phenomenon, there has hitherto been a method of adding a phase compensation capacitor of approximately 1 pF in parallel to the resistance element R1, to ensure the phase margin. However, due to a time constant CR decided based on the resistance element R1 and the phase compensation capacitor, a response speed decreases significantly. For example, at the time of detecting a current of 100 nA as a voltage of approximately 1 V, since R1 is generally set to approximately 10 MΩ, the time constant CR is approximately 10 μsec $(=10\times10^6\times10^{-12})$. Since the 1H period is about 14.8 μsec at an FHD (Full High Definition) resolution, with the time constant CR of approximately 10 μsec, it is difficult to obtain sufficient detection accuracy in measurement within the 1H period.

When the first capacitor Cd1 is used as the current/voltage conversion element as in the present embodiment, an input equivalent noise of the operational amplifier 731 and a thermal noise generated in the resistance element R1 are reduced. Specifically, when an input equivalent voltage of the operational amplifier 731 is Vn, a noise that appears in the output of the operational amplifier 731 is "Vn+sqrt(kT/C)", and is smaller than a noise in the case of using the resistance element R1. It is to be noted that such a method is a known one, and has been employed in a sensor amplifier that handles a microcurrent, and the like, for example.

2.4 Effect

According to the present embodiment, since the output voltage of the operational amplifier 731 and the video data which are to be given to the measurement data acquirement portion 740 are selected by use of the first and second selectors 760, 770, the number of measurement data acquirement portions 740 that is provided with respect to the Ns operational amplifiers 731 may be one. Hence it is possible to reduce the number of measurement data acquirement portions 740, so as to reduce a circuit scale of the data driver 600.

Further, according to the present embodiment, since the first capacitor Cd1 is used as the current/voltage conversion element that is provided between the output terminal and the inverting input terminal of the operational amplifier 731, it is possible to reduce a noise that appears in the output of the operational amplifier 731.

3. Third Embodiment

3.1 Data Communication Between Controller and Data Driver

Figure 39:
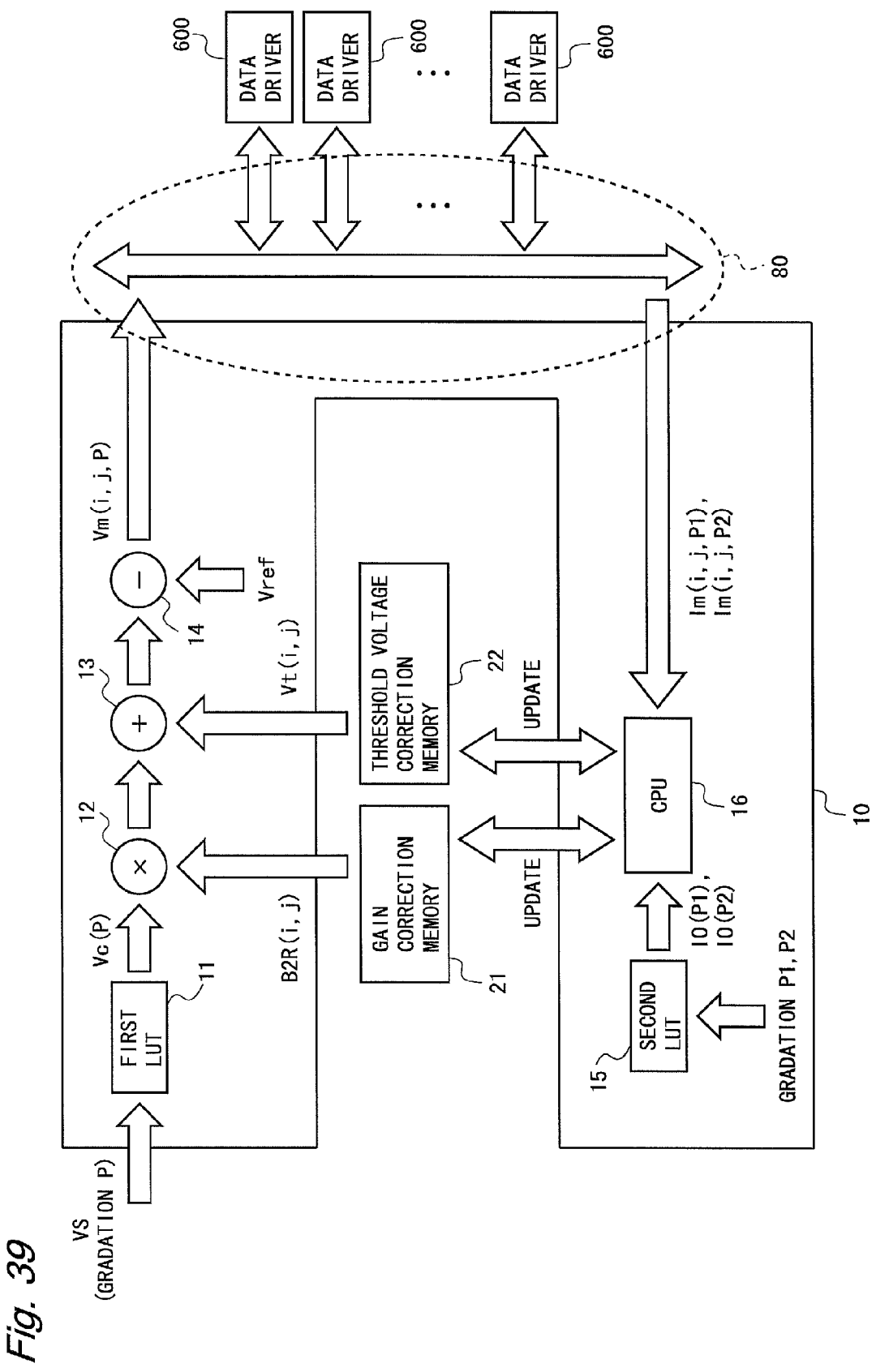
FIG. 39 is a block diagram for explaining data communication between a controller and a data driver in a third embodiment of the present invention.

FIG. 39 is a block diagram for explaining data communication between the controller 10 and the data driver 600 in a third embodiment of the present invention. Out of the constitutional elements of the present embodiment, the same elements as those in the above first embodiment are provided with the same reference numerals, to omit descriptions thereof as appropriate. A communication bus in the present embodiment is configured of a bidirectional communication bus capable of performing bidirectional data communication between the controller 10 and the data driver 600. In addition, the kind of bidirectional communication bus is not particularly restricted, but it is an LVDS, an MIPI, an e-DP or the like, for example.

3.2 Data Update

Figure 40:
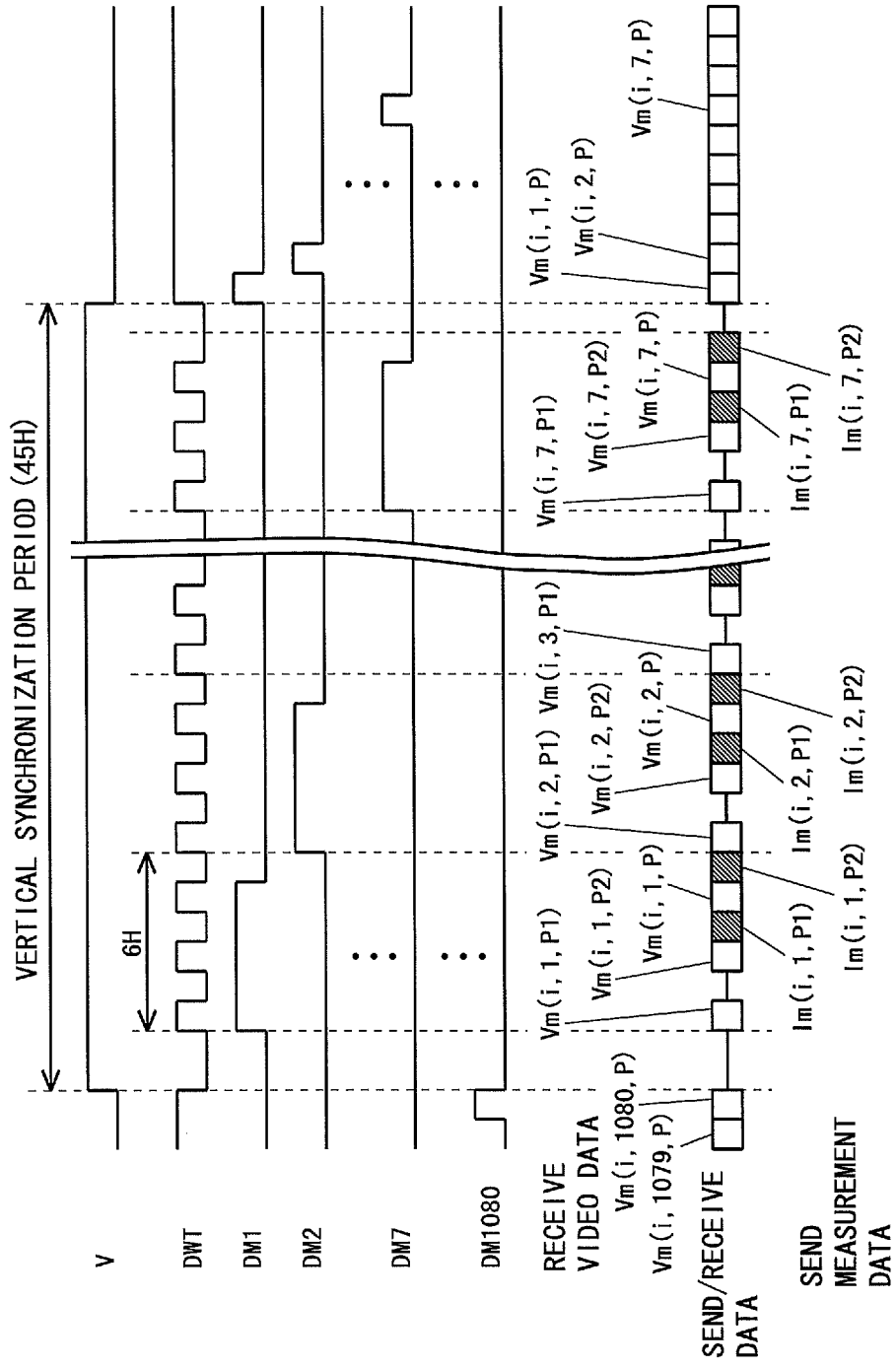
FIG. 40 is a timing chart for explaining timing for receiving video data and sending measurement data in a vertical synchronization period of an N-th frame period in the above third embodiment.

FIG. 40 is a timing chart for explaining timing for receiving video data and sending measurement data in a vertical synchronization period of an N-th frame period in the present embodiment. In the present embodiment, assuming p=7, and a 2H-period margin and a 1H-period margin are provided on the start side and the end side of the vertical synchronization period (45H periods), respectively. Further, in the present embodiment, a measurement data sending period of 1H period is provided after completion of each selection period in the vertical synchronization period. In the measurement data sending period, all the scanning lines DM are in the non-selected state.

After the period type signal V is switched to the "1" level, the vertical synchronization period starts, and after the 2H-period margin, the scanning line DM1 on the first row is selected for 5H periods. In these 5H periods, similarly to the above first embodiment, the first measuring gradation program period A1, the first current measurement period A2, the second measuring gradation program period A1, the second current measurement period A2 and the desired gradation program period A3 for the first row are sequentially switched every 1H period.

In the first measuring gradation program period A1 for the first row, the first measuring video data Vm(i,1,P1) is sent from the controller 10 to the data driver 600 via the bidirectional communication bus, and the first measuring data voltage Vm(i,1,P1) is written.

In the first current measurement period A2 for the first row, the first measurement data Im(i,1,P1) is acquired.

In the second measuring gradation program period A1 for the first row, the second measuring video data Vm(i,1,P2) is sent from the controller 10 to the data driver 600 via the bidirectional communication bus, and the second measuring data voltage Vm(i,1,P2) is written.

In the second current measurement period A2 for the first row, the second measurement data Im(i,1,P2) is acquired. Further, the first measurement data Im(i,1,P1) is sent from the data driver 600 to the controller 10 via the bidirectional communication bus. Then in the controller 10, the threshold voltage correction data Vt(i,1) is updated based on the received first measurement data Im(i,1,P1).

In the desired gradation program period A3 for the first row, the video data Vm(i,1,P) is sent from the controller 10 to the data driver 600 via the bidirectional communication bus, and the data voltage Vm(i,1,P) is written. Here, the threshold voltage correction data Vt(i,1) after updated has been reflected to the video data Vm(i,1,P).

In the measurement data sending period between the selection period for the first row and the selection period for the second row, the second measurement data Im(i,1,P2) is sent from the data driver 600 to the controller 10 via the bidirectional communication bus. Then in the controller 10, the gain correction data B2R(i,1) is updated based on the received second measurement data Im(i,1,P2).

Subsequently, the scanning lines DM2 to DM7 on the second to seventh rows are sequentially selected, whereby an operation similar to that on the first row is performed on each of the second to seventh rows. After sending second measurement data Im(i,7,P2) on the seventh row and after a lapse of the 1H-period margin, the period type signal V is switched to the "0" level, and the vertical synchronization period is completed.

Subsequently, the video signal period of the (N+1)-th frame period is started, and data voltages, to which the update result in the vertical synchronization period of the N-th frame period has been reflected, are written for the first to seventh row, while data voltages, to which the update result in the vertical synchronization periods of the (N−1)-th or earlier frame periods has been reflected, are written for the eighth to 1080th rows.

Figure 41:
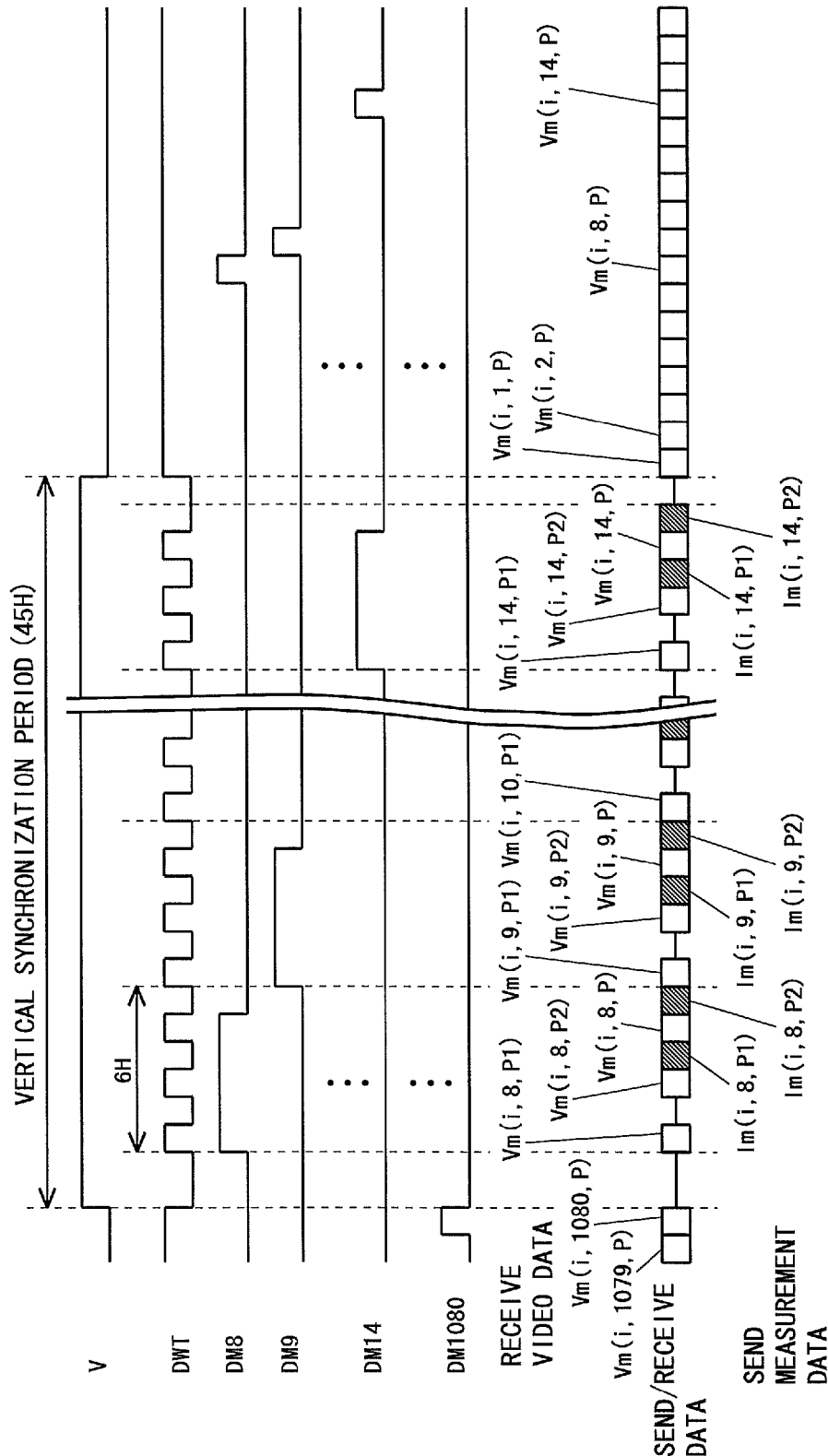
FIG. 41 is a timing chart for explaining timing for receiving video data and sending measurement data in a vertical synchronization period of an (N+1)-th frame period in the above third embodiment.

FIG. 41 is a timing chart for explaining timing for receiving video data and sending measurement data in the vertical synchronization period of the (N+1)-th frame period in the present embodiment. In the vertical synchronization period of the (N+1)-th frame period, as shown in FIG. 41, an operation similar to that for the first to seventh rows is performed for the eighth to fourteenth rows. In the video signal period of the (N+2)-th frame period, data voltages, to which the update result in the vertical synchronization period of the (N+1)-th frame period has been reflected, are written for the eighth to fourteenth rows, while data voltages, to which the update result in the vertical synchronization periods of the N-th or earlier frame periods has been reflected, are written for the first to seventh rows and the fifteenth to 1080th rows.

As described above, in the present embodiment, 6H periods are allocated for one row, and the threshold voltage correction data Vt(i,j) and the gain correction data B2R(i,j) are updated. Further, 2H periods after acquirement of the first and second measurement data Im(i,j,P1), Im(i,j,P2), the first and second measurement data Im(i,j,P1), Im(i,j,P2) are sent, respectively. Moreover, an update result of the threshold voltage correction data Vt(i,j) is reflected to the video data (data voltage) in real time. In addition, even when the first and second unidirectional communication buses are used in place of the bidirectional communication bus, it is possible to update the threshold voltage correction data Vt(i,j) and the gain correction data B2R(i,j) in a procedure similar to that in the present embodiment.

3.3 Scanning Drive Portion

Figure 42:
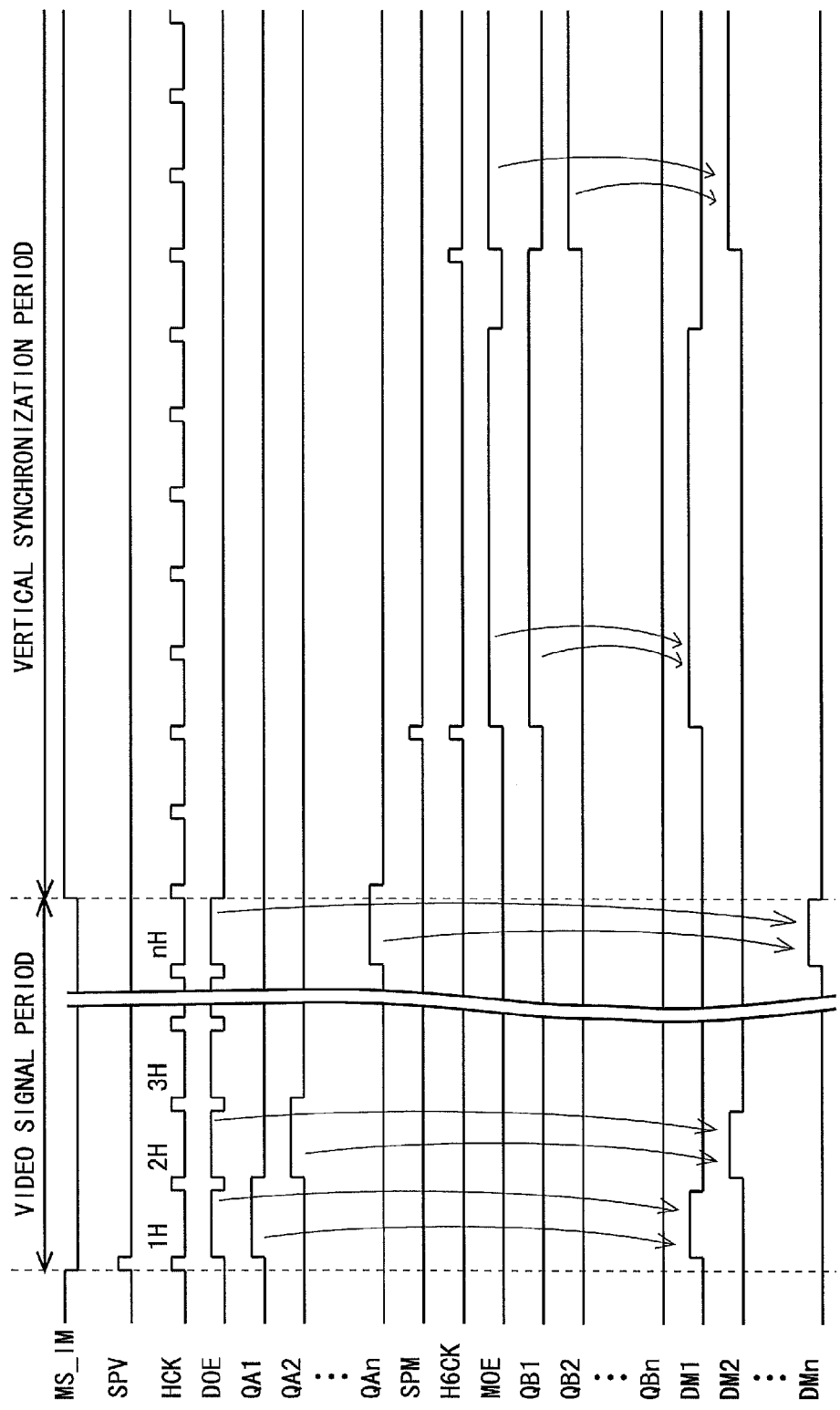
FIG. 42 is a timing chart for explaining an operation of a scanning drive portion in the N-th frame period in the above third embodiment.

FIG. 42 is a timing chart for explaining an operation of a scanning drive portion 70 in the N-th frame period in the present embodiment. It is to be noted that the configuration of the scanning drive portion 70 and its operation in the video signal period are similar to those in the above first embodiment. In the present embodiment, differently from the above first embodiment, a second clock H6CK, which generates seven pulses on the "1" level with the 6H periods taken as a cycle in the vertical synchronization period, is inputted into the CK input terminal of each second flip flop FB. Further, in the video signal period, the second enable signal MOE in the present embodiment is constantly on the "0" level, and in the vertical synchronization period, it changes to the "1" level simultaneously with falling of the second clock H6CK, and changes to the "0" level 5H periods thereafter.

At the start of the vertical synchronization period of the N-th frame period, the selector control signal MS_IM changes to the "1" level. Subsequently, a 2H-period margin is provided, and the Q output based on the second start pulse SPM on the "1" level shifts in synchronization with the second clock H6CK. It is to be noted that the period of the margin is not particularly restricted. In the vertical synchronization period of the 45H periods, the Q outputs of the second flip flops FB1 to FB7 on the first to seventh stages sequentially change to the "1" level. In the vertical synchronization period, with the selector control signal MS_IM being on the "1" level, a result of AND computing of the Q output of the second flip flop FB on each stage and the second enable signal MOE is given to the scanning line DM on the corresponding row via the selector SE. In such a manner, each of the scanning lines DM1 to DM7 on the first to seventh rows is sequentially selected every 6H periods while a 1H period gap is left, in the vertical synchronization period of the N-th frame period. After generating a seventh pulse, the second clock H6CK is fixed to the "0" level, and hence the shift operation of the second shift register 720 is stopped. For this reason, the Q output of the second flip flop FB7 on the seventh stage is held on the "1" level. It is to be noted that, after the stoppage of the shift operation of the second shift register 720, the second enable signal MOE changes to the "0" level as described above, and hence the scanning line DM7 on the seventh row changes from the selected state to the non-selected state.

Figure 43:
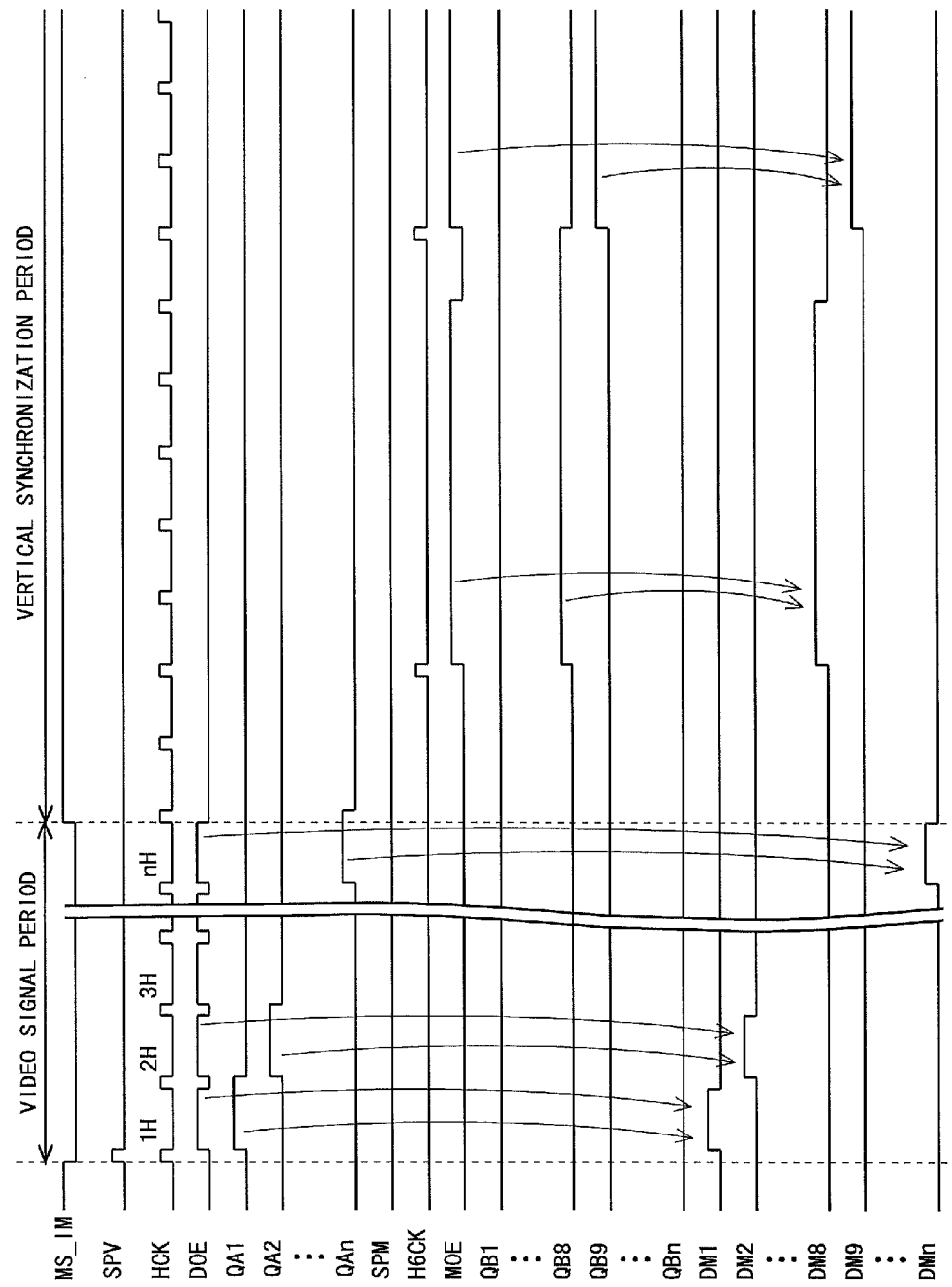
FIG. 43 is a timing chart for explaining an operation of the scanning drive portion in the (N+1)-th frame period in the above third embodiment.

FIG. 43 is a timing chart for explaining an operation of the scanning drive portion 70 in the (N+1)-th frame period in the present embodiment. Since the operation in the video signal period of the (N+1)-th frame period is similar to that in the N-th frame period, its description will be omitted. At the start of the vertical synchronization period of the (N+1)-th frame period, the selector control signal MS_IM changes to the "1" level. Subsequently, a 2H-period margin is provided, and the second clock H6CK generates a pulse on the "1" level. For this reason, the shift operation of the second shift register 720 is resumed, and by an operation similar to that in the N-th frame period, the Q outputs of the second flip flops FB8 to FB14 on the eighth to fourteenth stages sequentially change to the "1" level. It is to be noted that the second start pulse SPM is constantly on the "0" level in the (N+1)-th frame period. In the vertical synchronization period, with the selector control signal MS_IM being on the "1" level, a result of AND computing of the Q output of the second flip flop FB on each stage and the second enable signal MOE is given to the scanning line DM on the corresponding row via the selector SE. In such a manner, the scanning lines DM8 to DM14 on the eighth to fourteenth rows are sequentially selected every 6H periods while a 1H period gap is left, in the vertical synchronization period of the (N+1)-th frame period. After generating a seventh pulse, the second clock H6CK is fixed to the "0" level, and hence the shift operation of the second shift register 720 is stopped. For this reason, the Q output of the second flip flop FB14 on the fourteenth stage is held on the "1" level. It is to be noted that, after the stoppage of the shift operation of the second shift register 720, the second enable signal MOE goes to the "0" level as described above, and hence the scanning line DM14 on the fourteenth row changes from the selected state to the non-selected state. By repeating such an operation as being similar to that in the (N+1)-th frame period in the (N+2)-th frame period, the (N+3)-th frame period, . . . , it is possible to select all the scanning lines DM in the vertical synchronization period. Thereafter, a similar operation is performed in the N-th frame period, the (N+1)-th frame period, the (N+2)-th frame period, . . . .

3.4 Effect

According to the present embodiment, since the bidirectional communication bus is used, a communication system between the controller 10 and the data driver 600 can be reduced. Hence it is possible to reduce the cost.

Further, according to the present embodiment, 2H periods after acquirement of the first and second measurement data Im(i,j,P1), Im(i,j,P2), the first and second measurement data Im(i,j,P1), Im(i,j,P2) are sent to the controller 10. Hence it is

4. Fourth Embodiment

4.1 Data Update

Figure 44:
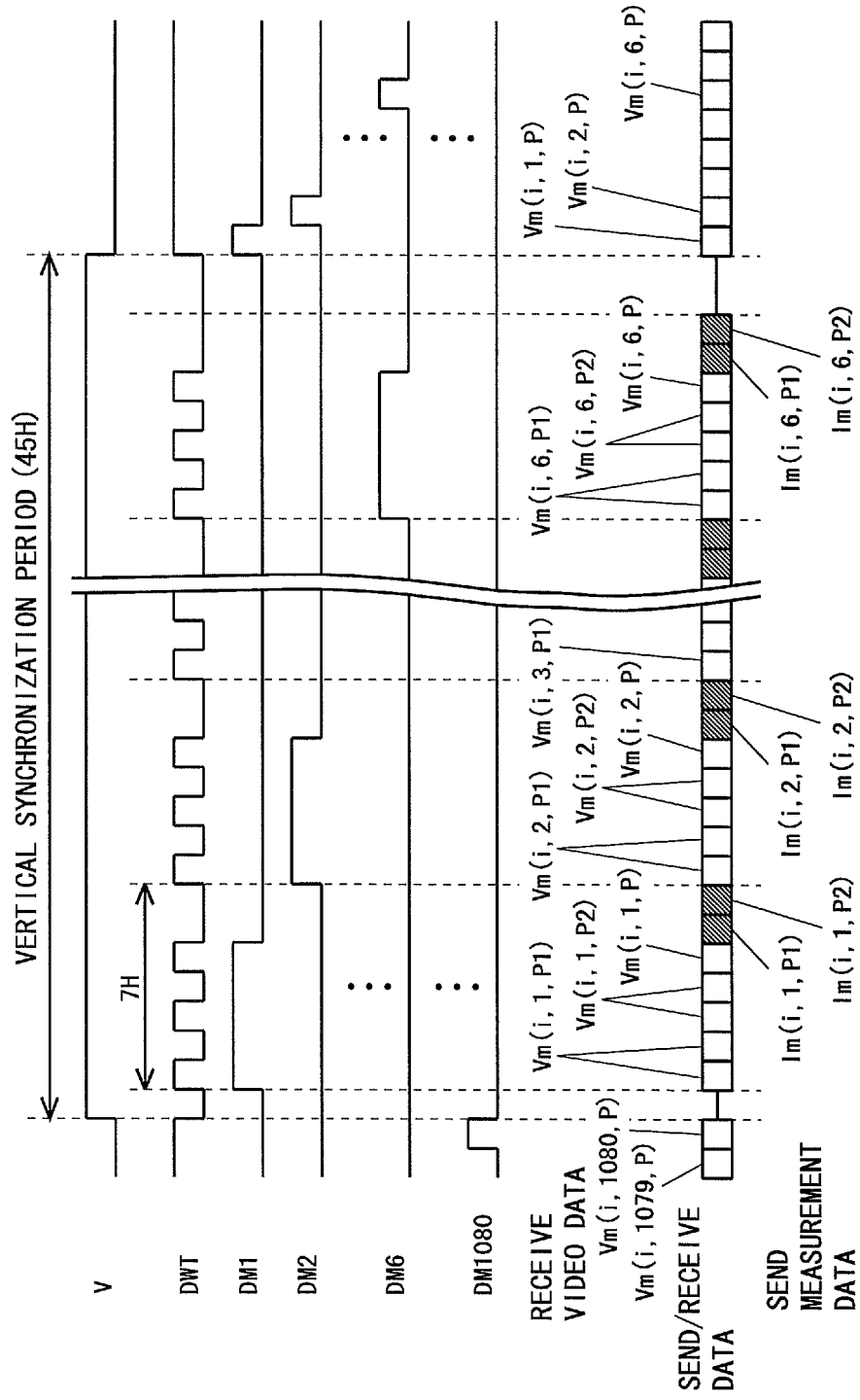
FIG. 44 is a timing chart for explaining timing for receiving video data and sending measurement data in a vertical synchronization period of an N-th frame period in a fourth embodiment of the present invention.

FIG. 44 is a timing chart for explaining timing for receiving video data and sending measurement data in a vertical synchronization period of an N-th frame period in a fourth embodiment of the present invention. Out of the constitutional elements of the present embodiment, the same elements as those in the above first embodiment are provided with the same reference numerals, to omit descriptions thereof as appropriate. In the present embodiment, assuming p=6, and a 1H-period margin and a 2H-period margin are provided on the start side and the end side of the vertical synchronization period (45H periods), respectively. Further, in the present embodiment, a measurement data sending period of 2H periods is provided after completion of each selection period in the vertical synchronization period. In the measurement data sending period, all the scanning lines DM are in the non-selected state. Further, although a description will be given assuming that a communication bus 80 is configured of the bidirectional communication bus in the present embodiment, the communication bus 80 may be configured of the first and second unidirectional communication buses.

After the period type signal V is switched to the "1" level, the vertical synchronization period starts, and after the 1H-period margin, the scanning line DM1 on the first row is selected for 5H periods. In these 5H periods, similarly to the above first embodiment, the first measuring gradation program period A1, the first current measurement period A2, the second measuring gradation program period A1, the second current measurement period A2 and the desired gradation program period A3 for the first row are sequentially switched every 1H period.

In the first measuring gradation program period A1 for the first row, the first measuring video data Vm(i,1,P1) is sent from the controller 10 to the data driver 600 via the bidirectional communication bus, and the first measuring data voltage Vm(i,1,P1) is written.

In the first current measurement period A2 for the first row, similarly to the first measuring gradation program period A1, the first measuring video data Vm(i,1,P1) is sent from the controller 10 to the data driver 600 via the bidirectional communication bus, and the first measurement data Im(i,1,P1) is acquired.

In the second measuring gradation program period A1 for the first row, the second measuring video data Vm(i,1,P2) is sent from the controller 10 to the data driver 600 via the bidirectional communication bus, and the second measuring data voltage Vm(i,1,P2) is written.

In the second current measurement period A2 for the first row, similarly to the second measuring gradation program period A1, the second measuring video data Vm(i,1,P2) is sent from the controller 10 to the data driver 600 via the bidirectional communication bus, and the second measurement data Im(i,1,P2) is acquired.

In the desired gradation program period A3 for the first row, the video data Vm(i,1,P) is sent from the controller 10 to the data driver 600 via the bidirectional communication bus, and the data voltage Vm(i,1,P) is written.

In a 1H period as the first half of the measurement data sending period between the selection period for the first row and the selection period for the second row, the first measurement data Im(i,1,P1) is sent from the data driver 600 to the controller 10 via the bidirectional communication bus. Then in the controller 10, the threshold voltage correction data Vt(i,1) is updated based on the received first measurement data Im(i,1,P1).

In a 1H period as the latter half of the measurement data sending period between the selection period for the first row and the selection period for the second row, the second measurement data Im(i,1,P2) is sent from the data driver 600 to the controller 10 via the bidirectional communication bus. Then in the controller 10, the gain correction data B2R(i,1) is updated based on the received second measurement data Im(i,1,P2).

Subsequently, the scanning lines DM2 to DM6 on the second to sixth rows are sequentially selected, whereby an operation similar to that on the first row is performed on each of the second to sixth rows. After sending second measurement data Im(i,6,P2) on the sixth row and after a lapse of the 2H-period margin, the period type signal V is switched to the "0" level, and the vertical synchronization period is completed.

Subsequently, the video signal period of the (N+1)-th frame period is started, and data voltages, to which the update result in the vertical synchronization period of the N-th frame period has been reflected, are written for the first to sixth rows, while data voltages, to which the update result in the vertical synchronization periods of the (N−1)-th or earlier frame periods has been reflected, are written for the seventh to 1080th rows. Since the operation in the (N+1)-th frame period is basically similar to that in the N-th frame period, its description will be omitted.

As described above, in the present embodiment, 7H periods are allocated for one row, and the threshold voltage correction data Vt(i,j) and the gain correction data B2R(i,j) are updated. Further, the first and second measurement data Im(i,j,P1), Im(i,j,P2) are sent in periods immediately after completion of the selection periods in which the first and second measurement data Im(i,j,P1), Im(i,j,P2) are acquired.

The operation of the scanning drive portion 70 in the present embodiment is achieved, for example, by using the second clock which generates six pulses on the "1" level with the 7H periods taken as a cycle in the vertical synchronization period, and the second enable signal MOE which changes to the "1" level simultaneously with falling of the second clock and changes to the "0" level 5H periods thereafter.

4.2 Effect

According to the present embodiment, in periods immediately after completion of the selection periods in which the first and second measurement data Im(i,j,P1), Im(i,j,P2) are acquired, the first and second measurement data Im(i,j,P1), Im(i,j,P2) are sent to the controller 10. Hence it is possible to sufficiently ensure preparation time before sending the first and second measurement data Im(i,j,P1), Im(i,j,P2), so as to reliably send the first and second measurement data Im(i,j,P1), Im(i,j,P2) to the controller 10.

Moreover, according to the present embodiment, in the first and second current measurement periods A2, the first and second measuring video data Vm(i,1,P1), Vm(i,1,P2) are sent to the data driver 600, and given to the DAC 660. Accordingly, the D latch 680 is not used, and when the first or second measurement data Im(i,j,P1) or Im(i,j,P2) is to be acquired, the first or second drive currents Im(i,j,P1) or Im(i,j,P2) can be measured at high speed without changing the potential of the data/measurement line DAMEi (without bringing about charge/discharge).

5. Fifth Embodiment

5.1 Data Update

Figure 45:
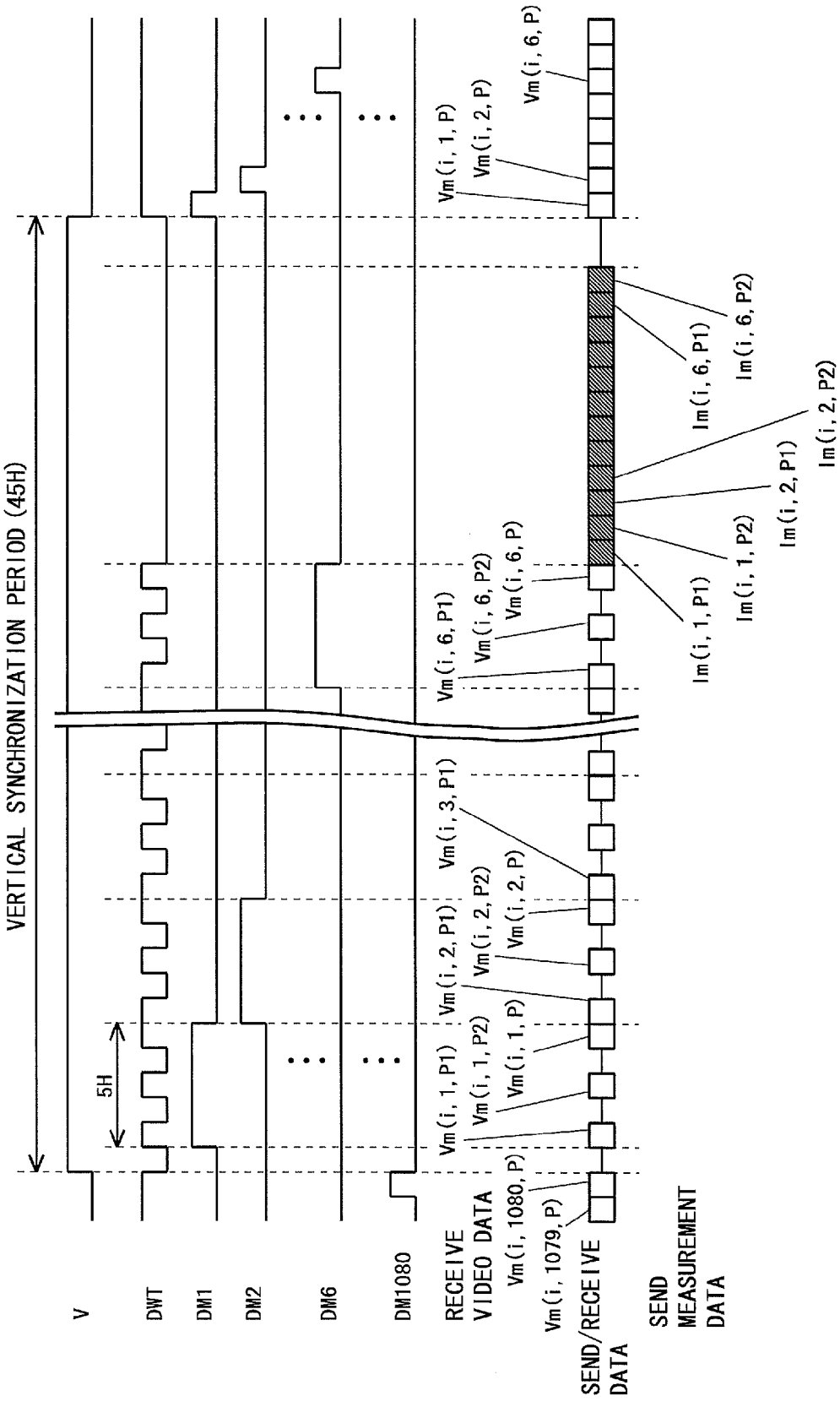
FIG. 45 is a timing chart for explaining timing for receiving video data and sending measurement data in a vertical synchronization period of an N-th frame period in a fifth embodiment of the present invention.

FIG. 45 is a timing chart for explaining timing for receiving video data and sending measurement data in the vertical synchronization period of the N-th frame period in a fifth embodiment of the present invention. Out of the constitutional elements of the present embodiment, the same elements as those in the above first embodiment are provided with the same reference numerals, to omit descriptions thereof as appropriate. In the present embodiment, assuming p=6, and a 1H-period margin and a 2H-period margin are provided on the start side and the end side of the vertical synchronization period (45H periods), respectively. Further, in the present embodiment, a measurement data sending period of 12H periods is provided after completion of the selection period for the sixth row. It is to be noted that the operation of a scanning drive portion 70 in the embodiment is similar to that in the above first embodiment.

After the period type signal V is switched to the "1" level, the vertical synchronization period starts, and after the 1H-period margin, the scanning line DM1 on the first row is selected for 5H periods. In these 5H periods, similarly to the above first embodiment, the first measuring gradation program period A1, the first current measurement period A2, the second measuring gradation program period A1, the second current measurement period A2 and the desired gradation program period A3 for the first row are sequentially switched every 1H period.

In the first measuring gradation program period A1 for the first row, the first measuring video data Vm(i,1,P1) is sent from the controller 10 to the data driver 600 via the bidirectional communication bus, and the first measuring data voltage Vm(i,1,P1) is written.

In the first current measurement period A2 for the first row, the first measurement data Im(i,1,P1) is acquired.

In the second measuring gradation program period A1 for the first row, the second measuring video data Vm(i,1,P2) is sent from the controller 10 to the data driver 600 via the bidirectional communication bus, and the second measuring data voltage Vm(i,1,P2) is written. In the second current measurement period A2 for the first row, the second measurement data Im(i,1,P2) is acquired.

In the desired gradation program period A3 for the first row, the video data Vm(i,1,P) is sent from the controller 10 to the data driver 600 via the bidirectional communication bus, and the data voltage Vm(i,1,P) is written.

Subsequently, the scanning lines DM2 to DM6 on the second to sixth rows are sequentially selected, whereby an operation similar to that on the first row is performed on each of the second to sixth rows. After completion of the selection period for the sixth row, in the measurement data sending period of 12H periods, the first and second measurement data on the first to sixth rows are sent to the controller 10 via the bidirectional communication bus. It should be noted that, although the send sequence of measurement data is not particularly restricted, it is assumed, for example, that the sending is performed in the sequence of Im(i,1,P1), Im(i,1,P2) on the first row, Im(i,2,P1), Im(i,2,P2) on the second row, ..., and Im(i,6,P1), Im(i,6,P2) on the sixth row. In this measurement data sending period, in the controller 10, there are performed an update of the threshold voltage correction data Vt(i,j) based on the received first measurement data Im(i,j,P1) and an update of the gain correction data B2R(i,j) based on the received second measurement data Im(i,j,P2) with respect to each of the first to sixth rows. After the measurement data sending period and after a lapse of the margin of 2H periods, the period type signal V is switched to the "0" level, and the vertical synchronization period is completed.

The video signal period of the (N+1)-th frame period is started, and data voltages, to which the update result in the vertical synchronization period of the N-th frame period has been reflected, are written for the first to sixth rows, while data voltages, to which the update result in the vertical synchronization periods of the (N−1)-th or earlier frame periods has been reflected, are written for the seventh to 1080th rows. Since the operation in the (N+1)-th frame period is basically similar to that in the N-th frame period, its description will be omitted.

In the present embodiment, 7H periods (5H periods of each selection period and 2H periods out of the measurement data sending period) are allocated for one row, and the threshold voltage correction data Vt(i,j) and the gain correction data B2R(i,j) are updated. Further, the acquired first and second measurement data Im(i,j,P1), Im(i,j,P2) on each row are sent collectively in the measurement data sending period.

5.2 Effect

According to the present embodiment, in the measurement data sending period provided after completion of all the selection periods of the vertical synchronization period, the first and second measurement data Im(i,j,P1), Im(i,j,P2) on each row acquired in the vertical synchronization period are sent to the controller 10. Hence it is possible to sufficiently ensure preparation time before sending the first and second measurement data Im(i,j,P1), Im(i,j,P2), so as to reliably send the first and second measurement data Im(i,j,P1), Im(i,j,P2) to the controller 10.

6. Sixth Embodiment

6.1 Pixel Circuit

Figure 46:
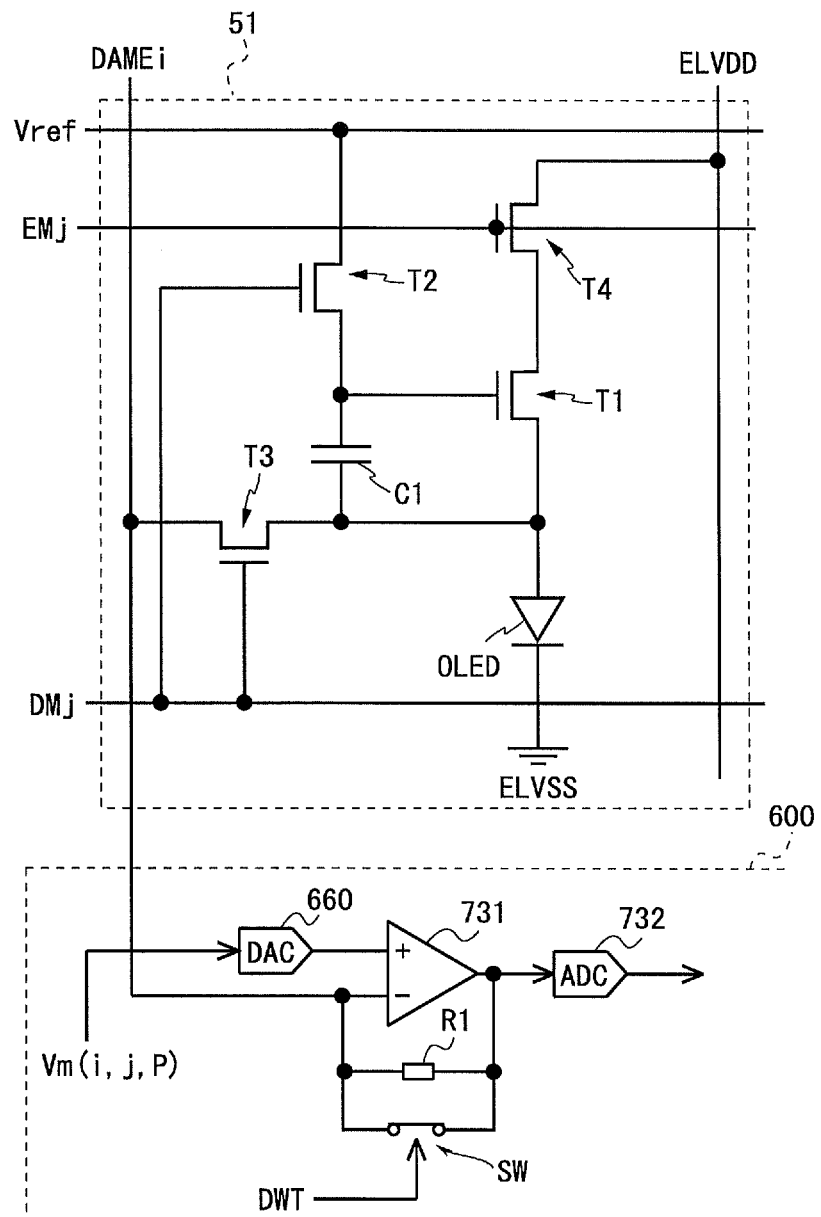
FIG. 46 is a circuit diagram showing a pixel circuit and part of constitutional elements on a data driver side which correspond thereto in a sixth embodiment of the present invention.

FIG. 46 is a circuit diagram showing a pixel circuit 51 in a sixth embodiment of the present invention and part of constitutional elements on a data driver 600 side which correspond thereto. Out of the constitutional elements of the present embodiment, the same elements as those in the above first embodiment are provided with the same reference numerals, to omit descriptions thereof as appropriate. The pixel circuit 51 in the present embodiment is provided with one organic EL element OLED, four transistors T1 to T4, and one capacitor (drive capacitance element) C1. The transistor T1 is a drive transistor, the transistor T2 is a reference voltage supply transistor, the transistor T3 is an input transistor, and the transistor T4 is a light emission control transistor. The transistors T1 to T4 are all n-channel types. The pixel circuit 51 in the present embodiment is one obtained by adding the transistor T4 to the pixel circuit 51 in the above first embodiment.

In the display portion 50 in the present embodiment, there are disposed n emission lines EM1 to EMn along the n scanning lines DM1 to DMn, respectively. Hereinafter, when it is not necessary to distinguish the n emission lines EM1 to EMn, these are simply denoted by a symbol EM.

The transistor T1 is provided in series with the organic EL element OLED, and has, as a second conduction terminal, a source terminal connected to an anode terminal of the organic EL element OLED. The transistor T2 has a gate terminal connected to a scanning line DMj, and is provided between a reference voltage line Vref and a gate terminal of the transistor T1. The transistor T3 has a gate terminal connected to the scanning line DMj, and is provided between the data/measurement line DAMEi and the source terminal of the transistor T1. The transistor T4 is provided in series with the organic EL element OLED. The transistor T4 has a gate terminal connected to an emission line EMj, and is provided between the drain terminal, as a first conduction terminal, of the transistor T1 and a high level power supply line ELVDD. The transistor T4 in the present embodiment at least comes into the off-state when the scanning line DM corresponding to the pixel circuit 51 provided with the transistor T4 is selected in the video signal period, and the transistor T4 at least comes into the on-state when the scanning line DM corresponding to the pixel circuit 51 provided with the transistor T4 is selected in the vertical synchronization period. The capacitor C1 is provided between the gate terminal and the source terminal of the transistor T1. A cathode terminal of the organic EL element OLED is connected to a low level power supply line ELVSS.

6.2 Operation in Video Signal Period

Figure 47:
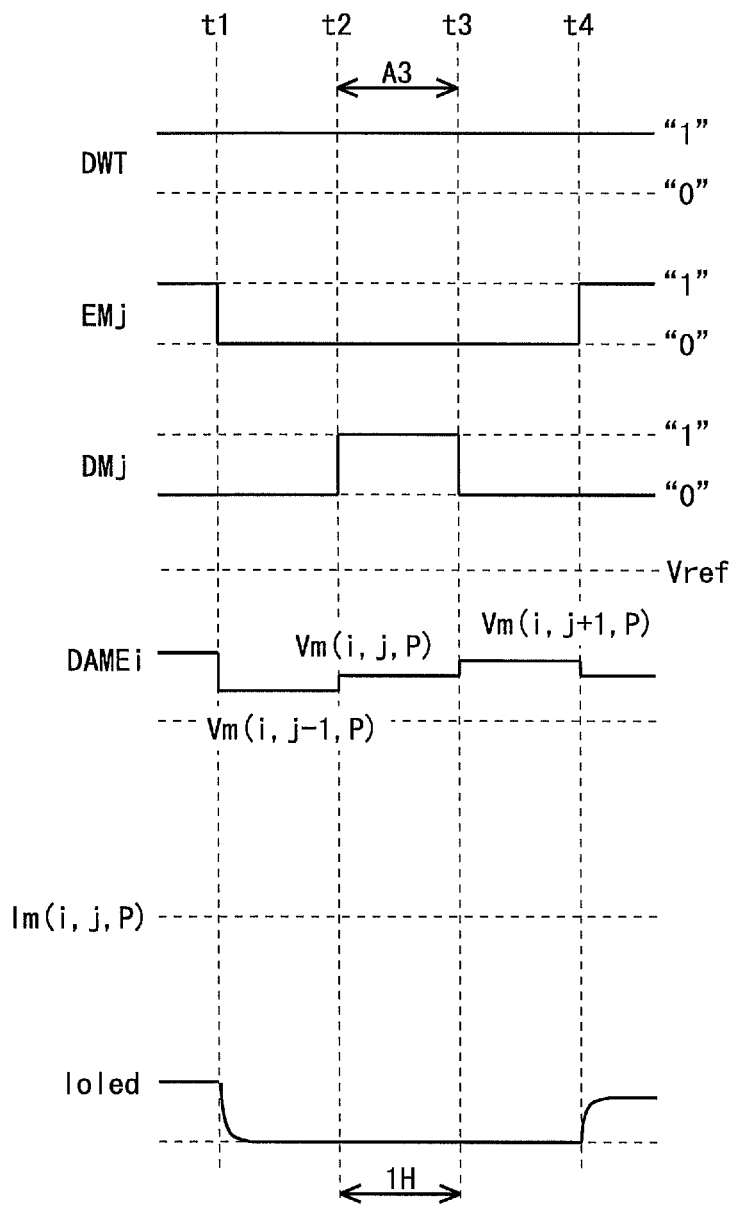
FIG. 47 is a timing chart for explaining operations of the pixel circuit and part of constitutional elements on the data driver side which correspond thereto, both shown in FIG. 46, in a video signal period.

FIG. 47 is a timing chart for explaining operations of the pixel circuit 51 and part of constitutional elements on the data driver 600 side which correspond thereto, both shown in FIG. 46, in the video signal period. In the present embodiment, the desired gradation program period A3 spans from time t2 to time t3.

Before time t1, the potential of the scanning line DMj is on the "0" level, and the potential of the emission line EMj is on the "1" level. At this time, the transistor T4 is in the on-state, and the drain terminal of the transistor T1 and the high level power supply line ELVDD are electrically connected to each other, whereby an electric charge is supplied from the high level power supply line ELVDD to the drain terminal of the transistor T1. Further, the transistors T2, T3 are in the off-state, and the transistor T1 supplies the organic EL element OLED with the light emission drive current Ioled in accordance with the gate-source voltage Vgs held in the capacitor C1. Then, the organic EL element OLED emits light with luminance in accordance with the light emission drive current Ioled. It is to be noted that in the present embodiment, light emission of the organic EL element OLED is stopped by fixing the potential of the emission line EMj to the "0" level in a predetermined video signal period, and the organic EL element OLED is emitted by fixing the potential of the emission line EMj to the "1" level in a predetermined video signal period (detailed later).

At time t1, the potential of the emission line EMj changes to the "0" level, and the transistor T4 is turned off. Accordingly, the drain terminal of the transistor T1 and the high level power supply line ELVDD are electrically separated from each other, and the supply of the electric charge from the high level power supply line ELVDD to the drain terminal of the transistor T1 is stopped. For this reason, the light emission drive current Ioled becomes zero, and the light emission of the organic EL element OLED is stopped.

From time t2, the data voltage Vm(i,j,P) is supplied to the data/measurement line DAMEi via the operational amplifier 731. Further, the potential of the scanning line DMj changes to the "1" level, and the transistors T2, T3 are turned on. Thereby, similarly to the above first embodiment, the capacitor C1 is charged to the gate-source voltage Vgs given by the above expression (1) in the desired gradation program period A3 from time t2 to time t3. It should be noted that in the vertical synchronization period in the present embodiment, the transistor T4 comes into the on-state in the pixel circuit corresponding to the selected scanning line DM as described above, and hence the data voltage Vm(i,j,P) desirably satisfies the above expression (2).

At time t3, the potential of the scanning line DMj changes to the "0" level, and the transistors T2, T3 are turned off. For this reason, a holding voltage of the capacitor C1 is determined to be the gate-source voltage Vgs shown in the above expression (1).

At time t4, the potential of the emission line EMj changes to the "1" level, and the transistor T4 is turned on. Accordingly, the drain terminal of the transistor T1 and the high level power supply line ELVDD are electrically connected to each other, and the electric charge is supplied from the high level power supply line ELVDD to the drain terminal of the transistor T1. Thereby, the light emission drive current Ioled given by the above expression (3) flows through the organic EL element OLED.

6.3 Operation in Vertical Synchronization Period

Figure 48:
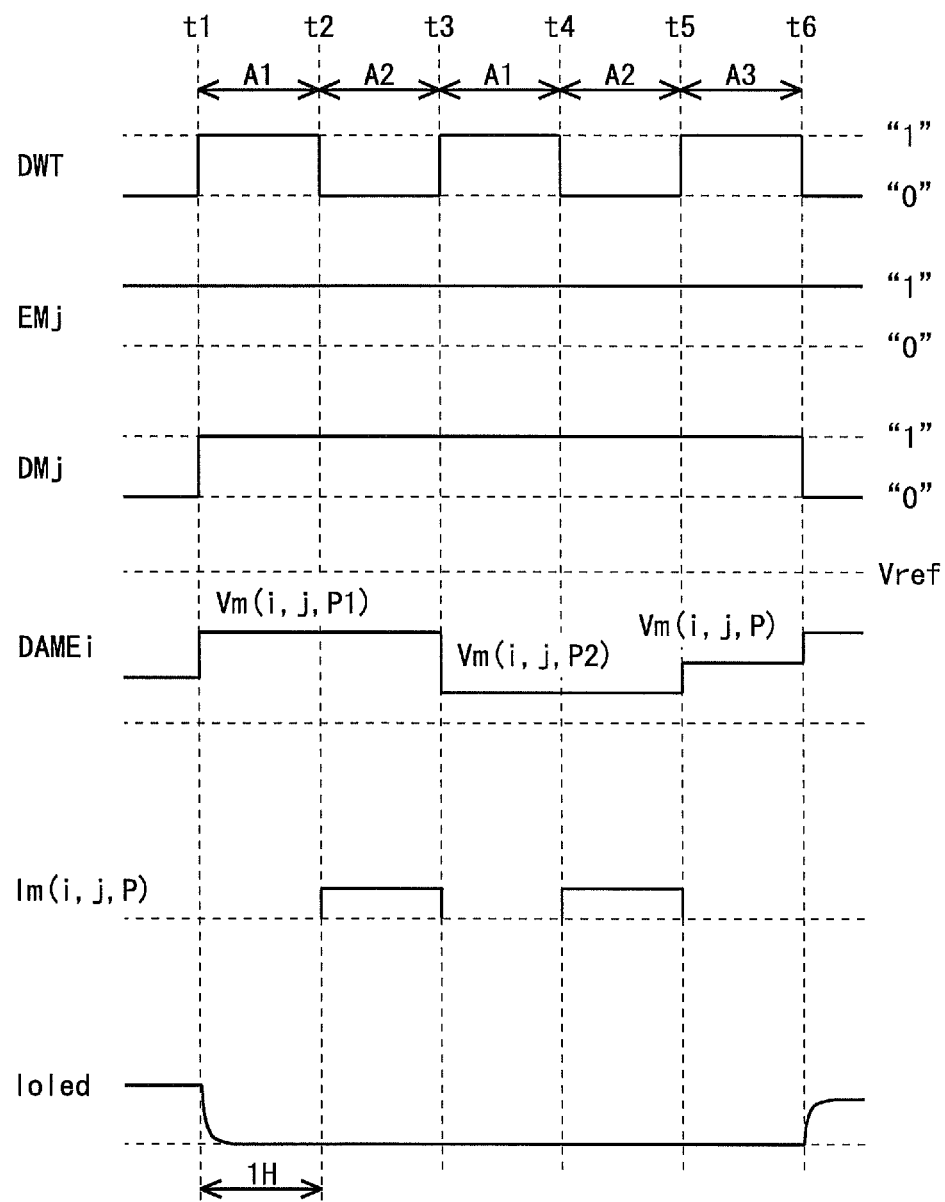
FIG. 48 is a timing chart for explaining operations of the pixel circuit and part of constitutional elements on the data driver side which correspond thereto, both shown in FIG. 46, in a vertical synchronization period.

FIG. 48 is a timing chart for explaining operations of the pixel circuit 51 and part of constitutional elements on the data driver 600 side which correspond thereto, both shown in FIG. 46, in the vertical synchronization period. In the present embodiment, the first measuring gradation program period A1 spans from time t1 to time t2, the first current measurement period A2 spans from time t2 to time t3, the second measuring gradation program period A1 spans from time t3 to time t4, the second current measurement period A2 spans from time t4 to time t5, and the desired gradation program period A3 spans from time t5 to time t6. In the present embodiment, for example, the potential of the emission line EMj is fixed to the "1" level in the vertical synchronization period (except for later-mentioned first and third vertical synchronization periods). However, since the data voltage Vm(i,j,P) is set to a value that satisfies the above expression (2), the light emission drive current Ioled does not flow during the selection period for the scanning line DMj. It is to be noted that the operations in the first measuring gradation program period A1, the first current measurement period A2, the second measuring gradation program period A1, the second current measurement period A2 and the desired gradation program period A3 are similar to those in the above first embodiment, and hence descriptions thereof will be omitted.

6.4 Operation in Each Frame Period

Figure 49:
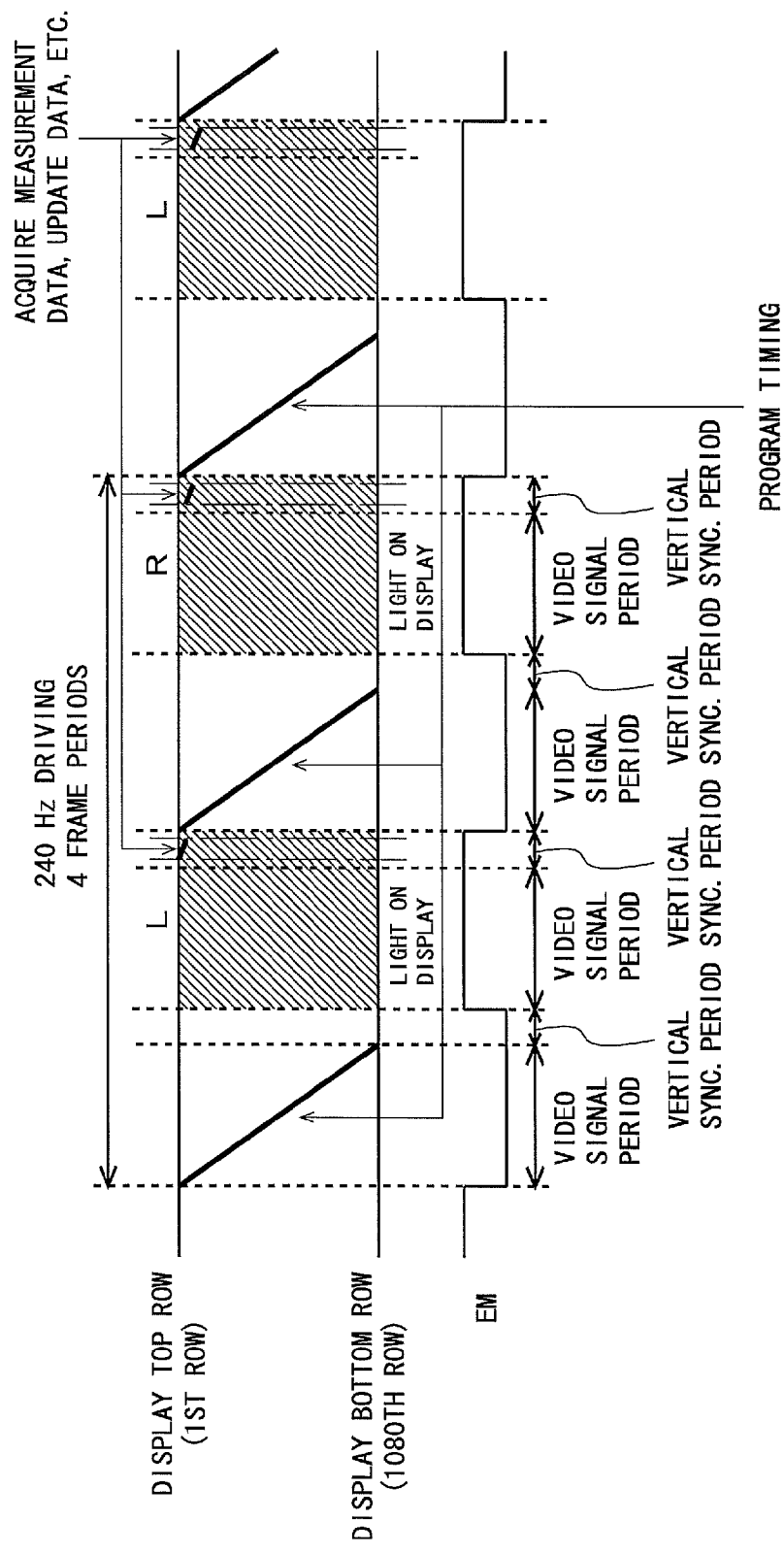
FIG. 49 is a diagram for explaining an operation in each frame period in the above sixth embodiment.

FIG. 49 is a diagram for explaining an operation in each frame period in the present embodiment. An organic EL display device 1 according to the present embodiment displays a 3D moving image by drive of 240 Hz by sequentially displaying a left eye image L and a right eye image R with four frame periods taken as a cycle. Further, the potential of each emission line EM switches between the "0" level and the "1" level every one frame period. Hereinafter, a video signal period and a vertical synchronization period in the first frame period of the four frame periods are referred to as a "first video signal period" and a "first vertical synchronization period", respectively, a video signal period and a vertical synchronization period in the second frame period are referred to as a "second video signal period" and a "second vertical synchronization period", respectively, a video signal period and a vertical synchronization period in the third frame period are referred to as a "third video signal period" and a "third vertical synchronization period", respectively, and a video signal period and a vertical synchronization period in the fourth frame period are referred to as a "fourth video signal period" and a "fourth vertical synchronization period", respectively.

In the first frame period, the potential of each emission line EM goes to the "0" level. In the first video signal period, the data voltage Vm corresponding to the left eye image L is written into each pixel circuit 51. Since the potential of each emission line EM is on the "0" level, light emission of the organic EL element OLED of each pixel circuit 51 has been stopped. Hence the left eye image L is not displayed. In the first vertical synchronization period, the first and second measurement data are not acquired and the correction data is not updated.

In the second frame period, the potential of each emission line EM goes to the "1" level. In the second video signal period, the data voltage Vm is not written, and since the potential of each emission line EM is on the "1" level, the left eye image L is displayed based on the data voltage Vm written in the first video signal period. In the second vertical synchronization period, the first and second measurement data are acquired and the correction data is updated for the first to p-th rows.

In the third frame period, the potential of each emission line EM goes to the "0" level. In the third video signal period, the data voltage Vm corresponding to the right eye image R is written into each pixel circuit 51. Since the potential of each emission line EM is on the "0" level, light emission of the organic EL element OLED of each pixel circuit 51 has been stopped. Hence the right eye image R is not displayed. In the third vertical synchronization period, the first and second measurement data are not acquired and the correction data is not updated.

In the fourth frame period, the potential of each emission line EM goes to the "1" level. In the fourth video signal period, the data voltage Vm is not written, and since the potential of each emission line EM is on the "1" level, the right eye image R is displayed based on the data voltage Vm written in the third video signal period. In the fourth frame period, the first and second measurement data are acquired and the correction data is updated for the (p+1)-th to 2p-th rows.

In such a manner as above, in the present embodiment, the video signal period for actually writing the data voltage Vm (first video signal period or third video signal period), and the vertical synchronization period for actually acquiring the first and second measurement data and updating the correction data (second vertical synchronization period or fourth vertical synchronization period) are alternately repeated.

6.5 Effect

According to the present embodiment, it is possible to exert an effect similar to that of the above first embodiment in the organic EL display device 1 provided with the pixel circuit 51 configured of one organic EL element OLED, four n-channel transistors T1 to T4 and one capacitor C1.

Further, according to the present embodiment, while light emission/non-emission of the organic EL element OLED is controlled by the emission line EM and the transistor T4, the video signal period for actually writing the data voltage Vm (first video signal period or third video signal period), and the vertical synchronization period for actually acquiring the first and second measurement data and updating the correction data (second vertical synchronization period or fourth vertical synchronization period) are alternately repeated. Accordingly, it is possible to acquire the first and second measurement data and update the correction data, while performing 3D moving image display.

7. Seventh Embodiment

7.1 Pixel Circuit

Figure 50:
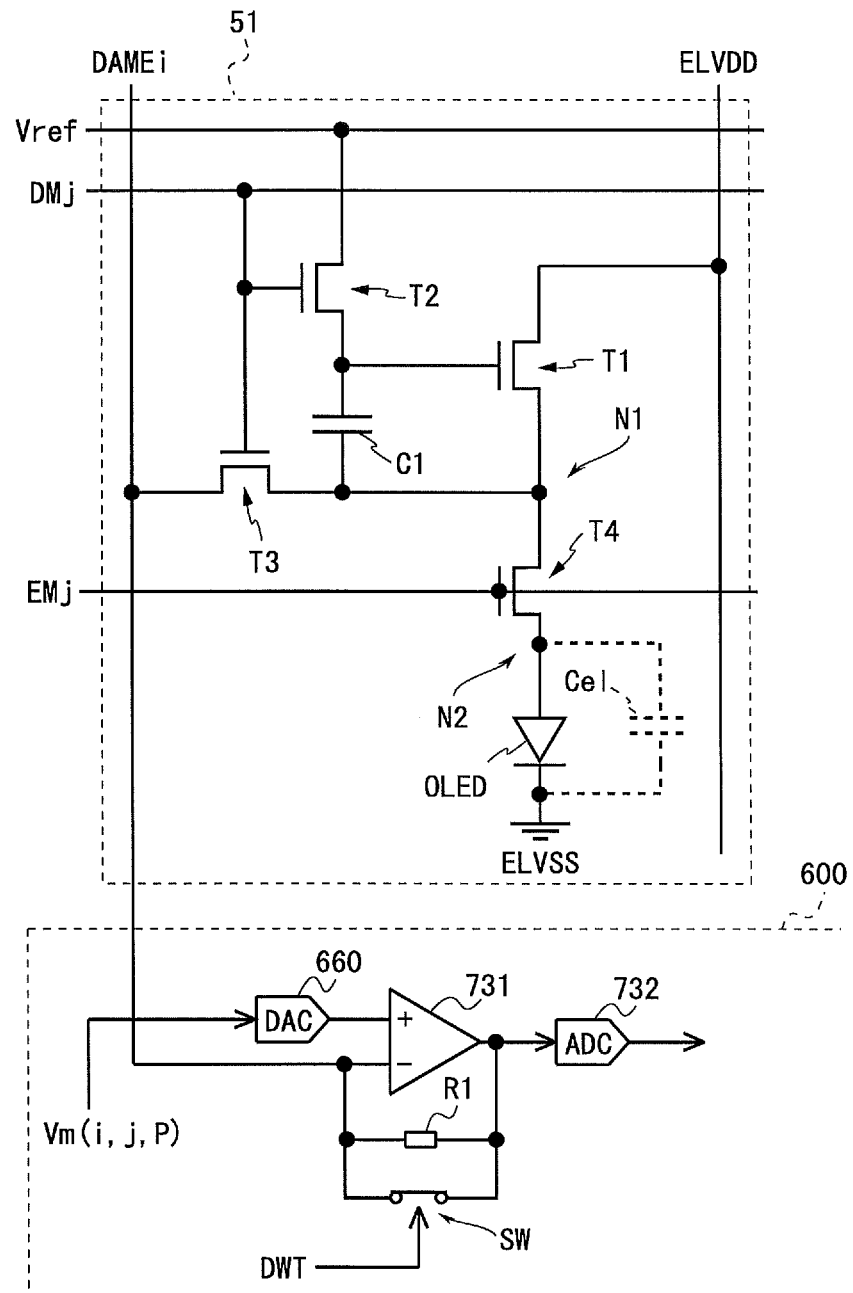
FIG. 50 is a circuit diagram showing a pixel circuit and part of constitutional elements on a data driver side which correspond thereto in a seventh embodiment of the present invention.

FIG. 50 is a circuit diagram showing a pixel circuit 51 in a seventh embodiment of the present invention and part of constitutional elements on the data driver 600 side which correspond thereto. Out of the constitutional elements of the present embodiment, the same elements as those in the above first and sixth embodiments are provided with the same reference numerals, to omit descriptions thereof as appropriate. The pixel circuit 51 in the present embodiment is one obtained by changing the position of the transistor T4 in the pixel circuit 51 in the above sixth embodiment. Similarly to the above sixth embodiment, there are disposed n emission lines EM1 to EMn in the display portion 50.

A gate terminal of the transistor T4 in the present embodiment is connected to the emission line EMj, and the transistor T4 is provided between the source terminal of the transistor T1 and the anode terminal of the organic EL element OLED. The transistor T4 at least comes into the off-state in the selection period for selecting the scanning line DM corresponding to the pixel circuit 51 provided with the transistor T4. It is to be noted that the drain terminal of the transistor T1 is connected to the high level power supply line ELVDD. Hereinafter, in a description of the present embodiment, a connection point of the source terminal of the transistor T1, one end of the capacitor C1 which is located on the source terminal side of the transistor T1, a conduction terminal of the transistor T3 which is located on the source terminal side of the transistor T1 and a conduction terminal of the transistor T4 which is located on the source terminal side of the transistor T1 is referred to as a "first node N1" for the sake of convenience. Further, a connection point of the anode terminal of the organic EL element OLED and the conduction terminal of the transistor T4 which is located on the anode terminal side of the organic EL element OLED is referred to as a "second node N2" for the sake of convenience. Moreover, in describing an operation in the video signal period concerning the present embodiment, a parasitic capacitance Cel formed between the anode terminal and the cathode terminal of the organic EL element OLED is considered.

7.2 Operation in Video Signal Period

Figure 51:
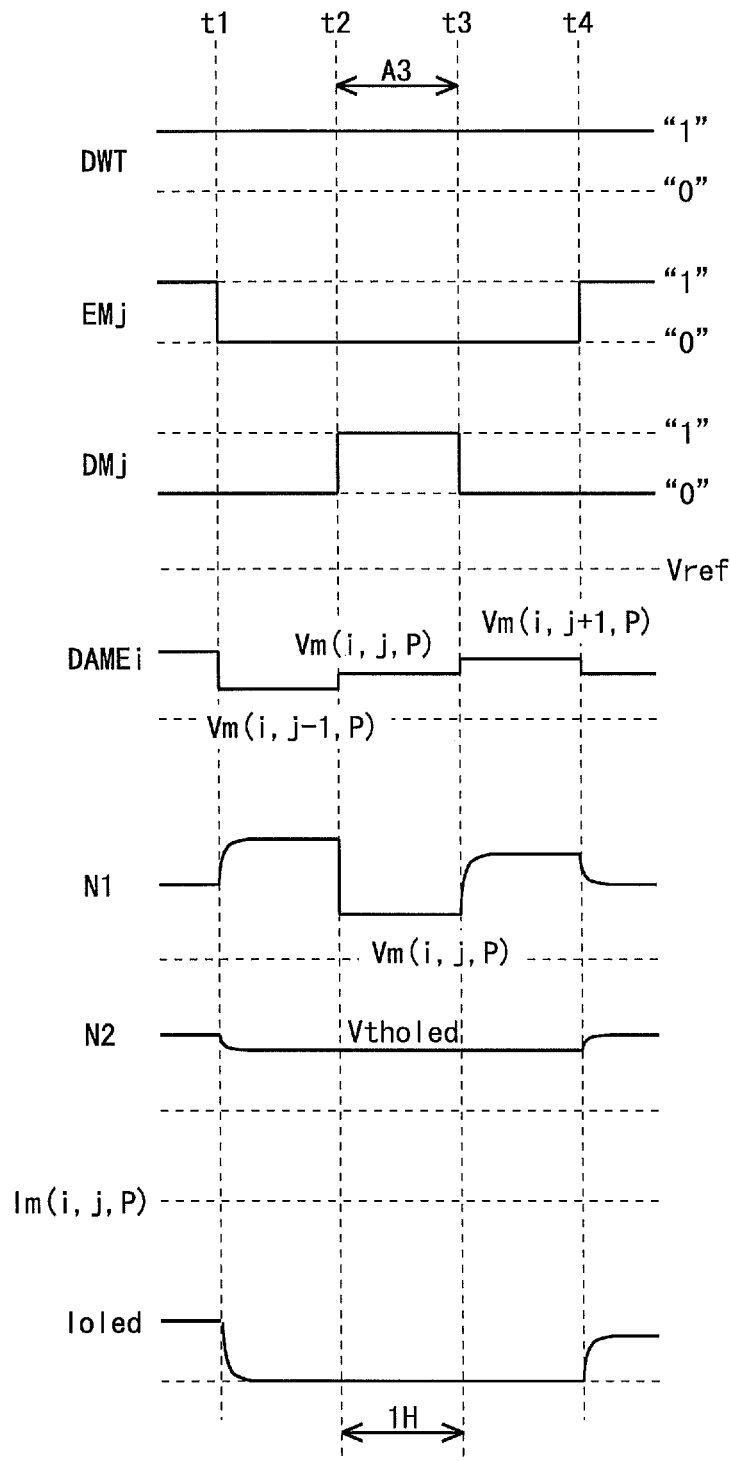
FIG. 51 is a timing chart for explaining operations of the pixel circuit and part of constitutional elements on the data driver side which correspond thereto, both shown in FIG. 50, in a video signal period.

FIG. 51 is a timing chart for explaining operations of the pixel circuit 51 and part of constitutional elements on the data driver 600 side which correspond thereto, both shown in FIG. 50, in the video signal period. In the present embodiment, the desired gradation program period A3 spans from time t2 to time t3.

Before time t1, the potential of the scanning line DMj is on the "0" level, and the potential of the emission line EMj is on the "1" level. The transistors T2, T3 are in the off-state, and the drive current Im(i,j,P) in accordance with the gate-source voltage Vgs held in the capacitor C1 flows through the transistor T1. Further, the transistor T4 is in the on-state, and the anode terminal of the organic EL element OLED and the source terminal of the transistor T1 are electrically connected to each other. Therefore, the drive current Im(i,j,P), which flows through the transistor T1, flows as the light emission drive current Ioled through the organic EL element OLED.

Then, the organic EL element OLED emits light with luminance in accordance with the light emission drive current Ioled.

At time t1, the potential of the emission line EMj changes to the "0" level, and the transistor T4 is turned off. Accordingly, the anode terminal of the organic EL element OLED and the source terminal of the transistor T1 are electrically separated from each other, and the light emission drive current Ioled becomes zero. Thereby, light emission of the organic EL element OLED is stopped. Further, since the first node N1 and the second node N2 are electrically separated from each other, a potential of the second node N2 becomes Vtholed in accordance with a holding voltage of the parasitic capacitance Cel.

From time t2, the data voltage Vm(i,j,P) is supplied to the data/measurement line DAMEi via the operational amplifier 731. Further, the potential of the scanning line DMj changes to the "1" level, and the transistors T2, T3 are turned on. Thereby, similarly to the above first embodiment, the capacitor C1 is charged to the gate-source voltage Vgs given by the above expression (1) in the desired gradation program period A3 from time t2 to time t3. It is to be noted that in the present embodiment, light emission/non-emission of the organic EL element OLED is controlled by controlling the connection between the anode terminal of the organic EL element OLED and the source terminal of the transistor T1 by use of the emission line EMj and the transistor T4, whereby it is not necessary to set the data voltage Vm(i,j,P) which is shown in the above expression (2).

At time t3, the potential of the scanning line DMj changes to the "0" level, and the transistors T2, T3 are turned off. For this reason, a holding voltage of the capacitor C1 is determined to be the gate-source voltage Vgs shown in the above expression (1).

At time t4, the potential of the emission line EMj changes to the "1" level, and the transistor T4 is turned on. Accordingly, the anode terminal of the organic EL element OLED and the source terminal of the transistor T1 are electrically connected to each other, and the light emission drive current Ioled given by the above expression (3) flows through the organic EL element OLED. At this time, since the first node N1 and the second node N2 are connected to each other, the respective potentials of those become the same.

Incidentally, the parasitic capacitance Cel affects a charging speed of the first node N1 to the data voltage Vm. For example, in the present embodiment, at the time of writing the data voltage Vm into the first node N1, when the parasitic capacitance Cel is connected to the first node N1, the parasitic capacitance Cel functions as a load capacitance, to cause a delay in charging the first node N1 to the data voltage Vm. This makes a charged amount of the first node N1 becomes short. However, in the present embodiment, the transistor T4 is in the off-state at the time of writing the data voltage Vm, and hence the first node N1 and the parasitic capacitance Cel are electrically separated from each other. This can solve insufficient charging of the first node N1. It should be noted that such a description of suppression of the insufficient charging as above can be similarly made also for the vertical synchronization period.

7.3 Operation in Vertical Synchronization Period

Figure 52:
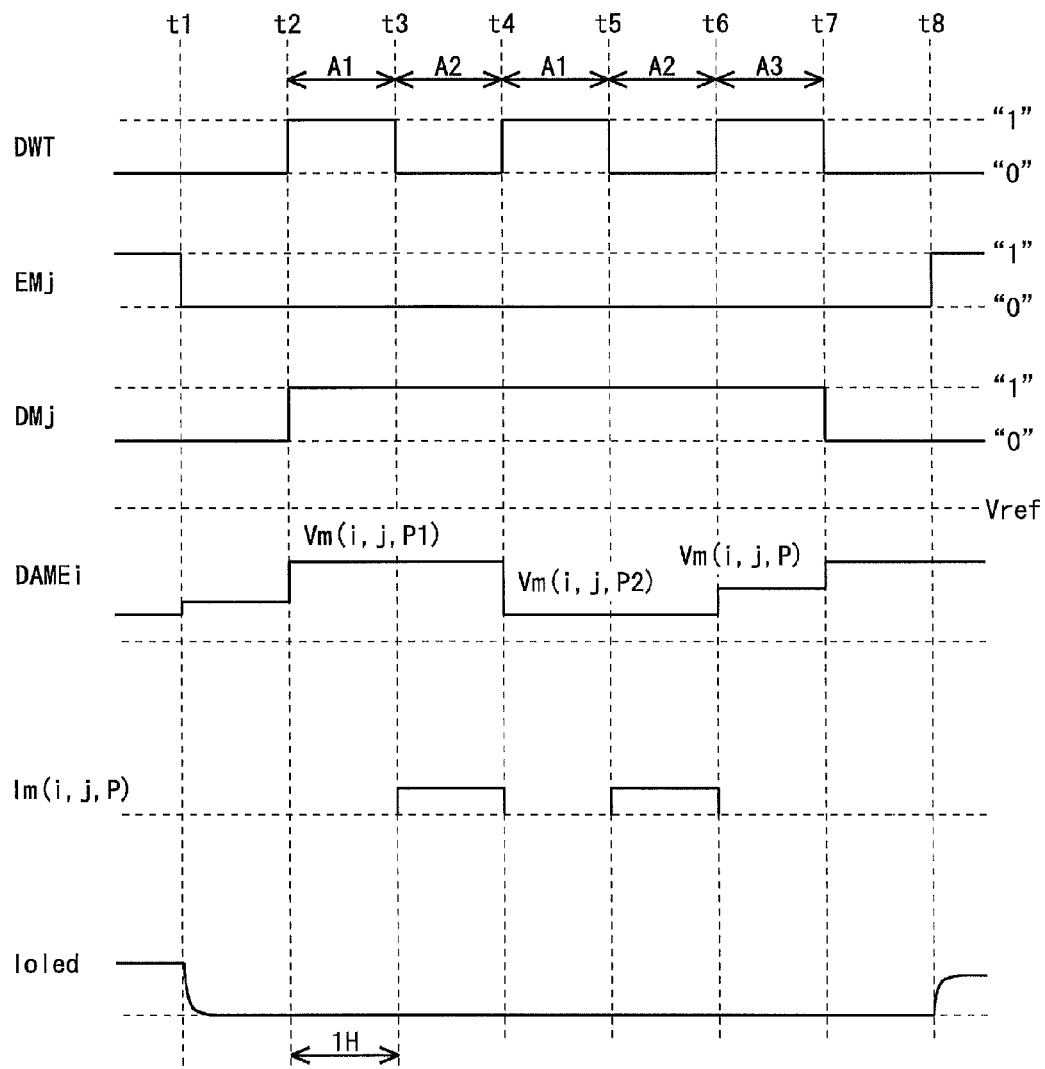
FIG. 52 is a timing chart for explaining operations of the pixel circuit and part of constitutional elements on the data driver side which correspond thereto, both shown in FIG. 50, in a vertical synchronization period.

FIG. 52 is a timing chart for explaining operations of the pixel circuit 51 and part of constitutional elements on the data driver 600 side which correspond thereto, both shown in FIG. 50, in the vertical synchronization period. In the present embodiment, the first measuring gradation program period A1 spans from time t2 to time t3, the first current measurement period A2 spans from time t3 to time t4, the second measuring gradation program period A1 spans from time t4 to time t5, the second current measurement period A2 spans from time t5 to time t6, and the desired gradation program period A3 spans from time t6 to time t7.

Before time t1, similarly to the case before time t1 in the video signal period, the organic EL element OLED emits light with luminance in accordance with the light emission drive current Ioled. At time t1, similarly to time t1 in the video signal period, light emission of the organic EL element OLED is stopped.

It is to be noted that the operations in the present embodiment in the first measuring gradation program period A1, the first current measurement period A2, the second measuring gradation program period A1, the second current measurement period A2 and the desired gradation program period A3 are basically similar to those in the above first embodiment, and hence descriptions thereof will be omitted.

At time t8, similarly to time t4 in the video signal period, the anode terminal of the organic EL element OLED and the source terminal of the transistor T1 are electrically connected to each other to flow the light emission drive current Ioled through the organic EL element OLED.

7.4 Effect

According to the present embodiment, it is possible to exert an effect similar to that of the above first embodiment in the organic EL display device 1 provided with the pixel circuit 51 configured of one organic EL element OLED, four n-channel transistors T1 to T4 and one capacitor C1.

Further, according to the present embodiment, light emission/non-emission of the organic EL element OLED can be controlled by controlling the connection between the anode terminal of the organic EL element OLED and the source terminal of the transistor T1 by use of the emission line EMj and the transistor T4.

Further, in the present embodiment, since the transistor T4 comes into the off-state at the time of writing the data voltage Vm into the first node N1 (when the scanning line DM is selected), the first node N1 and the parasitic capacitance Cel are electrically separated from each other. This can solve insufficient charging of the first node N1. Hence it is possible to reduce a driving capability required for the transistor T3 that supplies the data voltage Vm, so as to reduce the size of the transistor T3.

8. Eighth Embodiment

8.1 Pixel Circuit

Figure 53:
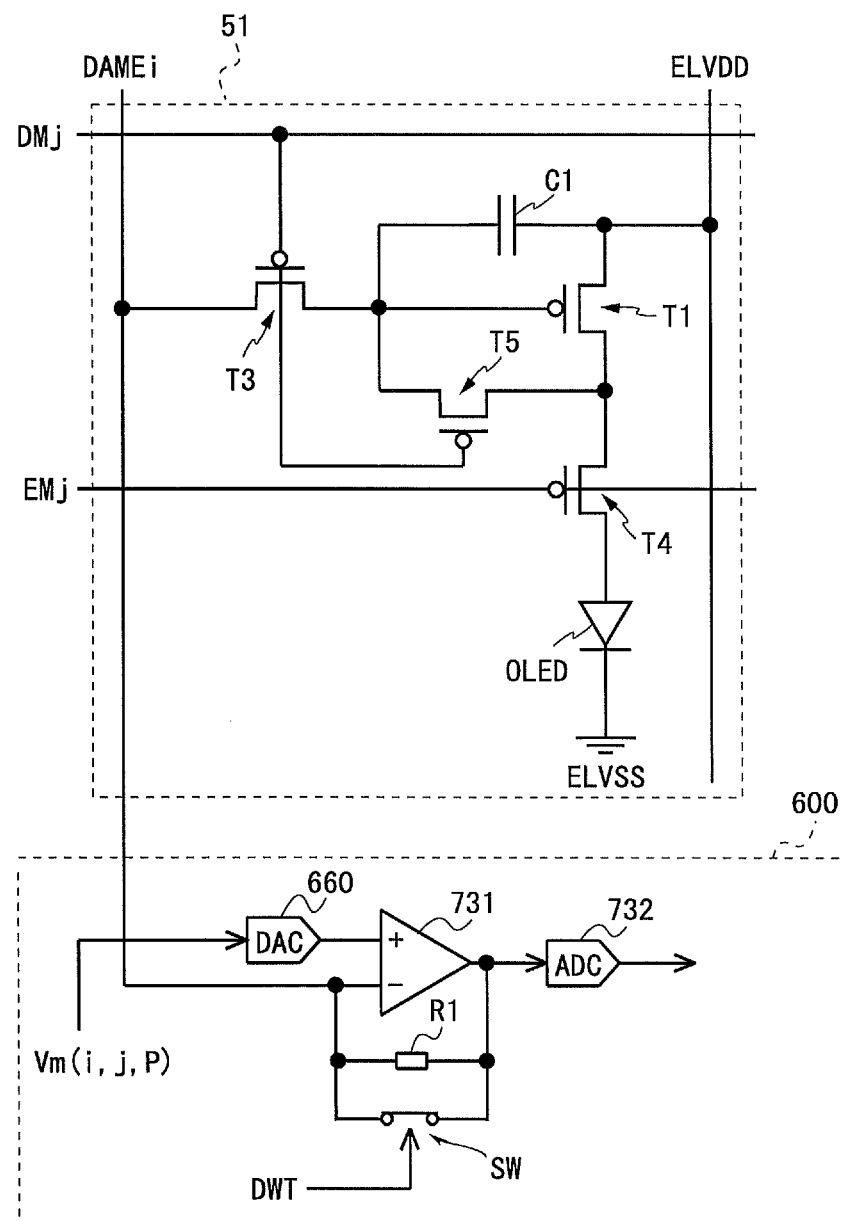
FIG. 53 is a circuit diagram showing a pixel circuit and part of constitutional elements on a data driver side which correspond thereto in an eighth embodiment.

FIG. 53 is a circuit diagram showing a pixel circuit in an eighth embodiment of the present invention and part of constitutional elements on the data driver 600 side which correspond thereto. Out of the constitutional elements of the present embodiment, the same elements as those in the above first, sixth and seventh embodiments are provided with the same reference numerals, to omit descriptions thereof as appropriate. The pixel circuit 51 in the present embodiment is provided with one organic EL element OLED, four transistors T1, T3 to T5, and one capacitor (drive capacitance element) C1. The transistor T1 is a drive transistor, the transistor T3 is an input transistor, the transistor T4 is a light emission control transistor, and the transistor T5 is a current path formation transistor. The transistors T1, T3 to T5 are all p-channel types. Similarly to the above sixth and seventh embodiments, there are disposed n emission lines EM1 to EMn in the display portion 50. It is to be noted that the display portion 50 in the present embodiment is not provided with the reference voltage line Vref.

The transistor T1 is provided in series with the organic EL element OLED, and has, as a first conduction terminal, a source terminal connected to a high level power supply line ELVDD. The transistor T3 has a gate terminal connected to the scanning line DMj, and is provided between the data/measurement line DAMEi and the gate terminal of the transistor T1. The transistor T4 is provided in series with the organic EL element OLED. The transistor T4 has a gate terminal connected to the emission line EMj, and is provided between the drain terminal, as a second conduction terminal, of the transistor T1 and an anode terminal of the organic EL element OLED. The transistor T4 at least comes into the off-state in the selection period for selecting the scanning line DM corresponding to the pixel circuit 51 provided with the transistor T4. A gate terminal of the transistor T5 is connected to the scanning line DMj, and the transistor T5 is provided between the gate terminal and the drain terminal of the transistor T1. The capacitor C1 is provided between the gate terminal and the source terminal of the transistor T1. A cathode terminal of the organic EL element OLED is connected to a low level power supply line ELVSS.

8.2 Operation in Video Signal Period

Figure 54:
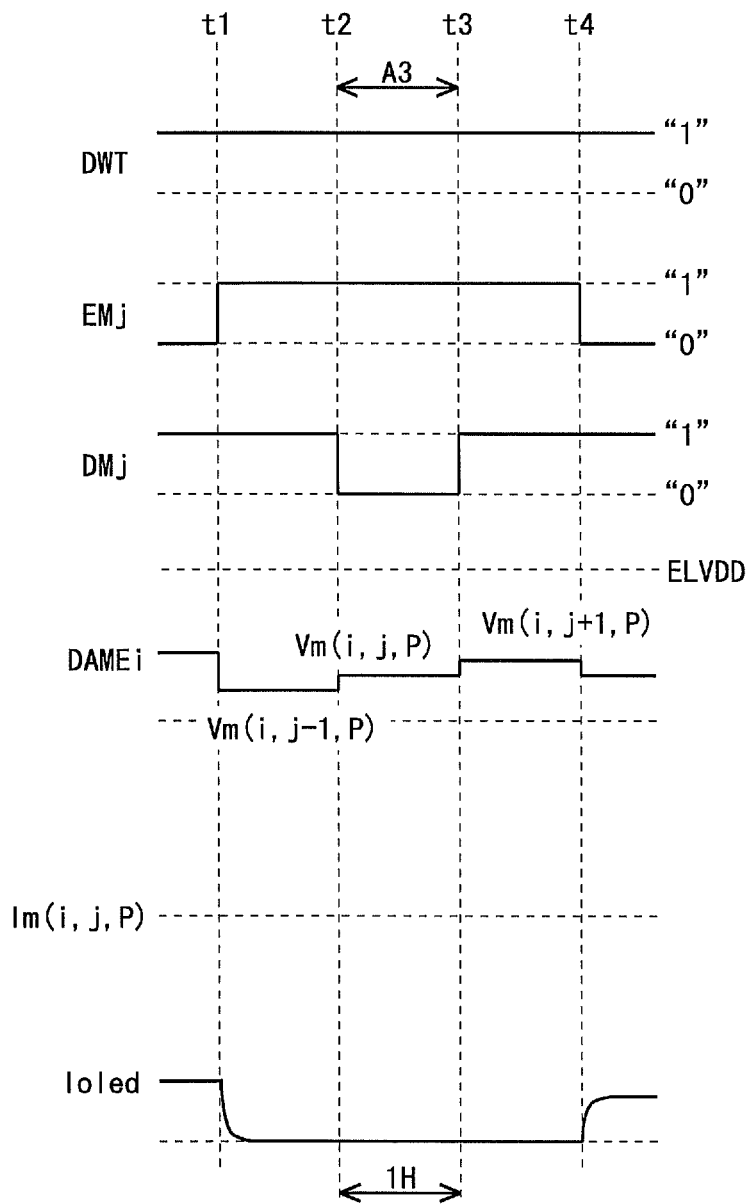
FIG. 54 is a timing chart for explaining operations of the pixel circuit and part of constitutional elements on the data driver side which correspond thereto, both shown in FIG. 53, in a video signal period.

FIG. 54 is a timing chart for explaining operations of the pixel circuit 51 and part of constitutional elements on the data driver 600 side which correspond thereto, both shown in FIG. 53, in the video signal period. In the present embodiment, since the transistors T3, T5 with gate terminals thereof connected to the scanning line DMj are p-channel types, differently from the above first embodiment, when the potential of the scanning line DMj is on the "0" level, the scanning line DMj is in the selected state, and when the potential of the scanning line DMj is on the "1" level, the scanning line DMj is in the non-selected state. In the present embodiment, the desired gradation program period A3 spans from time t2 to time t3.

Before time t1, a potential of the scanning line DMj is on the "1" level, and a potential of the emission line EMj is on the "0" level. At this time, the transistors T3, T5 are in the off-state, and the drive current Im(i,j,P) in accordance with the gate-source voltage Vgs held in the capacitor C1 flows through the transistor T1. Further, the transistor T4 is in the on-state, and the anode terminal of the organic EL element OLED and the drain terminal of the transistor T1 are electrically connected to each other. Therefore, the drive current Im(i,j,P), which is made to flow by the transistor T1, flows as the light emission drive current Ioled through the organic EL element OLED. Then, the organic EL element OLED emits light with luminance in accordance with the light emission drive current Ioled.

At time t1, the potential of the emission line EMj changes to the "1" level, and the transistor T4 is turned off. Accordingly, the anode terminal of the organic EL element OLED and the drain terminal of the transistor T1 are electrically separated from each other, and the light emission drive current Ioled becomes zero. Thereby, light emission of the organic EL element OLED is stopped.

From time t2, the data voltage Vm(i,j,P) is supplied to the data/measurement line DAMEi via the operational amplifier 731. Further, the potential of the scanning line DMj changes to the "0" level, and the transistors T3, T5 are turned on. Therefore, the data voltage Vm(i,j,P) is given to one end of the capacitor C1 (the gate terminal side of the transistor T1) via the data/measurement line DAMEi and the transistor T3. It is to be noted that the high level power supply voltage ELVDD is constantly given to the other end of the capacitor C1 (the source terminal side of the transistor T1). Thereby, the capacitor C1 is charged to the gate-source voltage Vgs given by the next expression (29) in the desired gradation program period A3 from time t2 to time t3.

$$Vgs = ELVDD - Vm(i,j,P) \quad (29)$$

It is to be noted that in the present embodiment, light emission/non-emission of the organic EL element OLED is controlled by controlling the connection between the anode terminal of the organic EL element OLED and the drain terminal of the transistor T1 by use of the emission line EMj and the transistor T4, whereby it is not necessary to set the data voltage Vm(i,j,P) which is shown in the above expression (2). Further, also in the present embodiment, similarly to the above seventh embodiment, the transistor T4 comes into the off-state at the time of writing the data voltage Vm, thereby solving insufficient charging of the gate terminal of the transistor T1 (corresponding to the first node N1 in the above seventh embodiment) due to the parasitic capacitance Cel.

At time t3, the potential of the scanning line DMj changes to the "1" level, and the transistors T3, T5 are turned off. For this reason, a holding voltage of the capacitor C1 is determined to be the gate-source voltage Vgs shown in the above expression (29).

At time t4, the potential of the emission line EMj changes to the "0" level, and the transistor T4 is turned on. Accordingly, the anode terminal of the organic EL element OLED and the drain terminal of the transistor T1 are electrically connected to each other, and the light emission drive current Ioled given by the next expression (30) flows through the organic EL element OLED.

$$\begin{aligned} Ioled &= (\beta/2) * (Vgs - Vt)^2 \\ &= (\beta/2) * (ELVDD - Vm(i, j, P) - Vt)^2 \end{aligned} \quad (30)$$

The expression (30) is one obtained by replacing the reference voltage Vref in the above expression (3) with the high level power supply voltage ELVDD. It is found therefrom that replacing the reference voltage Vref with the high level power supply voltage ELVDD allows for correction of the video data Vm(i,j,P) by the controller 10 in the present embodiment in a procedure similar to that in the above first embodiment.

8.3 Operation in Vertical Synchronization Period

Figure 55:
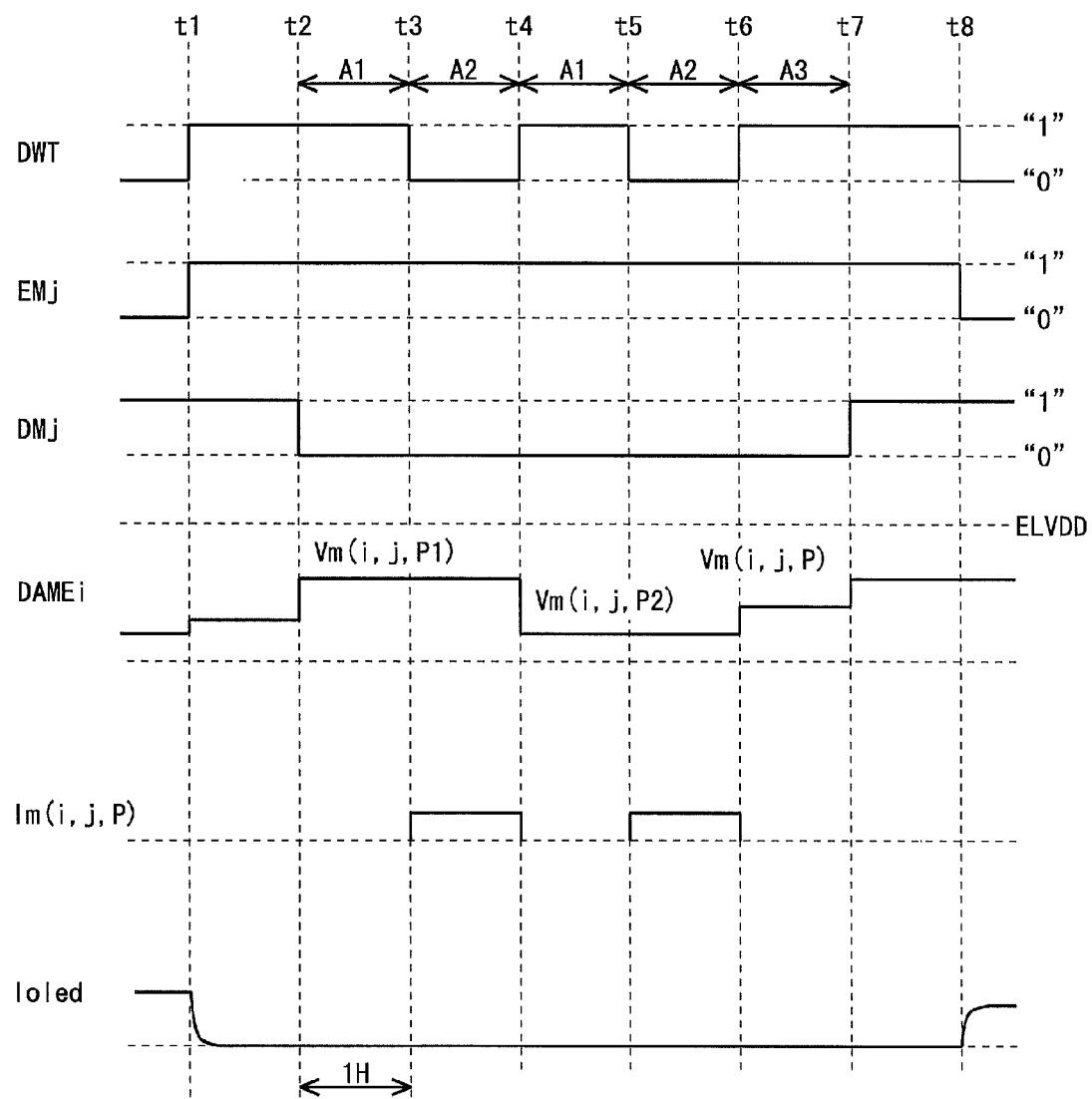
FIG. 55 is a timing chart for explaining operations of the pixel circuit and part of constitutional elements on the data driver side which correspond thereto, both shown in FIG. 53, in a vertical synchronization period.
Figure 56:
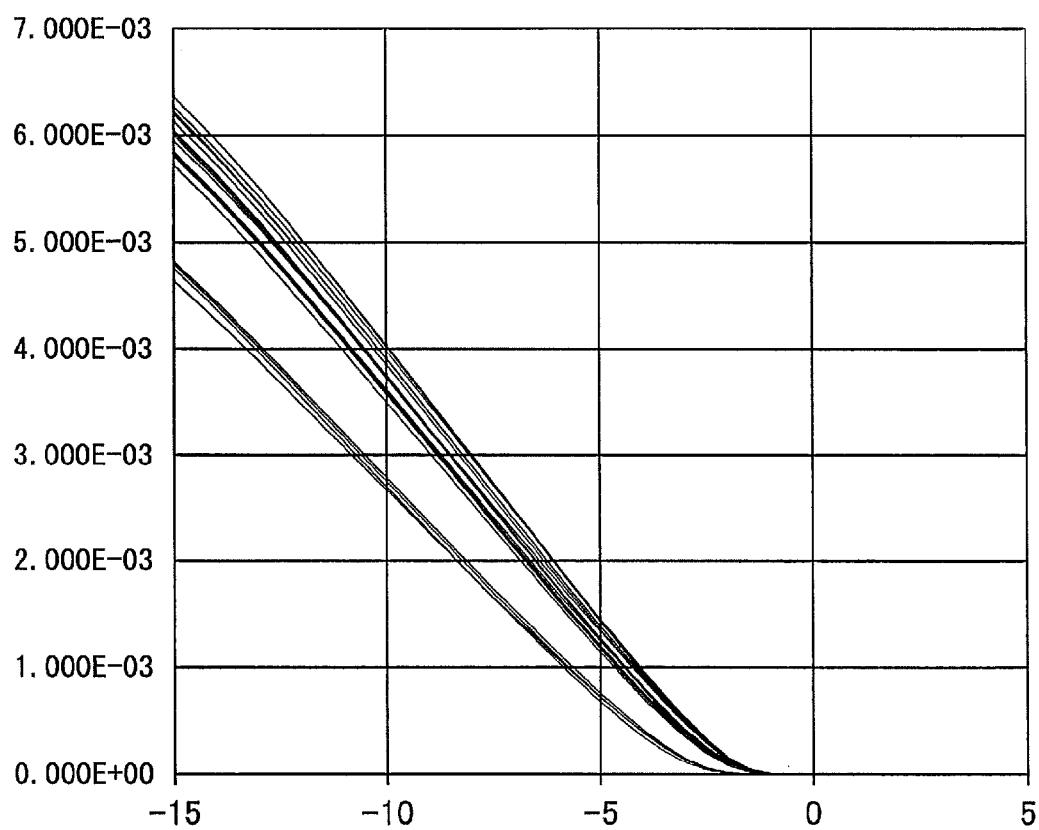
FIG. 56 is a diagram showing gate-source voltage/drive current characteristics before threshold voltage compensation in conventional organic EL display devices.
Figure 57:
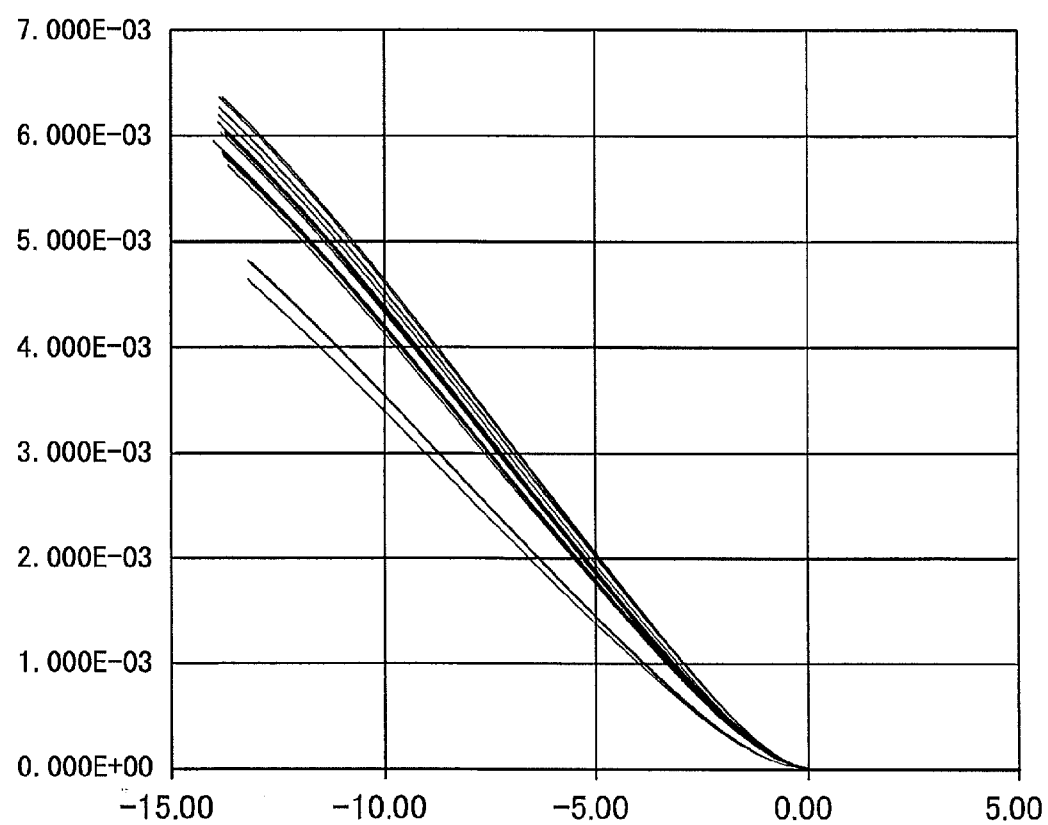
FIG. 57 is a diagram showing gate-source voltage/drive current characteristics after the threshold voltage compensation in the conventional organic EL display devices.

FIG. 55 is a timing chart for explaining operations of the pixel circuit 51 and part of constitutional elements on the data driver 600 side which correspond thereto, both shown in FIG. 53, in the vertical synchronization period. In the present embodiment, the first measuring gradation program period A1 spans from time t2 to time t3, the first current measurement period A2 spans from time t3 to time t4, the second measuring gradation program period A1 spans from time t4 to time t5, the second current measurement period A2 spans from time t5 to time t6, and the desired gradation program period A3 spans from time t6 to time t7.

Before time t1, similarly to the case before time t1 in the video signal period, the organic EL element OLED emits light with luminance in accordance with the light emission drive current Ioled. At time t1, similarly to time t1 in the video signal period, light emission of the organic EL element OLED is stopped.

At time t2, the potential of the scanning line DMj changes to the "0" level, and the transistors T3, T5 are turned on. Further, the input/output control signal DWT changes to the "1" level, and the control switch SW is closed. Moreover, the first measuring data voltage Vm(i,j,P1) is inputted into the non-inverting input terminal of the operational amplifier 731. Accordingly, in a procedure similar to that in the desired gradation program period A3, the capacitor C1 is charged to the gate-source voltage Vgs given by the next expression (31) in the first measuring gradation program period A1 from time t2 to time t3.

$$Vgs = ELVDD - Vm(i,j,P1) \quad (31)$$

At time t3, the input/output control signal DWT changes to the "0" level, and the control switch SW is opened. Further, similarly to time t1, the first measuring data voltage Vm(i,j,P1) is inputted into the non-inverting input terminal of the operational amplifier 731, and hence the potential of the inverting input terminal is also the first measuring data voltage Vm(i,j,P1) due to a virtual short circuit. In the first current measurement period A2 from time t3 to time t4, a current path of the first drive current Im(i,j,P1) via the transistors T5, T3 is formed, and the first drive current Im(i,j,P1) is outputted from the pixel circuit 51 to the data/measurement line DAMEi. Thus, with the transistors T5, T3 functioning together, when they are in the on-state, it is possible to output the first drive current Im(i,j,P1) to the data/measurement line DAMEi (the same applies to the second drive current Im(i,j,P2)). Since the measurement procedure for the first drive current Im(i,j,P1) outputted to the data/measurement line DAMEi is as described above, its description will be omitted here.

The operation in the second measuring gradation program period A1 from time t4 to time t5 is one obtained only by changing, to the second gradation P2, the first gradation P1 in the operation in the first measuring gradation program period A1 from time t2 to time t3, and hence its detailed description will be omitted. The operation in the second current measurement period A2 from time t5 to time t6 is one obtained only by changing, to the second gradation P2, the first gradation P1 in the operation in the first current measurement period A2 from time t3 to time t4, and hence its detailed description will be omitted. The operation in the desired gradation program period A3 from time t6 to time t7 is similar to that in the video signal period, and hence its detailed description will be omitted. The operations at time t7, t8 are similar to those at time t3, t4 in the video signal period, respectively, and hence detailed descriptions thereof will be omitted.

8.4 Effect

According to the present embodiment, it is possible to exert an effect similar to those in the above first and seventh embodiments in the organic EL display device 1 provided with the pixel circuit 51 configured of one organic EL element OLED, four p-channel transistors T1, T3 to T5 and one capacitor C1.

9. Others

The organic EL display device 1, to which the present invention is applicable, is not restricted to one provided with the pixel circuit 51 illustrated in each embodiment. The pixel circuit 51 may at least include an electro-optic element (organic EL element OLED) controlled by a current, the transistors T1, T3 and the capacitor C1.

The gain compensation in each of the above embodiments may be one that at least compensates the mobility $\mu$ out of the mobility $\mu$, the gate width W, the gate length L, and the gate insulating film capacitance Cox per unit area of the transistor T1.

The send timing for the first and second measurement data Im(i,j,P1), Im(i,j,P2) from the data driver 600 to the controller 10 is not restricted to the example described in each of the above embodiments, but a variety of changes can be made in accordance with a communication status of the bidirectional communication bus or the second unidirectional communication bus. Other than those, it is possible to implement each of the above embodiments by making a variety of changes in a range without departing from the spirit of the present invention.

INDUSTRIAL APPLICABILITY

A display device of the present invention has a feature that allows for both threshold voltage compensation and gain compensation of a drive transistor with respect to each pixel circuit while performing display, and hence it is applicable to a display device provided with a pixel circuit including an electro-optic element, such as an organic EL display device.

DESCRIPTION OF REFERENCE CHARACTERS

1: ORGANIC EL DISPLAY DEVICE
10: CONTROLLER (DISPLAY CONTROL PORTION)
11: FIRST LUT
12: MULTIPLICATION PORTION
13: ADDITION PORTION
14, 733: SUBTRACTION PORTION
15: SECOND LUT
16: CPU
20: DRAM (STORAGE PORTION)
21: GAIN CORRECTION MEMORY
22: THRESHOLD VOLTAGE CORRECTION MEMORY
30: FLASH MEMORY
40: DISPLAY PANEL
50: DISPLAY PORTION
51: PIXEL CIRCUIT
60: DATA DRIVE PORTION
66: DIGITAL-ANALOG CONVERSION PORTION
67: VOLTAGE OUTPUT/CURRENT MEASUREMENT PORTION
70: SCANNING DRIVE PORTION
80: COMMUNICATION BUS
600: DATA DRIVER
610: DATA VOLTAGE SUPPLY PORTION
620: CURRENT MEASUREMENT PORTION
660: DAC
670: VOLTAGE OUTPUT/CURRENT MEASUREMENT CIRCUIT
680: D LATCH
700: GATE DRIVER
731: OPERATIONAL AMPLIFIER
732: ADC
734: DIVISION PORTION
740: MEASUREMENT DATA ACQUIREMENT PORTION
750: VOLTAGE HOLDING PORTION
760: FIRST SELECTOR
770: SECOND SELECTOR

780: BUFFER AMPLIFIER
OLED: ORGANIC EL ELEMENT
T1 to T5: THIN-FILM TRANSISTOR
C1: CAPACITOR (DRIVE CAPACITANCE ELEMENT)
Cd1, Cd2: FIRST AND SECOND CAPACITORS
Cel: PARASITIC CAPACITANCE
VS: VIDEO SIGNAL
VD: VIDEO DATA
Vm: DATA VOLTAGE, VIDEO DATA
Im: DRIVE CURRENT, MEASUREMENT DATA
DAME: DATA/MEASUREMENT LINE (DATA LINE)
DM: SCANNING LINE
EM: EMISSION LINE
DWT: INPUT/OUTPUT CONTROL SIGNAL

The invention claimed is:

1. An active matrix-type display device comprising:
a display portion which includes a plurality of data lines, a plurality of scanning lines, and a plurality of pixel circuits arranged corresponding to the plurality of data lines and the plurality of scanning lines;
a data drive portion connected to the plurality of data lines;
a scanning drive portion connected to the plurality of scanning lines;
a display control portion which controls the scanning drive portion and sends, to the data drive portion, video data that corresponds to either of a plurality of gradations; and
a storage portion which stores correction data that is used for correcting the video data, wherein
each pixel circuit includes
an electro-optic element controlled by a current,
an input transistor which has a control terminal connected to a corresponding scanning line and is in an on-state when the scanning line is selected,
a drive capacitance element to which a data voltage based on the video data is given via a corresponding data line and the input transistor, and
a drive transistor which controls a drive current to be supplied to the electro-optic element in accordance with a voltage held by the drive capacitance element,
the input transistor is, when being in the on-state, capable of outputting to the data line the drive current flowing through the drive transistor,
the scanning drive portion alternately repeats a first period for writing the data voltage into the pixel circuit by sequentially selecting the plurality of scanning lines and a second period for outputting, from the pixel circuit to the data line via the input transistor, the drive current flowing through the drive transistor by sequentially selecting a predetermined number of scanning lines out of the plurality of scanning lines, and shifts the predetermined number of scanning lines to be selected in each of the second periods,
the data drive portion includes
a current measurement portion which measures a drive current in accordance with a data voltage based on video data corresponding to a relatively low first gradation out of the plurality of gradations to acquire first measurement data, and measures a drive current in accordance with a data voltage based on video data corresponding to a relatively high second gradation out of the plurality of gradations to acquire second measurement data, with respect to each of the data lines in the second period, and
a data voltage supply portion which supplies the data voltage to the data line in the first period and the second period,
the display control portion corrects the video data based on the first measurement data and the second measurement data acquired by the current measurement portion,
the current measurement portion sends the first measurement data and the second measurement data to the display control portion in the second period,
the display control portion, in the second period, sends video data corresponding to the respective first gradation and second gradation to the data drive portion and receives the first measurement data and the second measurement data from the current measurement portion, to update the correction data based on results of respective comparisons of ideal characteristic data indicating ideal characteristics of the drive transistor which correspond to the first gradation and the second gradation, with the received first measurement data and second measurement data,
the display control portion, in the first period and the second period, reads the correction data from the storage portion to correct the video data based on the correction data,
the display control portion supplies the data drive portion with an input/output control signal, which goes to a first level at the time when the data voltage is to be written into the pixel circuit and which goes to a second level at the time when the drive current is to be outputted to the data line,
the data voltage supply portion includes a conversion portion which converts the video data to the data voltage,
the data voltage supply portion and the current measurement portion each include in common
an operational amplifier having a non-inverting input terminal connected to an output terminal of the conversion portion and an inverting input terminal connected to a corresponding data line, and
a control switch which is provided between the inverting input terminal and an output terminal of the operational amplifier, and which is closed at the time of the input/output control signal being on the first level and is opened at the time of the input/output control signal being on the second level,
the current measurement portion includes
a current/voltage conversion element provided between the inverting input terminal and the output terminal of the operational amplifier in parallel to the control switch, and
a measurement data acquirement portion which is connected to the output terminal of the operational amplifier and acquires the first measurement data or the second measurement data from an output of the operational amplifier, and
a data voltage, obtained by converting video data that corresponds to the first gradation or the second gradation, is inputted into the non-inverting input terminal of the operational amplifier when the input/output control signal is on the second level.

2. The display device according to claim 1, wherein
the correction data includes first correction data for threshold voltage compensation of the drive transistor and second correction data for gain compensation of the drive transistor, and
the display control portion updates the first correction data based on the comparison result between the first measurement data and the ideal characteristic data, and updates the second correction data based on the comparison result between the second measurement data and the ideal characteristic data.

3. The display device according to claim 2, wherein the display control portion changes respective values of the first correction data and the second correction data only by previously set fixed values when the respective first correction data and second correction data are to be updated.

4. The display device according to claim 1, wherein the current/voltage conversion element is a resistance element.

5. The display device according to claim 1, wherein the current/voltage conversion element is a capacitance element.

6. The display device according to claim 1, wherein the current measurement portion further includes a voltage holding portion which is provided between the operational amplifier and the measurement data acquirement portion to hold an output voltage of the operational amplifier.

7. The display device according to claim 1, wherein the measurement data acquirement portion acquires the first measurement data or the second measurement data based on at least an output voltage of the operational amplifier and the video data.

8. The display device according to claim 7, wherein
the current measurement portion further includes a first selector and a second selector provided in common with respect to a predetermined number, being two or more, of the operational amplifiers,
the first selector receives output voltages of the predetermined number of operational amplifiers, and gives any of the received output voltages of the operational amplifiers to the measurement data acquirement portion based on an address signal received from the outside, and
the second selector receives video data before conversion of the data voltages that are given to the non-inverting input terminals of the predetermined number of operational amplifiers, and gives any of the received video data to the measurement data acquirement portion based on the address signal.

9. The display device according to claim 1, wherein
a level of the input/output control signal changes to the first level, the second level, the first level, the second level and the first level sequentially from a start point of a selection period in which each scanning line is selected in the second period,
in three periods in which the input/output control signal is on the first level in each selection period, the display control portion sends, to the data voltage supply portion, video data corresponding to one of the first gradation and the second gradation, video data corresponding to the other one of the first gradation and the second gradation, and video data corresponding to either of the plurality of gradations, respectively, sequentially from the start point of the selection period, and
in two periods in which the input/output control signal is on the second level in each selection period, the measurement data acquirement portion acquires the one of the first measurement data and the second measurement data and the other of the first measurement data and the second measurement data, respectively, sequentially from the start point of the selection period.

10. The display device according to claim 9, wherein the current measurement portion sends, in two periods in which the input/output control signal is on the second level in each selection period, to the display control portion the one of the first measurement data and the second measurement data and the other of the first measurement data and the second measurement data, respectively, sequentially from the start point of the selection period.

11. The display device according to claim 9, wherein the current measurement portion sends, in a latter period out of two periods in which the input/output control signal is on the second level in each selection period, to the display control portion the one of the first measurement data and the second measurement data, and sends, in a period immediately after completion of the selection period, to the display control portion the other of the first measurement data and the second measurement data.

12. The display device according to claim 9, wherein the current measurement portion sends, in a period immediately after completion of each selection period, to the display control portion the one of the first measurement data and the second measurement data and the other of the first measurement data and the second measurement data.

13. The display device according to claim 9, wherein the current measurement portion sends, in a period after completion of all selection periods in the second period, to the display control portion the first measurement data and the second measurement data, acquired in each selection period.

14. The display device according to claim 10, wherein the display control portion and the data drive portion send and receive the video data, the first measurement data and the second measurement data to and from each other by use of a bidirectional communication bus.

15. The display device according to claim 10, wherein the data voltage supply portion further includes a data latch portion which outputs the video data received from the display control portion to the conversion portion when the input/output control signal is on the first level, and which outputs, to the conversion portion, video data at the time when the input/output control signal is on the first level immediately before, when the input/output control signal is on the second level.

16. The display device according to claim 10, wherein the display control portion sends, in two periods in which the input/output control signal is on the second level in each selection period, to the data voltage supply portion, video data corresponding to the one of the first gradation and the second gradation and video data corresponding to the other of the first gradation and the second gradation, respectively, sequentially from the start point of the selection period.

17. The display device according to claim 1, wherein each of the drive transistor and the input transistor is a thin-film transistor whose channel layer is formed of an oxide semiconductor.

18. The display device according to claim 1, wherein
the scanning drive portion includes
a first shift register for driving the plurality of scanning lines in the first period,
a second shift register for driving the plurality of scanning lines in the second period, and
a selector group which gives an output of each stage of the first shift register to a corresponding scanning line in the first period, and gives an output of each stage of the second shift register to the corresponding scanning line in the second period.

19. A method for driving an active matrix-type display device including a display portion which includes a plurality of data lines, a plurality of scanning lines, and a plurality of pixel circuits arranged corresponding to the plurality of data lines and the plurality of scanning lines, a data drive portion connected to the plurality of data lines, a scanning drive portion connected to the plurality of scanning lines, and a display control portion which controls the scanning drive portion and sends, to the data drive portion, video data that corresponds to either of a plurality of gradations, the device in which each pixel circuit includes an electro-optic element controlled by a current, an input transistor which has a control terminal connected to a corresponding scanning line and is in an on-state when the scanning line is selected, a drive capacitance element to which a data voltage based on the video data is given via a corresponding data line and the input transistor, and a drive transistor which controls a drive current to be supplied to the electro-optic element in accordance with a voltage held by the drive capacitance element, and the input transistor is, when being in the on-state, capable of outputting to the data line the drive current flowing through the drive transistor, the method comprising:

- a scanning drive step of alternately repeating a first period for writing the data voltage into the pixel circuit by sequentially selecting the plurality of scanning lines and a second period for outputting, from the pixel circuit to the data line via the input transistor, the drive current flowing through the drive transistor by sequentially selecting a predetermined number of scanning lines out of the plurality of scanning lines, and shifting the predetermined number of scanning lines to be selected in each of the second periods;
- a current measurement step of measuring a drive current in accordance with a data voltage based on video data corresponding to a relatively low first gradation out of the plurality of gradations to acquire first measurement data, and measuring a drive current in accordance with a data voltage based on video data corresponding to a relatively high second gradation out of the plurality of gradations to acquire second measurement data, with respect to each of the data lines in the second period;
- a data voltage supply step of supplying the data voltage to the data line in the first period and the second period;
- a correction step of correcting the video data based on the first measurement data and the second measurement data acquired in the current measurement step; and
- a storing step for storing correction data that is used for correcting the video data, wherein in the current measurement step, the first measurement data and the second measurement data are sent to the correction step in the second period, in the correction step, in the second period, video data corresponding to the respective first gradation and second gradation are sent to the current measurement step and the data voltage supply step and the first measurement data and the second measurement data are received from the current measurement step, to update the correction data based on results of respective comparisons of ideal characteristic data indicating ideal characteristics of the drive transistor which correspond to the first gradation and the second gradation, with the received first measurement data and second measurement data, in the correction step, in the first period and the second period, the correction data stored in the storing step are read to correct the video data based on the correction data, in the correction step, the current measurement step and the data voltage supply step are supplied with an input/output control signal, which goes to a first level at the time when the data voltage is to be written into the pixel circuit and which goes to a second level at the time when the drive current is to be outputted to the data line, the data voltage supply step uses a conversion portion which converts the video data to the data voltage, the data voltage supply step and the current measurement step each use in common an operational amplifier having a non-inverting input terminal connected to an output terminal of the conversion portion and an inverting input terminal connected to a corresponding data line, and a control switch which is provided between the inverting input terminal and an output terminal of the operational amplifier, and which is closed at the time of the input/output control signal being on the first level and is opened at the time of the input/output control signal being on the second level, the current measurement step uses a current/voltage conversion element provided between the inverting input terminal and the output terminal of the operational amplifier in parallel to the control switch, and a measurement data acquirement portion which is connected to the output terminal of the operational amplifier and acquires the first measurement data or the second measurement data from an output of the operational amplifier, and a data voltage, obtained by converting video data that corresponds to the first gradation or the second gradation, is inputted into the non-inverting input terminal of the operational amplifier when the input/output control signal is on the second level.

* * * * *